United States Patent
Tanaka

(10) Patent No.: US 8,163,447 B2
(45) Date of Patent: *Apr. 24, 2012

(54) COLORED PHOTOCURABLE COMPOSITION FOR SOLID STATE IMAGE PICK-UP DEVICE, COLOR FILTER AND METHOD FOR PRODUCTION THEREOF, AND SOLID STATE IMAGE PICK-UP DEVICE

(75) Inventor: Tatsuya Tanaka, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 841 days.

This patent is subject to a terminal disclaimer.

(21) Appl. No.: 12/058,693

(22) Filed: Mar. 29, 2008

(65) Prior Publication Data
US 2008/0241713 A1 Oct. 2, 2008

(30) Foreign Application Priority Data
Mar. 29, 2007 (JP) ................ 2007-089674

(51) Int. Cl.
*G02B 5/20* (2006.01)
*G03F 7/00* (2006.01)

(52) U.S. Cl. .......... 430/7; 430/287.1; 257/440

(58) Field of Classification Search .......... None
See application file for complete search history.

(56) References Cited

U.S. PATENT DOCUMENTS

| 3,536,510 | A | 10/1970 | Allen et al. |
| 3,778,287 | A | 12/1973 | Stansfield et al. |
| 5,821,016 | A | 10/1998 | Satoh et al. |
| 6,087,050 | A * | 7/2000 | Itano et al. ............ 430/7 |
| 2002/0191517 | A1 | 12/2002 | Honda et al. |
| 2010/0323284 | A1* | 12/2010 | Nakashima et al. ........ 430/7 |

FOREIGN PATENT DOCUMENTS

| EP | 0723167 A2 | 7/1996 |
| EP | 0780731 A2 | 6/1997 |
| JP | 54-34009 B | 10/1979 |
| JP | 01-025147 | 1/1989 |
| JP | 64-25147 A | 1/1989 |
| JP | 10-62986 A | 3/1989 |
| JP | 1-126345 A | 5/1989 |
| JP | 2-38471 A | 2/1990 |
| JP | 2-245231 A | 10/1990 |
| JP | 5-72943 B | 10/1993 |
| JP | 8-48890 A | 2/1996 |
| JP | 8-123027 A | 5/1996 |
| JP | 8-123028 A | 5/1996 |
| JP | 8-259876 A | 10/1996 |
| JP | 10-332929 A | 12/1998 |
| JP | 11-66617 A | 3/1999 |
| JP | 11-258794 A * | 9/1999 |
| JP | 2000-113516 A | 4/2000 |
| JP | 2000-321763 A | 11/2000 |
| JP | 2001-342364 A | 12/2001 |
| JP | 2002-203321 A | 7/2002 |
| JP | 2003-29018 A | 1/2003 |
| JP | 2003-262958 A | 9/2003 |
| JP | 2004-287230 A | 10/2004 |
| JP | 2005-148717 A | 6/2005 |
| WO | WO 2004/106444 A1 | 12/2004 |

OTHER PUBLICATIONS

Computer-generated transaltion of JP 11-258794 (Sep. 1999).*
EP Communication, dated Mar. 23, 2009, issued in corresponding EP Application No. 08153431.5, 9 pages.
Ueki et al., "A color filter for 10.4-inch TFT-LCD of 512-color display," Proceedings of the 7th Joint Conference on Color Technology, Oct. 30-31, 1990, pp. 89-92 (8 pages including partial translation).
Recent Technological Trend in Color Filters, published by Johokiko Co., Ltd., pp. 85-87, May 31, 2005 (8 pages with translation).
Advanced Process Technologies and Chemicals for Color Filters, published by CMC Publishing, Ltd., pp. 129-150, Jan. 31, 2006 (27 pages with partial translation).
International Search Report and Written Opinion of the International Searching Authority for PCT/JP2007/075412, both dated Sep. 24, 2008.

* cited by examiner

*Primary Examiner* — John A. McPherson
(74) *Attorney, Agent, or Firm* — Sughrue Mion, PLLC

(57) ABSTRACT

A colored photocurable composition for a solid state image pick-up device, the composition including at least (A) a dispersion resin having an unsaturation equivalent of less than 600, (B) a pigment, (C) a photopolymerization initiator, and (D) a polyfunctional photopolymerizable compound having an acidic functional group and/or an alkyleneoxy chain.

10 Claims, No Drawings

COLORED PHOTOCURABLE COMPOSITION FOR SOLID STATE IMAGE PICK-UP DEVICE, COLOR FILTER AND METHOD FOR PRODUCTION THEREOF, AND SOLID STATE IMAGE PICK-UP DEVICE

CROSS-REFERENCE TO RELATED APPLICATION

This application claims priority under 35 USC 119 from Japanese Patent Application No. 2007-089674, the disclosure of which is incorporated by reference herein.

BACKGROUND OF THE INVENTION

1. Field of the Invention

The present invention relates to a colored photocurable composition for a solid state image pick-up device, which composition is suitable for producing a color filter used in solid state image pick-up devices (CCD, CMOS, etc.), a color filter and a method for production thereof, and a solid state image pick-up device.

2. Description of the Related Art

Pigments have been conventionally used in a wide variety of applications, as they exhibit vivid color tones and high tinctorial strength. Among these pigments, those presenting practical importance are in general fine particles, and thus vivid color tones and high tinctorial strength are obtained by preventing the aggregation of the pigment particles and finely pulverizing the particles. However, further fine pulverization of the pigment results in an increase in the surface area, whereby particle aggregation is promoted, and thus dispersion liquid of such a pigment often exhibits high viscosity. For this reason, when the pigment dispersion liquid is prepared in an industrial scale, there may occur problems. For example, it is difficult to take out the pigment dispersion liquid from a dispersing machine, transportation through pipelines is not possible, or the pigment dispersion liquid gelates during storage to become unusable.

Thus, it has been known hitherto that various dispersants are used to obtain pigment dispersion liquids or colored photosensitive compositions having excellent fluidity, dispersibility and the like. These dispersants are roughly classified into polymeric dispersants and low molecular weight compound dispersants.

Examples of the polymeric dispersants include polyacrylic acid salts, sodium maleate olefin copolymers, terminal carboxyl group-containing polyesters (see, for example, Japanese Patent Application Publication (JP-B) No. 54-34009), polyesters having an acid group and/or a basic group, prepared from tetrakis(2-hydroxyalkyl)ethylenediamine as a starting material (see, for example, Japanese Patent Application Laid-Open (JP-A) No. 2-245231), macromonomers (oligomers having an ethylenic unsaturated group at the terminal), copolymers of four monomers including a monomer having a hydroxyl group, a carboxyl group-containing monomer and monomers other than the monomers (see, for example, JP-A No. 8-259876), and the like.

As for the low molecular weight compound dispersants, sorbitan fatty acid esters, polyoxyethylene alkylamines, alkyldiamines, alkanolamine derivatives and the like are known (see, for example, U.S. Pat. No. 3,536,510), and there are also exemplary dispersants having pigment nuclei introduced thereinto (see, for example, JP-B No. 5-72943, and JP-A No. 8-48890).

Meanwhile, a colored photosensitive composition containing a pigment is useful as a material for color filters used in solid state image pick-up devices, liquid crystal displays and the like, and in the case of producing a color filter using the colored photosensitive composition, a pigment dispersion process which is excellent in terms of quality, production stability or the like, is being widely employed. However, if fine pulverization of the pigment is insufficiently carried out, light is scattered and absorbed by the pigment, and thereby the light transmittance is decreased. Therefore, the contrast is deteriorated, and further, the curing sensitivity at the time of patterning by exposure is lowered (see, for example, a color filter for 10.4-inch TFT-LCD of 512-color display; Ueki, Ozeki, Fukunaga and Yamanaka, the 7th Color Optics Conference, 1990). Furthermore, in the application for a solid state image pick-up device, a decrease in the photosensitivity of the entire sensor caused by the decrease in the light transmittance, and a difference in the particle size of the pigment caused by insufficient fine pulverization, bring about non-uniform decreases in the light transmittance in the respective pixels. Thus, there occurs deterioration in the image quality due to the differences in the sensitivity for the respective pixels. In order to avoid this, it is necessary in a colored photosensitive composition containing a pigment in a dispersed state that the pigment be dispersed in a highly finely pulverized state.

With regard to a color filter for solid state image pick-up device, since reduction of film thickness of colored patterns is in progress for image quality improvement due to high light-concentrating property and high color separation property, the pigment concentration in the composition tends to increase along with this film thickness reduction.

Moreover, as for a pigment-based color filter, color unevenness is likely to occur because the pigment consists of relatively coarse particles. Therefore, as the fine pulverization of pigment is achieved to reduce this color unevenness, the content of pigment dispersant in the curable composition tends to increase. Accordingly, there is a problem concerning the difficulties in obtaining curability.

In order to cope with the problems such as color unevenness in a colored pattern formed, there has been suggested a technology of using an organic solvent-soluble dye as the colorant, in place of pigment (see, for example, JP-A No. 2003-029018). As for such dye-based color filters, an increase in the concentration of dye is accompanied by significant problems such as a polymerization inhibitory effect originating from the dyes, or decrease in stability over time such as dye precipitation.

As described above, in a curable composition for the use in the production of a color filter for a solid state image pick-up device, since the contents of the photopolymerization initiator and the photopolymerizable monomer, which are components needed for curing the curable composition, are limited, and the concentration of the colorant is increased, there have been problems such as that the sensitivity is low, satisfactory curing cannot be obtained, and the adhesiveness to a substrate is insufficient.

In regard to these problems, a technology of improving the sensitivity by imparting polymerizability to a resin which has been introduced mainly to impart film forming property, developability or the like, and other various technologies have been investigated hitherto (see, for example, JP-A No. 2000-321763, JP-A No. 2003-029018, Recent Technological Trend in Color Filters (pp. 85-87, published by Johokiko Co., Ltd.), and Advanced Process Technologies and Chemicals for Color Filters (pp. 129-150, published by CMC Publishing, Ltd.)).

Furthermore, the color filter for the use in solid state image pick-up devices has undergone a pixel size reduction from approximately 5 µm in the late 1990's to 2.2 µm or less in the recent years, in accordance with the demands on an increase in the resolution, an increase in the number of pixels and further micronization of solid state image pick-up devices such as CCD.

As such, as the pixel size is being reduced, there have been raised technical problems concerning the shape of the pixels formed by photolithographic methods. That is, during the production of color filters according to a photoresist method, a photoresist coating film, which is formed by applying on a substrate and colored by a dispersed pigment, is exposed to form a pixel pattern thereon through a photomask, and is developed with alkali to form pixels. However, as the size of the pixels is reduced, the area of contact with the alkali developer solution in the unexposed areas is also decreased. Thus, there are generated residues due to poor solubility, and deterioration in the rectangularity of the pattern shape frequently occurs. The generation of residues leads to a decrease in the sensitivity of adjacent pixels, and more frequent occurrence of tapering results in the mixing of colors in adjacent pixels or in the generation of gaps between pixels. Thus, reproduced images in the solid state image pick-up devices face problems that are prone to impair the image quality, such as that there is an increased noise problem, and the roughness becomes prominent.

As described above, there is a strong demand for an increase in the color density and film thickness reduction in color filters, for the purpose of an improvement in image quality by means of enhanced light-concentrating properties and enhanced color separability of the color filters. When coloring materials are added in large quantities in order to obtain a high color density, the alkali developability is further deteriorated.

In addition, as the photopolymerizable compound in photocurable compositions, acryl esters of dipentaerythritol such as dipentaerythritol hexaacrylate and dipentaerythritol pentaacrylate have been conventionally used. However, these compounds generally have low solubility in aqueous alkali developer solutions, and particularly in the case of forming very fine pixels that are 2.2 μm or less long on one side, the generation of residues due to poor solubility in the unexposed areas has been significant.

In an attempt to improve such alkali developability as described above, there is reported a technology of making use of carboxyl group-containing polyfunctional photocurable compounds or the like (see, for example, Japanese Patent Application Laid-Open (JP-A) Nos. 10-332929, 2004-287230 and 2005-148717). Meanwhile, a compound produced by introducing an acid group to dipentaerythritol or pentaerythritol is known as a monomer to be incorporated into solder resist (see, for example, JP-A Nos. 8-123027 and 8-123028).

Furthermore, for the purpose of improving the solubility in alkalis, (meth)acrylate compounds having an alkylene oxide structure, such as ethylene oxide or propylene oxide, have been disclosed (see, for example, JP-A No. 10-62986). There are also reports on a photopolymerizable composition containing polyfunctional acrylate such as polypentaerythritol polyacrylate (see, for example, JP-A No. 1-126345), a composition for photopolymerizable solder resist using a polymer of a tetrafunctional acrylate monomer, in which acryloyl groups are linked in an open-ring structure such as ethylene oxide or propylene oxide (see, for example, JP-A Nos. 2-38471 and 64-25147), and the like.

As described above, various technologies have been investigated, but under the actual circumstances, satisfactory sensitivity still cannot be attained. Thus, the problem of film thinning in the exposed areas, or the problem of a decrease in the color density caused by finely pulverized pigment in the exposed areas diffusing into the developer solution, has not been addressed. Since the exposure sensitivity is insufficient, there is also a problem that curing occurs insufficiently in the deeper parts, such as in the vicinity of the interface with a substrate, thereby the adhesiveness to the substrate being poor, and the shape of the pattern becoming inversely tapered. Moreover, for the applications of color filters having a plurality of color patterns, there are also unsolved problems such as that when a pattern of a first color is formed, and then a coating solution for forming a pattern of a second color is applied, the pigment of the first color is diffused into the coating solution of the second color, and the color density is decreased.

The aforementioned carboxyl group-containing polyfunctional photocurable compounds are all constituted to be used in liquid crystal displays. Thus, if a very fine pixel pattern, such as one having a 2.2 μm or less length on one side, is to be satisfactorily reproduced in the application in image sensors, the compounds provide insufficient sensitivity, and have a tendency in general that there occur multiple missing sites in the pattern. Since irradiation with a light of higher energy is required to eliminate these missing sites, the exposure time will be lengthened, and there will be a significant decrease in the yield during the production. On the other hand, the aforementioned solder resist has a low concentration of pigment compared to the resist for color filter, and differs in the blending composition and required performance; therefore, the technology of solder resist cannot be directly applied to the resist for color filter for a solid state image pick-up device.

Also, when the aforementioned (meth)acrylate compounds having an alkylene oxide structure are used to form a very fine pixel pattern (for example, one having a short side of 2.2 μm or less in length) for the use in image sensors and the like, the compounds provide insufficient sensitivity, and have a tendency in general that there occur multiple missing sites in the pattern. Thus, a photopolymerizable composition containing polyfunctional acrylate such as polypentaerythritol polyacrylate, or a composition for photopolymerizable solder resist is not necessarily suitable for the use in solid state image pick-up devices.

As discussed in the above, it is difficult to form, for example, a fine rectangular pixel pattern that is 2.2 μm or less long on one side with a low exposure amount, and to suppress the generation of residues between the pixels, only with the technologies developed so far.

SUMMARY OF THE INVENTION

According to an aspect of the invention, there is provided a colored photocurable composition for a solid state image pick-up device, the composition comprising at least (A) a dispersion resin having an unsaturation equivalent of less than 600, (B) a pigment, (C) a photopolymerization initiator, and (D) a polyfunctional photopolymerizable compound having an acidic functional group and/or an alkyleneoxy chain.

DETAILED DESCRIPTION OF THE INVENTION

Hereinafter, according to the present invention, a colored photocurable composition for a solid state image pick-up device, a color filter using the colored photocurable composition for a solid state image pick-up device, and a method for production thereof, and a solid state image pick-up device will be described in detail.

The colored photocurable composition for a solid state image pick-up device according to the invention (hereinafter, may be simply referred to as "colored photocurable composition") contains at least (A) a dispersion resin having an unsaturation equivalent of less than 600, (B) a pigment, (C) a photopolymerization initiator, and (D) a polyfunctional photopolymerizable compound having an acidic functional group and/or an alkyleneoxy chain, and may optionally contain other components.

Hereinafter, the components constituting the colored photocurable composition for a solid state image pick-up device of the invention will be described in detail.

(A) Dispersion Resin Having an Unsaturation Equivalent of Less than 600

The colored photocurable composition of the invention contains at least one dispersion resin having an unsaturation equivalent of less than 600 (hereinafter, may be referred to as "dispersion resin according to the invention").

When the composition contains this dispersion resin, aggregation of the pigment is suppressed, the fine dispersibility of the pigment and the storage stability of the composition after dispersion are improved, and also the tinctorial strength is improved, regardless of the amount of pigment.

The dispersion resin according to the invention is a compound having an unsaturation equivalent of less than 600. The unsaturation equivalent means the molecular weight (calculated value) of the resin per one unsaturated bond. According to the invention, if the unsaturation equivalent of the contained dispersion resin is 600 or larger, the photopolymerizability resulting from the introduction of unsaturated groups will be insufficient, photosensitivity cannot be secured, and the adhesiveness to a support will be decreased because of the decreased polymerizability. Thus, a pattern having a tapered or rectangular shape may not be obtained.

The "unsaturation equivalent" is preferably 580 or less, more preferably 550 or less, and even more preferably 500 or less, from the viewpoints of securing a photosensitivity required in photopolymerization, and achieving the adhesiveness to a support and the formability of a pattern having a tapered or rectangular shape. Furthermore, the lower limit of the unsaturation equivalent is preferably 150. If the unsaturation equivalent is suppressed to a value of 150 or more, an increase in the viscosity is suppressed upon dispersing a pigment, and a composition having better dispersion stability under storage is obtained.

In addition, the unsaturation equivalent may be determined by a calculation based on the molecular weight of the subject resin.

Representative examples of the dispersion resin according to the invention include a resin obtained by reacting a carboxyl group-containing resin with a glycidyl group-containing unsaturated compound such as glycidyl (meth)acrylate or allyl glycidyl ether, or with an unsaturated alcohol such as allyl alcohol, 2-hydroxyacrylate or 2-hydroxymethacrylate; a resin obtained by reacting a carboxyl group-containing resin having a hydroxyl group, with a free isocyanate group-containing unsaturated compound or an unsaturated acid anhydride; a resin obtained by reacting an addition reaction product between an epoxy resin and an unsaturated carboxylic acid, with a polybasic acid anhydride; a resin obtained by reacting an addition reaction product between a conjugated diene copolymer and an unsaturated dicarboxylic acid anhydride, with a hydroxyl group-containing polymerizable monomer; a resin having an unsaturated group introduced by synthesizing a resin having a specific functional group, which undergoes an elimination reaction by a treatment with base and gives an unsaturated group, and treating the resin with a base; and the like.

Among these, a resin obtained by reacting a carboxyl group-containing resin with a glycidyl group-containing unsaturated compound such as glycidyl (meth)acrylate or allyl glycidyl ether; a resin obtained by reacting a resin which has been produced by polymerizing a hydroxyl group-containing (meth)acrylic acid ester compound, with a free isocyanate group-containing (meth)acrylic acid ester, such as 2-isocyanate ethyl (meth)acrylate; a resin having a structural unit represented by any one of the following formulae (1) to (3); a resin having an unsaturated group introduced by synthesizing a resin having a specific functional group, which undergoes an elimination reaction by a treatment with base and gives an unsaturated group, and treating the resin with a base; and the like are more preferred.

The dispersion resin according to the invention is preferably a polymer compound having, as an unsaturated double bond moiety, at least one selected from the structural units represented by any one of the following formulae (1) to (3).

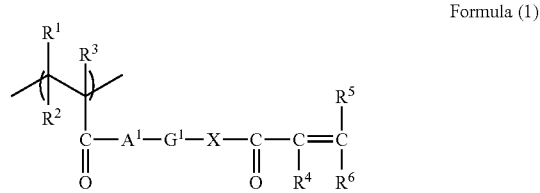

Formula (1)

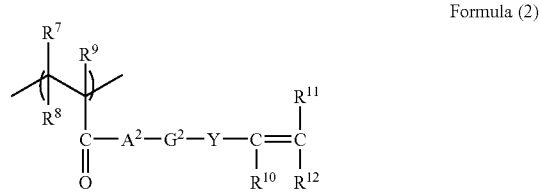

Formula (2)

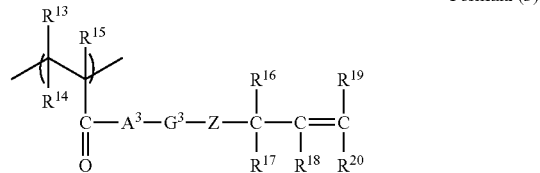

Formula (3)

In the formulae (1) to (3), $A^1$, $A^2$ and $A^3$ each independently represent an oxygen atom, a sulfur atom or $-N(R^{21})-$, wherein $R^{21}$ represents an alkyl group which may be substituted; $G^1$, $G^2$ and $G^3$ each independently represent a divalent organic group; X and Z each independently represent an oxygen atom, a sulfur atom or $-N(R^{22})-$, wherein $R^{22}$ represents an alkyl group which may be substituted; Y represents an oxygen atom, a sulfur atom, a phenylene group which may be substituted, or $-N(R^{23})-$, wherein $R^{23}$ represents an alkyl group which may be substituted; and $R^1$ to $R^{20}$ each independently represent a hydrogen atom or a monovalent organic group.

In the formula (1) described above, $R^1$ to $R^3$ each independently represent a hydrogen atom or a monovalent organic group such as a hydrogen atom and an alkyl group which may be substituted. Among them, $R^1$ and $R^2$ are preferably hydrogen atoms, while $R^3$ is preferably a hydrogen atom or a methyl group.

$R^4$ to $R^6$ each independently represent a hydrogen atom or a monovalent organic group. $R^4$ may be a hydrogen atom, an alkyl group which may be substituted, and the like, and among them, a hydrogen atom, a methyl group and an ethyl group are preferred. $R^5$ and $R^6$ may each independently be a hydrogen atom, a halogen atom, an alkoxycarbonyl group, a sulfo group, a nitro group, a cyano group, an alkyl group which may be substituted, an aryl group which may be substituted, an alkoxy group which may be substituted, an aryloxy group which may be substituted, an alkylsulfonyl group which may be substituted, an arylsulfonyl group which may be substituted, or the like. Among them, a hydrogen atom, an alkoxycarbonyl group, an alkyl group which may be substituted, and an aryl group which may be substituted are preferred.

Here, the substituents which may be introduced include a methoxycarbonyl group, an ethoxycarbonyl group, an isopropyloxycarbonyl group, a methyl group, an ethyl group, a phenyl group, and the like.

$A^1$ represents an oxygen atom, a sulfur atom or —$N(R^{21})$—, and X represents an oxygen atom, a sulfur atom or —$N(R^{22})$—. Here, $R^{21}$ and $R^{22}$ may be an alkyl group which may be substituted.

$G^1$ represents a divalent organic group, however is preferably an alkylene group which may be substituted. More preferably, $G^1$ may be an alkylene group having 1 to 20 carbon atoms which may be substituted, a cycloalkylene group having 3 to 20 carbon atoms which may be substituted, an aromatic group having 6 to 20 carbon atoms which may be substituted, and the like, and among them, a straight-chained or branched alkylene group having 1 to 10 carbon atoms which may be substituted, a cycloalkylene group having 3 to 10 carbon atoms which may be substituted, and an aromatic group having 6 to 12 carbon atoms which may be substituted are preferable in view of performance such as strength and development performance.

Here, the substituents for $G^1$ preferably include those which do not contain a hydroxyl group and in which a hydrogen atom is bound to a heteroatom, such as an amino group, a thiol group or those not containing a carboxyl group.

In the formula (2) described above, $R^7$ to $R^9$ each independently represent a hydrogen atom or a monovalent organic group, such as a hydrogen atom, an alkyl group which may be substituted, and the like. Among them, $R^7$ and $R^8$ are preferably hydrogen atoms, while $R^9$ is preferably a hydrogen atom or a methyl group.

$R^{10}$ to $R^{12}$ each independently represent a hydrogen atom or a monovalent organic group, and specific examples of this organic group include a halogen atom, a dialkylamino group, an alkoxycarbonyl group, a sulfo group, a nitro group, a cyano group, an alkyl group which may be substituted, an aryl group which may be substituted, an alkoxy group which may be substituted, an aryloxy group which may be substituted, an alkylsulfonyl group which may be substituted, an arylsulfonyl group which may be substituted, and the like. Among them, a hydrogen atom, an alkoxycarbonyl group, an alkyl group which may be substituted, and an aryl group which may be substituted are preferred.

Here, the substituents which may be introduced include the same groups as those mentioned for the formula (1).

$A^2$ represents an oxygen atom, a sulfur atom or —$N(R^{21})$—, and $R^{21}$ may be a hydrogen atom, an alkyl group which may be substituted, and the like.

$G^2$ represents a divalent organic group, but is preferably an alkylene group which may be substituted. Preferably, $G^2$ is an alkylene group having 1 to 20 carbon atoms which may be substituted, a cycloalkylene group having 3 to 20 carbon atoms which may be substituted, an aromatic group having 6 to 20 carbon atoms which may be substituted, and the like, and among them, a straight-chained or branched alkylene group having 1 to 10 carbon atoms which may be substituted, a cycloalkylene group having 3 to 10 carbon atoms which may be substituted, and an aromatic group having 6 to 12 carbon atoms which may be substituted are preferable in view of performance such as strength and development performance.

Here, the substituents for $G^2$ preferably include those which do not contain a hydroxyl group and in which a hydrogen atom is bound to a heteroatom, such as an amino group, a thiol group or those not containing a carboxyl group.

Y represents an oxygen atom, a sulfur atom, —$N(R^{23})$— or a phenylene group which may be substituted. Here, $R^{23}$ may be a hydrogen atom, an alkyl group which may be substituted, and the like.

In the formula (3), $R^{13}$ to $R^{15}$ each independently represent a hydrogen atom or a monovalent organic group, and may be a hydrogen atom, an alkyl group which may be substituted, and the like. Among them, $R^{13}$ and $R^{14}$ are preferably hydrogen atoms, while $R^{15}$ is preferably a hydrogen atom or a methyl group.

$R^{16}$ to $R^{20}$ each independently represent a monovalent organic group, and examples of $R^{16}$ to $R^{20}$ may include a hydrogen atom, a halogen atom, a dialkylamino group, an alkoxycarbonyl group, a sulfo group, a nitro group, a cyano group, an alkyl group which may be substituted, an aryl group which may be substituted, an alkoxy group which may be substituted, an aryloxy group which may be substituted, an alkylsulfonyl group which may be substituted, an arylsulfonyl group which may be substituted, and the like. Among them, a hydrogen atom, an alkoxycarbonyl group, an alkyl group which may be substituted, and an aryl group which may be substituted are preferred. The substituents which may be introduced include the same groups as those mentioned for the formula (1).

$A^3$ represents an oxygen atom, a sulfur atom or —$N(R^{21})$—, while Z represents an oxygen atom, a sulfur atom or —$N(R^{22})$—. $R^{21}$ and $R^{22}$ may be the same groups as those mentioned for the formula (1).

$G^3$ represents a divalent organic group, however is preferably an alkylene group which may be substituted. Preferably, $G^3$ may be an alkylene group having 1 to 20 carbon atoms which may be substituted, a cycloalkylene group having 3 to 20 carbon atoms which may be substituted, an aromatic group having 6 to 20 carbon atoms which may be substituted, and the like. Among them, a straight-chained or branched alkylene group having 1 to 10 carbon atoms which may be substituted, a cycloalkylene group having 3 to 10 carbon atoms which may be substituted, and an aromatic group having 6 to 12 carbon atoms which may be substituted are preferable in view of performance such as strength and development performance.

Here, the substituents for $G^3$ preferably include those which do not contain a hydroxyl group and in which a hydrogen atom is bound to a heteroatom, such as an amino group, a thiol group or those not containing a carboxyl group.

A compound containing the structural units represented by the formulae (1) to (3) in an amount ranging from 20% or more by mole to less than 95% by mole in one molecule, is preferred from the viewpoints of improved curability and reduced development scum. The amount of the structural units is more preferably in the range of 25 to 90% by mole, and even more preferably 30% or more by mole but less than 85% by mole.

The synthesis of the polymer compound having a structural unit represented by any of the formulae (1) to (3) may be performed on the basis of the synthesis methods described in JP-A No. 2003-262958, paragraphs [0027] to [0057]. Among these, synthesis method 1) in the same publication is preferred, and this method will be described in the synthesis method (1) as follows.

Specific examples of the polymer compound having a structural unit represented by any of the formulae (1) to (3) include the following polymer compounds 1 to 17.

| Polymer compound | Composition (mol %) | Mw |
|---|---|---|
| 1 | (structures with subunits 40, 25, 35) | 97000 |
| 2 | (structures with subunits 35, 30, 35) | 29000 |
| 3 | (structures with subunits 55, 20, 25) | 54000 |
| 4 | (structures with subunits 80, 15, 5) | 16000 |
| 5 | (structures with subunits 45, 40, 5) | 8700 |
| 6 | (structures with subunits 50, 15, 35) | 7200 |
| 7 | (structures with subunits 20, 20, 30) | 4600 |

-continued
| Polymer compound | Composition (mol %) | Mw |
|---|---|---|
| | 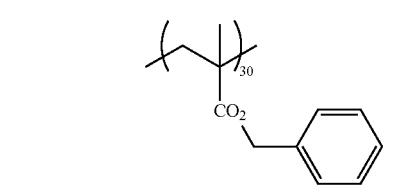 | |
| 8 | 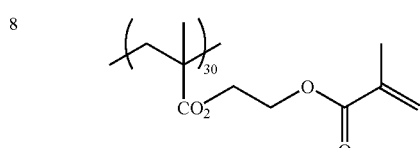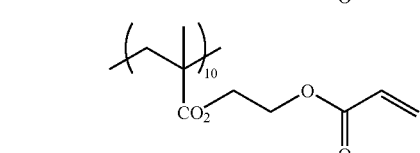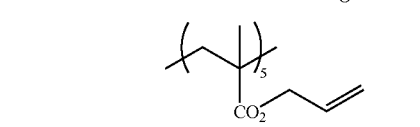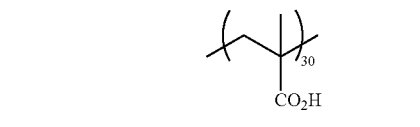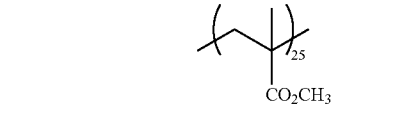 | 9700 |
| 9 | 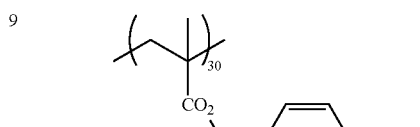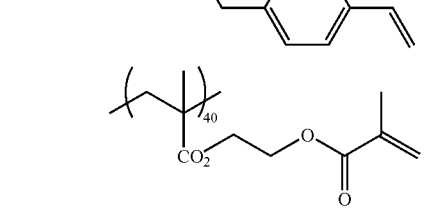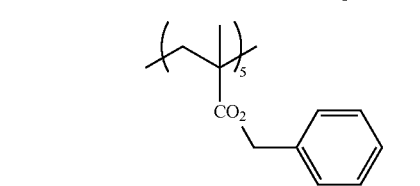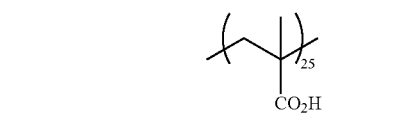 | 67000 |
-continued
| Polymer compound | Composition (mol %) | Mw |
|---|---|---|
| 10 | 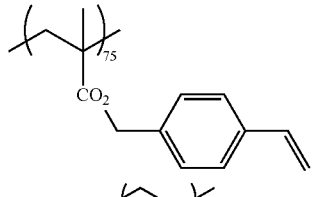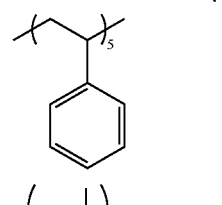 | 25000 |
| 11 | 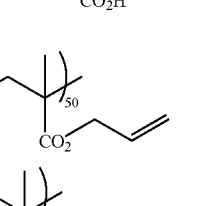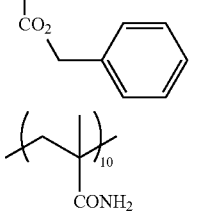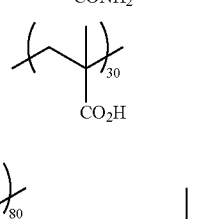 | 35000 |
| 12 | 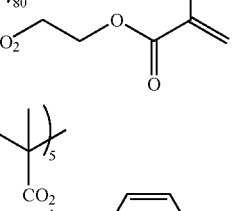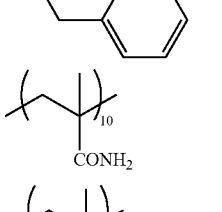 | 5600 |

| Polymer compound | Composition (mol %) | Mw |
|---|---|---|
| 13 | 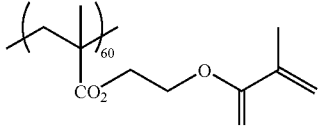 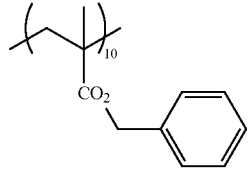 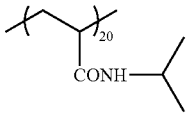 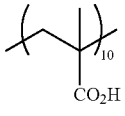 | 18000 |
| 14 | 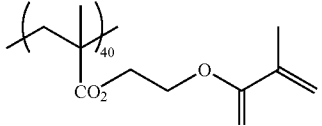 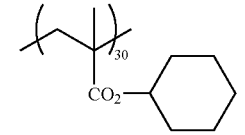 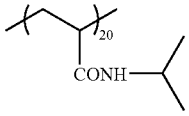 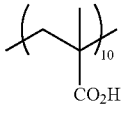 | 23000 |
| 15 | 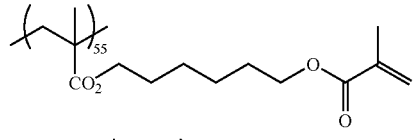 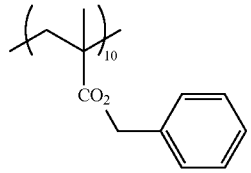 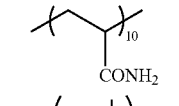 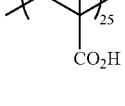 | 58000 |
| 16 | 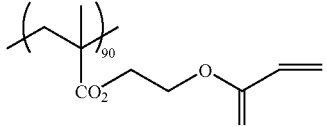 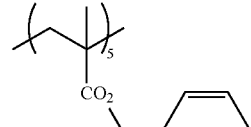 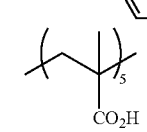 | 76000 |
| 17 |  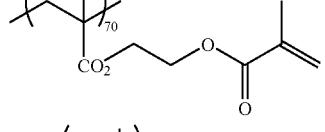 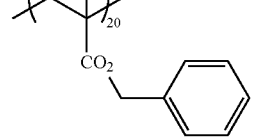 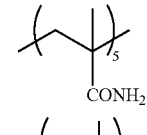 | 2300 |

Additionally, the resins obtained by the following synthesis method (1) or (2) may be preferable.

(1) A method of extracting a proton using a base from a polymer employing a compound represented by the following formula (4) as a copolymerizing component, and eliminating L to obtain the desired polymer compound having the structure represented by formula (1).

In the formula (4), L represents an anionic elimination group, and may be preferably a halogen atom, a sulfonic acid ester or the like. $R^3$ to $R^6$, $A^1$, $G^1$ and X have the same meanings as defined above for the formula (1), and as the base used to generate an elimination reaction, any of inorganic compounds and organic compounds may be used. Detailed and preferred embodiments of this method are described in paragraphs [0028] to [0033] of JP-A No. 2003-262958.

Preferred inorganic compound bases include sodium hydroxide, potassium hydroxide, sodium carbonate, sodium hydrogen carbonate, potassium carbonate, potassium hydrogen carbonate and the like. The organic compound bases include metal alkoxides such as sodium methoxide, sodium ethoxide and potassium t-butoxide, organic amine compounds such as triethylamine, pyridine, and diisopropylethylamine, and the like.

(2) A method of obtaining a radical reactive group by subjecting a polymer in which a compound represented by the following formula (5) is used as a copolymerization component, to an elimination reaction for a specific functional group involving a treatment with base, and thus removing $X^{10}$.

In the formula (5), $A^5$ represents an oxygen atom, a sulfur atom or —N($R^{54}$)—; $A^6$ represents an oxygen atom, a sulfur atom or —$NR^{58}$—; $R^{51}$, $R^{52}$, $R^{53}$, $R^{54}$, $R^{55}$, $R^{56}$, $R^{57}$ and $R^{58}$ each independently represent a hydrogen atom or a monovalent organic group; $X^{10}$ represents a group which is removed by the elimination reaction; $G^5$ represents an organic linking group; and n represents an integer from 1 to 10. Detailed and preferred embodiments of this method are described in detail in JP-A No. 2003-335814.

Examples of the resin obtained by the synthesis method (2) may favorably include the polymer compounds described in JP-A No. 2003-335814, specifically, for example, (i) polyvinyl-based polymer compounds, (ii) polyurethane-based polymer compounds, (iii) polyurea-based polymer compounds, (iv) poly(urethane-urea)-based polymer compounds, (v) polyester-based polymer compounds, (vi) polyamide-based polymer compounds, (vii) acetal-modified polyvinyl alcohol-based polymer compounds, and specific compounds obtained from each of these descriptions.

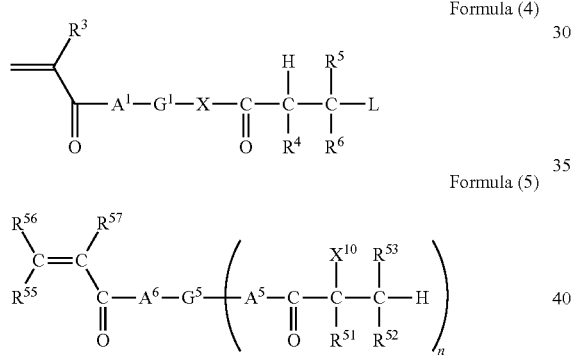

Formula (4)

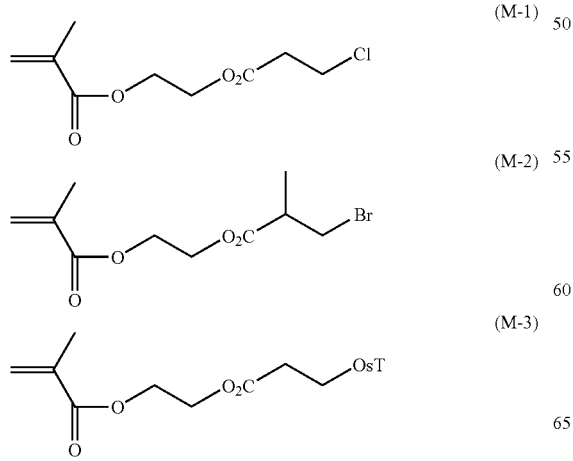

Formula (5)

Examples of the compound represented by the above formula (4) include the following compounds (M-1) to (M-12). However, the compound is not limited thereto.

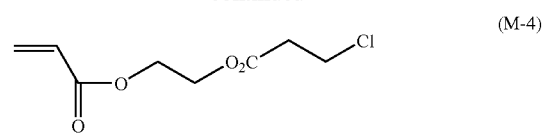
(M-1)

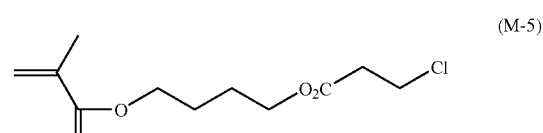
(M-2)

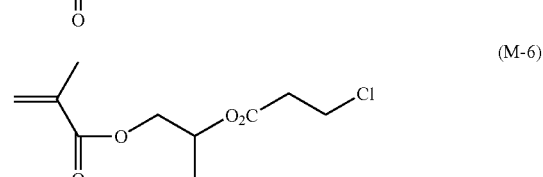
(M-3)

-continued

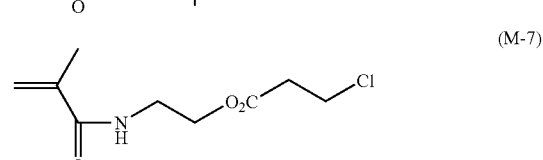
(M-4)

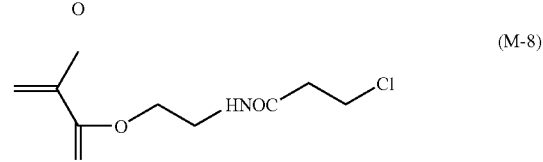
(M-5)

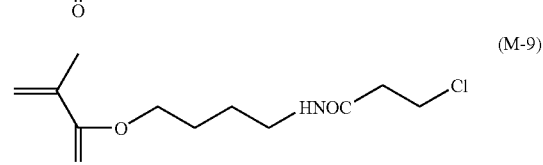
(M-6)

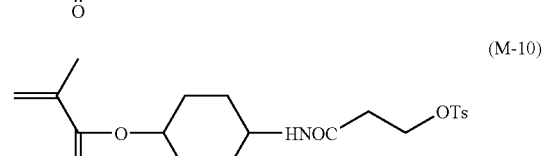
(M-7)

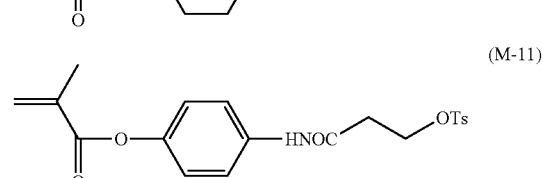
(M-8)

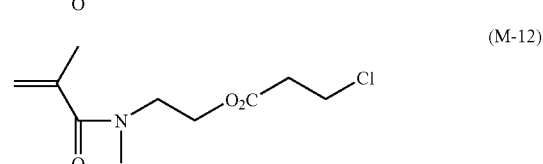
(M-9)

(M-10)

(M-11)

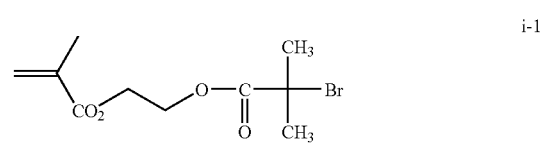
(M-12)

In the following, examples (i-1 to i-52) of the compounds represented by the above formula (5) will be listed below.

i-1

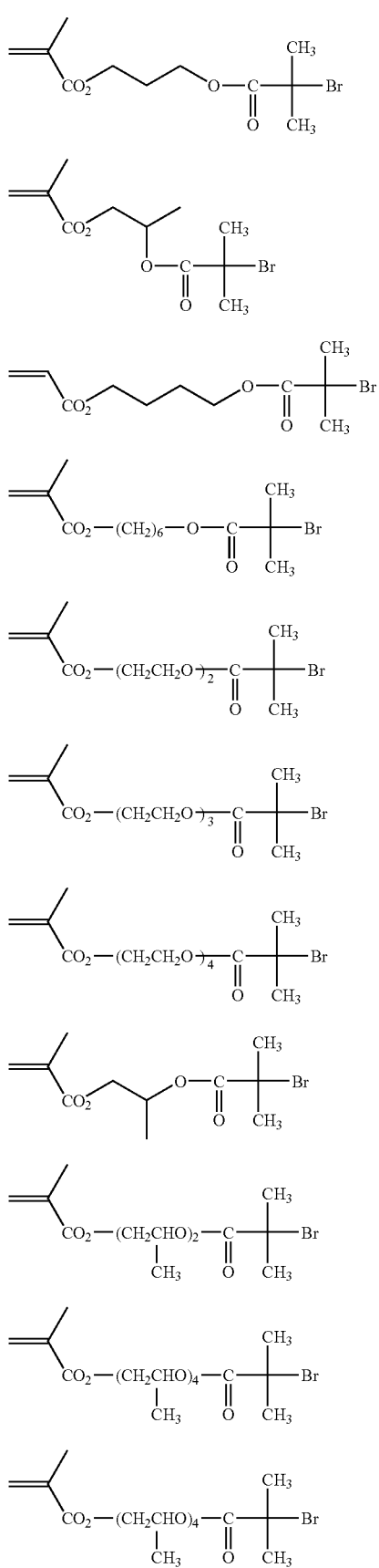
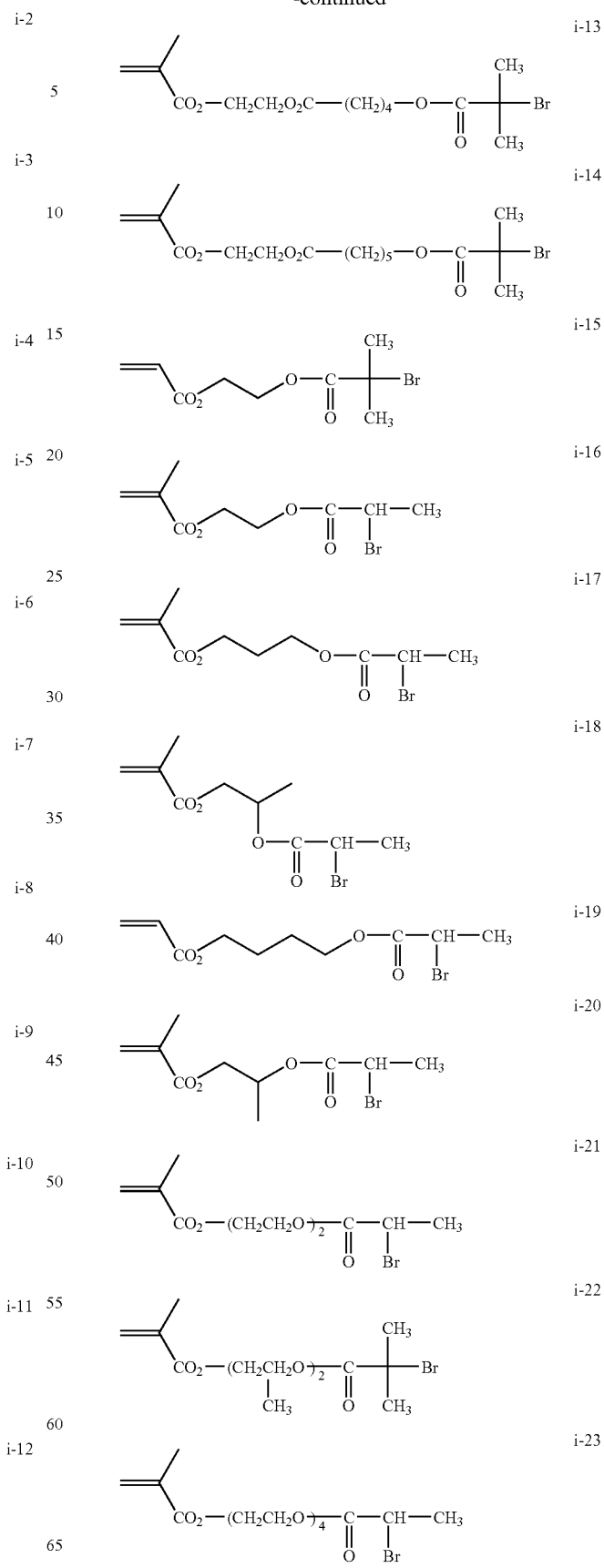

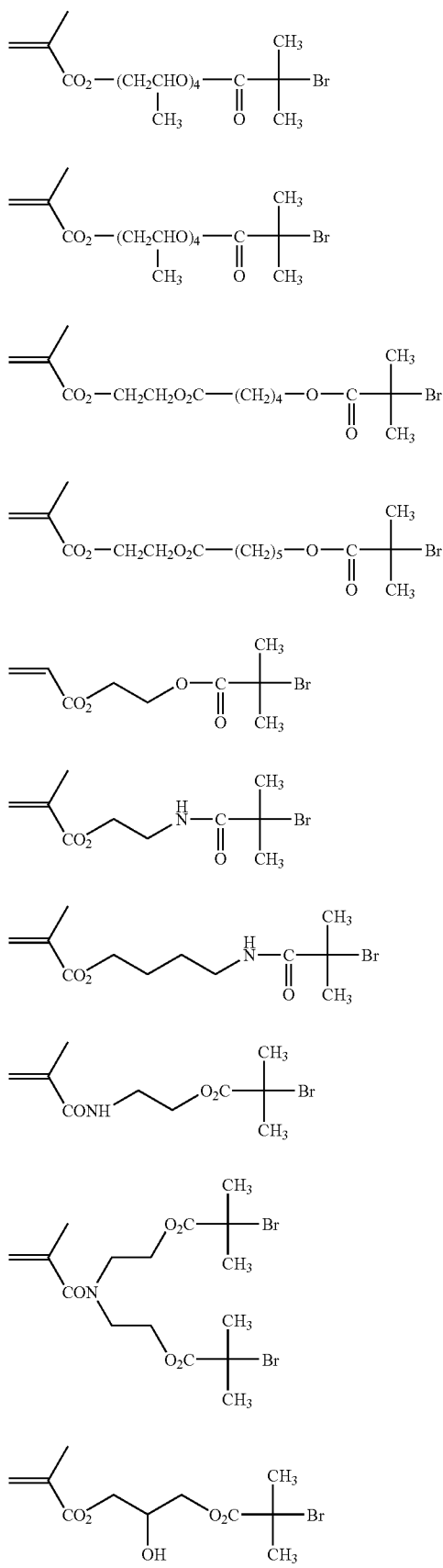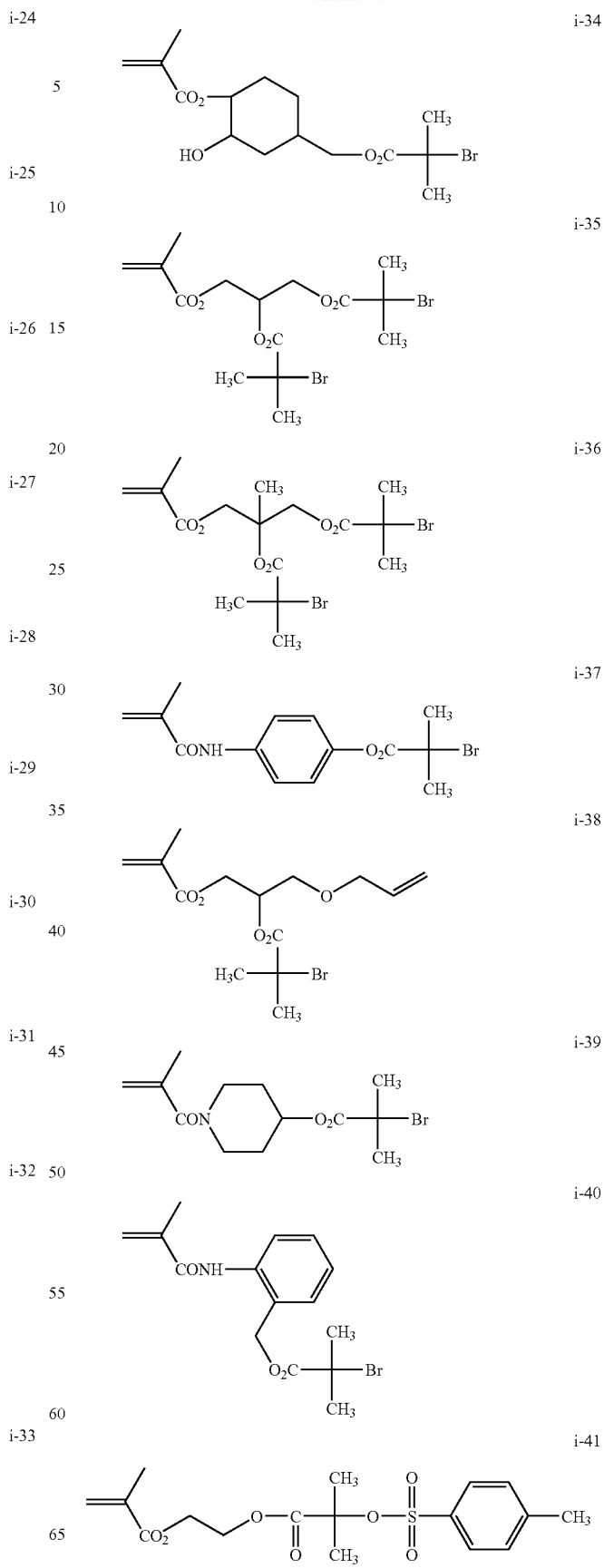

i-42
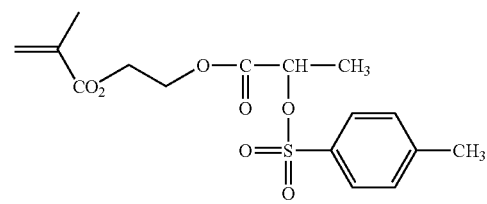

i-43
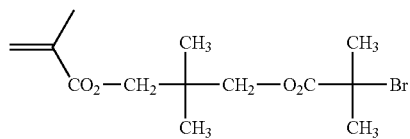

i-44
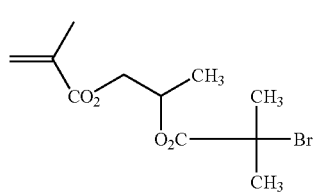

i-45
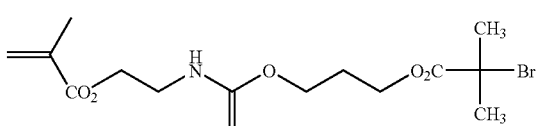

i-46
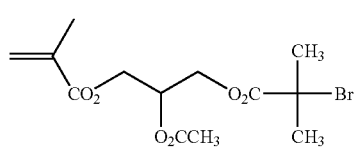

i-47
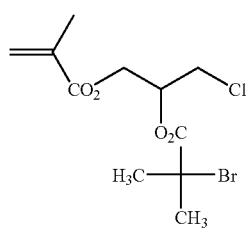

i-48
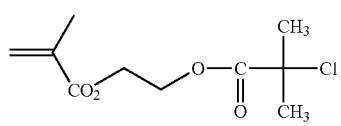

i-49
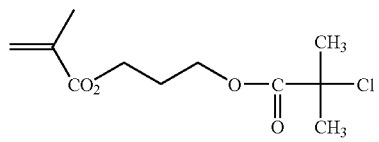

i-50
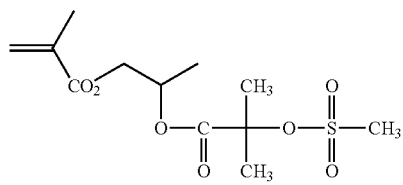

i-51
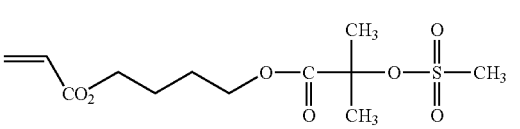

i-52
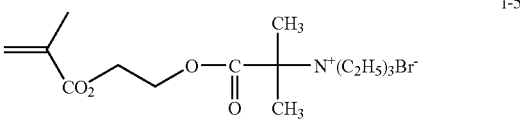

The dispersion resin according to the invention needs to have photopolymerizable unsaturated bonds from the viewpoint of improving photosensitivity, and preferably has COOH, $SO_3H$, $PO_3H_2$, $OSO_3H$ or $OPO_2H_2$ from the viewpoint of enabling alkali development. The dispersion resin according to the invention also preferably has an acid value in the range of 20 to 150, more preferably 35 to 120, and even more preferably 50 to 100, from the viewpoint of the balance between dispersion stability, developability and sensitivity.

Among others, the dispersion resin according to the invention is preferably a resin obtained by reacting a resin of copolymerized (meth)acrylic acid, with a glycidyl group-containing unsaturated compound such as glycidyl (meth) acrylate allyl glycidyl ether; a resin obtained by reacting a resin produced by polymerizing a hydroxyl group-containing (meth)acrylic acid ester compound, with a (meth)acrylic acid ester having a free isocyanate group, such as 2-isocyanate ethyl (meth)acrylate; or a resin obtained by the synthesis method (1) or (2) described above.

The weight average molecular weight of the dispersion resin according to the invention is preferably set to 1,000 to 25,000, more preferably 2,000 to 20,000, and even more preferably 3,000 to 15,000, from the viewpoints of dispersion stability, coating properties and developability.

The dispersion resin according to the invention may have a structural unit represented by the following formula (6):

Formula (6)

$$\left(\begin{array}{c}\text{structure}\end{array}\right)_a$$
$$\text{COOR}^{31}\quad\text{COOR}^{32}$$

In the above-described formula (6), $R^{31}$ and $R^{32}$ each independently represent a hydrogen atom, or a hydrocarbon group having 1 to 25 carbon atoms which may be substituted or unsubstituted; a represents the number of the structural unit when the total number of the structural units derived from the monomers constituting the dispersion resin is supposed to be 100, and represents an integer from 1 to 30.

It may be thought that the structural unit represented by the above-described formula (6) can be formed by a cyclization reaction of an ether dimer represented by the following formula (7) [in the formula (7), $R^{41}$ and $R^{42}$ each represent a hydrocarbon group having 1 to 25 carbon atoms (for example, a methyl group, an ethyl group, a propyl group, an isopropyl group or the like may be mentioned, and the hydrocarbon group is preferably an alkyl group having 1 to 5 carbon atoms) which may be substituted or unsubstituted].

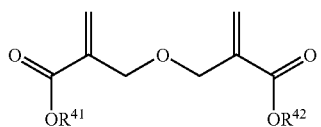

Formula (7)

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'-[oxybis(methylene)]bis-2-propenoate, di(t-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(t-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, di(2-methyl-2-adamantyl)-2,2'-[oxybis(methylene)]bis-2-propenoate, and the like.

These ether dimmers may be used as a single species or as a mixture of two or more species. Also, the cyclization rate of the ether dimer during the synthesis may not be necessarily 100%.

As for the dispersion resin according to the invention, the entire amount of the resin may be used together with a pigment during dispersion, or a portion of the dispersion resin may be added after dispersion. The dispersion resin of the invention is preferably used in an amount of at least 20 parts by mass or more, based on 100 parts by mass of the pigment.

(B) Pigment

The colored photocurable composition of the invention contains at least one pigment. When a pigment is used as the colorant, it is preferable in terms of durability such as heat resistance or light-fastness.

As for the pigment which may be contained in the colored photocurable composition of the invention, a variety of conventionally known inorganic pigments or organic pigments may be used, and those obtain high transmittance are preferred.

Inorganic pigments include metal compounds such as metal oxides and metal complex salts, and specific examples thereof include metal oxides of iron, cobalt, aluminum, cadmium, lead, copper, titanium, magnesium, chromium, zinc, antimony and the like, and composite oxides of these metals.

Examples of Organic Pigments Include

C.I. Pigment Yellow 11, 24, 31, 53, 83, 93, 99, 108, 109, 110, 138, 139, 147, 150, 151, 154, 155, 167, 180, 185, 199;

C.I. Pigment Orange 36, 38, 43, 71;

C.I. Pigment Red 81, 105, 122, 149, 150, 155, 171, 175, 176, 177, 209, 220, 224, 242, 254, 255, 264, 270;

C.I. Pigment Violet 19, 23, 32, 39;

C.I. Pigment Blue 1, 2, 15, 15:1, 15:3, 15:6, 16, 22, 60, 66;

C.I. Pigment Green 7, 36, 37;

C.I. Pigment Brown 25, 28;

C.I. Pigment Black 1, 7;

carbon black and the like.

In the invention, particularly those pigments having a basic N atom in the structural formula may be preferably used. These pigments having a basic N atom exhibit good dispersibility in the colored photocurable composition of the invention. The cause has not been fully clarified, however it is conjectured that good affinity between a polymer component and the pigment has an influence on the dispersibility.

As the pigment which can be preferably used in the invention, the following can be exemplified, however the invention is not restricted to them.

C.I. Pigment Yellow 11, 24, 108, 109, 110, 138, 139, 150, 151, 154, 167, 180, 185;

C.I. Pigment Orange 36, 71;

C.I. Pigment Red 122, 150, 171, 175, 177, 209, 224, 242, 254, 255, 264;

C.I. Pigment Violet 19, 23, 32;

C.I. Pigment Blue 15:1, 15:3, 15:6, 16, 22, 60, 66;

C.I. Pigment Black 1.

These organic pigments can be used alone, or by variously combining them in order to enhance a color purity. For example, when the colored photocurable composition of the invention is used to form colored patterns of color filter, it is preferable to use the combination of pigments in order to enhance a color purity of the colored patterns.

Examples of the combination are shown below. For example, as a red pigment, an anthraquinone-based pigment, a perylene-based pigment or a diketopyrrolopyrrole-based pigment alone, or at least one of them, and a disazo-based yellow pigment, an isoindoline-based yellow pigment, a quinophthalone-based yellow pigment or a perylene-based red pigment can be mixed and used. For example, examples of the anthraquinone-based pigment include C.I. Pigment Red 177, examples of the perylene-based pigment include C.I. Pigment Red 155 and C.I. Pigment Red 224, and examples of the diketopyrrolopyrrole-based pigment include C.I. Pigment Red 254. From a color reproductivity, a mixture with C.I. Pigment Yellow 139 is preferable. A mass ratio between the red pigment and the yellow pigment is preferably 100:5 to 100:50.

In addition, as the green pigment, a halogenated phthalocyanine-based pigment can be used alone, or a mixture of this with a disazo-based yellow pigment, a quinophthalone-based yellow pigment, an azomethine-based yellow pigment or an isoindoline-based yellow pigment can be used. As such an example, a mixture of C.I.Pigment Green 7, 36, 37, and C.I.Pigment Yellow 83, C.I.Pigment Yellow 138, C.I.Pigment Yellow 139, C.I.Pigment Yellow 150, C.I.Pigment Yellow 180 or C.I.Pigment Yellow 185 is preferable. A mass ratio of the green pigment and the yellow pigment is preferably 100:5 to 100:150. The mass ratio is particularly preferably in a range of 100:30 to 100:120.

As the blue pigment, a phthalocyanine-based pigment can be used alone, or a mixture of this with a dioxazine-based violet pigment can be used. For example, a mixture of C.I.Pigment Blue 15:6 and C.I.Pigment Violet 23 is preferable. A mass ratio of the blue pigment and the violet pigment is preferably 100:0 to 100:30, more preferably 100:10 or less.

As the pigment used in the case of using the colored photocurable composition of the invention in the formation of black matrix of a color filter, carbon, titanium carbon, iron oxide and titanium oxide are used individually or as a mixture, and a combination of carbon and titanium carbon is preferred. The mass ratio of carbon and titanium carbon is preferably in the range of 100:0 to 100:60.

The primary particle diameter of the pigment is preferably 100 nm or less when used for a color filter, from the viewpoints of color unevenness or contrast, while the primary particle diameter is preferably 5 nm or more from the viewpoint of dispersion stability. The primary particle diameter of the pigment is more preferably 5 to 75 nm, even more preferably 5 to 55 nm, and particularly preferably 5 to 35 nm.

The primary particle diameter of the pigment may be measured by known methods such as electron microscopy.

Inter alia, the pigment is preferably a pigment selected from anthraquinone series, azomethine series, benzylidene series, cyanine series, diketopyrrolopyrrole series and phthalocyanine series.

The content of the pigment in the pigment-dispersed composition is preferably 30% by mass or more, and more preferably in the range of 40 to 95% by mass, based on the total solid content in the composition, from the viewpoints of securing high tinctorial strength, and for example, securing high color density in the case of producing a color filter.

In addition, the pigment-dispersed composition of the invention may further contain a dye, within the scope of not impairing the effect of the invention. The dye is not particularly limited, and the dyes conventionally known for the use in color filters may be used. For example, those disclosed in JP-A No. 64-90403, JP-A No. 64-91102, JP-A No. 1-94301, JP-A No. 6-11614, Japanese Patent No. 2592207, U.S. Pat. Nos. 4,808,501, 5,667,920, 5,059,500, JP-A No. 5-333207, JP-A No. 6-35183, JP-A No. 6-51115, JP-A No. 6-194828, JP-A No. 8-211599, JP-A No. 4-249549, JP-A No. 10-123316, JP-A No. 11-302283, JP-A No. 7-286107, JP-A No. 2001-4823, JP-A No. 8-15522, JP-A No. 8-29771, JP-A No. 8-146215, JP-A No. 11-343437, JP-A No. 8-62416, JP-A No. 2002-14220, JP-A No. 2002-14221, JP-A No. 2002-14222, JP-A No. 2002-14223, JP-A No. 8-302224, JP-A No. 8-73758, JP-A No. 8-179120, and JP-A No. 8-151531 can be used.

As a chemical structure of the dye, a pyrazoleazo series, an anilinoazo series, a triphenylmethane series, an anthraquinone series, an anthrapyridone series, a benzylidene series, an oxonol series, a pyrazolotriazolazo series, a pyridoneazo series, a cyanine series, a phenothiazine series, a pyrrolopyrazoleazomethine series, a xanthene series, a phthalocyanine series, a benzopyran series, and an indigo series can be exemplified.

(C) Photopolymerization Initiator

The colored photocurable composition of the invention includes at least one photopolymerization initiator. The photopolymerization initiator is a compound which is decomposed by light, to initiate and promote the polymerization of (A) a dispersion resin having an unsaturation equivalent of less than 600 and (D) a polyfunctional photopolymerizable compound described later in the invention. The photopolymerization initiator preferably has absorption in the region of wavelength from 300 to 500 nm.

The photopolymerization initiator may be used alone as one species, or may be used in combination of two or more species.

Examples of the photopolymerization initiator include organic halogenated compounds, oxydiazole compounds, carbonyl compounds, ketal compounds, benzoin compounds, acridine compounds, organic peroxide compounds, azo compounds, coumarin compounds, azide compounds, metallocene compounds, hexaarylbiimidazole compounds, organic borate compounds, disulfone compounds, oxime compounds, onium salt compounds, acylphosphine-based compounds, alkylamino compounds, and the like.

Hereinafter, each of these compounds will be illustrated in detail.

Specific examples of the organic halogenated compounds include the compounds described in Wakabayashi et al., "Bull. Chem. Soc. Japan" 42, 2924 (1969), U.S. Pat. No. 3,905,815, JP-B No. 46-4605, JP-A Nos. 48-36281, 55-32070, 60-239736, 61-169835, 61-169837, 62-58241, 62-212401, 63-70243 and 63-298339, and M. P. Hutt, "Journal of Heterocyclic Chemistry" Vol. 1, No. 3 (1970). In particular, oxazole compounds substituted with a trihalomethyl group, and s-triazine compounds may be mentioned.

The s-triazine compounds suitably include s-triazine derivatives in which at least one mono-, di- or trihalogen-substituted methyl group is bound to an s-triazine ring, and specific examples include 2,4,6-tris(monochloromethyl)-s-triazine,
2,4,6-tris(dichloromethyl)-s-triazine, 2,4,6-tris(trichloromethyl)-s-triazine,
2-methyl-4,6-bis(trichloromethyl)-s-triazine, 2-n-propyl-4,6-bis(trichloromethyl)-s-triazine,
2-($\alpha,\alpha,\beta$-trichloroethyl)-4,6-bis(trichloromethyl)-s-triazine,
2-phenyl-4,6-bis(trichloromethyl)-s-triazine,
2-(p-methoxyphenyl)-4,6-bis(trichloromethyl)-s-triazine,
2-(3,4-epoxyphenyl)-4,6-bis(trichloromethyl)-s-triazine,
2-(p-chlorophenyl)-4,6-bis(trichloromethyl)-s-triazine,
2-[1-(p-methoxyphenyl)-2,4-butadienyl]-4,6-bis(trichloromethyl)-s-triazine,
2-styryl-4,6-bis(trichloromethyl)-s-triazine,
2-(p-methoxystyryl)-4,6-bis(trichloromethyl)-s-tiazine,
2-(p-1-propyloxystyryl)-4,6-bis(trichloromethyl)-s-triazine,
2-(p-tolyl)-4,6-bis(tichloromethyl)-s-triazine,
2-(4-naphthoxynaphthyl)-4,6-bis(trichloromethyl)-s-triazine,
2-phenylthio-4,6-bis(trichloromethyl)-s-triazine,
2-benzylthio-4,6-bis(trichloromethyl)-s-triazine, 2,4,6-tris(dibromomethyl)-s-triazine,
2,4,6-tris(tribromomethyl)-s-triazine, 2-methyl-4,6-bis(tribromomethyl)-s-triazine,
2-methoxy-4,6-bis(tribromomethyl)-s-triazine, and the like.

The oxydiazole compounds include 2-trichloromethyl-5-styryl-1,3,4-oxodiazole,
2-trichloromethyl-5-(cyanostyryl)-1,3,4-oxodiazole,
2-trichloromethyl-5-(naphth-1-yl)-1,3,4-oxodiazole,
2-trichloromethyl-5-(4-styryl)styryl-1,3,4-oxodiazole, and the like.

Examples of the carbonyl compounds include benzophenone derivatives such as benzophenone, Michler's ketone, 2-methylbenzophenone, 3-methylbenzophenone, 4-methylbenzophenone, 2-chlorobenzophenone, 4-bromobenzophenone and 2-carboxybenzophenone; acetophenone derivatives such as 2,2-dimethoxy-2-phenylacetophenone, 2,2-diethoxyacetophenone, 1-hydroxycyclohexylphenyl ketone, $\alpha$-hydroxy-2-methylphenylpropanone, 1-hydroxy-1-methylethyl-(p-isopropylphenyl) ketone, 1-hydroxy-1-(p-dodecylphenyl) ketone, 2-methyl-(4'-(methylthio)phenyl)-2-morpholino-1-propanone, 1,1,1-trichloromethyl-(p-butylphenyl) ketone, and 2-benzyl-2-dimethylamino-4-morpholinobutyrophenone; thioxanthone derivatives such as thioxanthone, 2-ethylthioxantone, 2-isopropylthioxantone, 2-chlorothioxantone, 2,4-dimethylthioxantone, 2,4-diethylthioxantone, and 2,4-diisopropylthioxantone; benzoic acid ester derivatives such as ethyl p-dimethylaminobenzoate and ethyl p-diethylaminobenzoate; and the like.

The ketal compounds include benzyl methyl ketal, benzyl-p-methoxyethyl ethyl acetal and the like.

The benzoin compounds include m-benzoin isopropyl ether, benzoin isobutyl ether, benzoin methyl ether, methyl-o-benzoyl benzoate and the like.

The acridine compounds include 9-phenylacridine, 1,7-bis(9-acridinyl)heptane and the like.

Examples of the organic peroxide compounds include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic acid peroxide, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxylaurate, tosyl carbonate, 3,3',4,4'-tetra-(t-butylperoxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyl di(t-butylperoxy dihydrogen diphthalate), carbonyl di(t-hexylperoxy dihydrogen diphthalate), and the like.

Examples of the azo compounds include the azo compounds described in JP-A No. 8-108621, and the like.

Examples of the coumarin compounds include
3-methyl-5-amino-((s-triazin-2-yl)amino)-3-phenylcoumarin,
3-chloro-5-diethylamino-((s-triazin-2-yl)amino)-3-phenylcoumarin,
3-butyl-5-dimethylamino-((s-triazin-2-yl)amino)-3-phenylcoumarin, and the like.

The azide compounds include the organic azide compounds described in U.S. Pat. Nos. 2,848,328, 2,852,379 and 2,940,853, 2,6-bis-(4-azidobenzylidene)-4-ethylcyclohexanone (BAC-E), and the like.

The metallocene compounds include various titanocene compounds described in JP-A Nos. 59-152396, 61-151197, 63-41484, 2-249, 2-4705 and 5-83588, for example, dicyclopentadienyl-Ti-bis-phenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl, dimethylcyclopentadienyl-Ti-bis-2,3,4,5,6-pentafluorophen-1-yl; the iron-arene complexes described in JP-A Nos. 1-304453 and 1-152109; and the like.

The hexaarylbiimidazole compounds include, for example, various compounds described in JP-B No. 6-29285, U.S. Pat. Nos. 3,479,185, 4,311,783, 4,622,286, and the like, and specific examples thereof include 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, 2,2'-bis(o-trifluorophenyl)-4,4',5,5'-tetraphenylbiimidazole, and the like.

Specific examples of the organic borate compounds include the organic boric acid salts described in JP-A Nos. 62-143044, 62-150242, 9-188685, 9-188686, 9-188710, 2000-131837, 2002-107916, Japanese Patent No. 2764769 and Japanese Patent Application No. 2000-310808, Kunz, Martin, "Rad Tech '98, Proceedings, Apr. 19-22, 1998, Chicago", and the like; the organic boron-sulfonium complexes or organic boron-oxosulfonium complexes described in JP-A Nos. 6-157623, 6-175564 and 6-175561; the organic boron-iodonium complexes described in JP-A Nos. 6-175554 and 6-175553; the organic boron-phosphonium complexes described in JP-A No. 9-188710; the organic boron-transition metal coordination complexes described in JP-A Nos. 6-348011, 7-128785, 7-140589, 7-306527 and 7-292014; and the like.

The disulfone compounds include the compounds described in JP-A Nos. 61-166544, 2002-328465 (Japanese Patent Application No. 2001-132318), and the like.

Examples of the oxime compounds may include compounds described in J.C.S. Perkin II (1979) 1653-1660, J.C.S. Perkin II (1979) 156-162, Journal of Photopolymer Science and Technology (1995) 202-232, and JP-A No. 2000-66385; and the compounds described in JP-A No. 2000-80068 and Japanese Patent Application National Publication (Laid-Open) No. 2004-534797; and the like.

As for an oxime-based photopolymerization initiator, 2-(O-benzoyloxime)-1-[4-(phenylthio) phenyl]-1,2-octanedione, 1-(O-acetyloxime)-1-[9-ethyl-6-(2-methylbenzoyl)-9H-carbazol-3-yl]ethanone is most preferable. As such an oxime-based photopolymerization initiator, there are CGI-124, CGI-242 (manufactured by Ciba Specialty Chemicals Co., Ltd.).

Examples of the onium compounds include the diazonium salts described in S. I. Schlesinger, Photogr. Sci. Eng., 18, 387 (1974), T. S. Bal et al., Polymer, 21, 423 (1980); the ammonium salts described in U.S. Pat. No. 4,069,055, JP-A No. 4-365049 and the like; the phosphonium salts described in U.S. Pat. Nos. 4,069,055 and 4,069,056; the iodonium salts described in EP No. 104,143, U.S. Pat. Nos. 339,049 and 410,201, JP-A Nos. 2-150848 and 2-296514; and the like.

The iodonium salts that may be appropriately used in the invention are diaryliodonium salts, and from the viewpoint of stability, a diaryliodonium salt which is substituted with two or more electron donating groups such as an alkyl group, an alkoxy group or an aryloxy group, is preferred. Furthermore, as another preferred form of sulfonium salt, an iodonium salt in which one of the substituents of a triarylsulfonium salt has a coumarin or anthraquinone structure, and which has absorption at 300 nm or longer, is preferred.

The sulfonium salt that may be appropriately used in the invention may be the sulfonium salts described in EP Nos. 370,693, 390,214, 233,567, 297,443 and 297,442, U.S. Pat. Nos. 4,933,377, 161,811, 410,201, 339,049, 4,760,013, 4,734,444 and 2,833,827, German Patent Nos. 2,904,626, 3,604,580 and 3,604,581. From the viewpoint of stable sensitivity, a sulfonium salt substituted with an electron withdrawing group is preferred. As for the electron withdrawing group, one having a Hammett value of greater than 0 is preferred. Preferred electron withdrawing groups include a halogen atom, carboxylic acid and the like.

Other preferred sulfonium salts may include a sulfonium salt in which one of the substituents of a triarylsulfonium salt has a coumarin or anthraquinone structure, and which has absorption at 300 nm or longer. Other preferred sulfonium salts may include a sulfonium salt in which a triarylsulfonium salt has an aryloxy group or an arylthio group as the substituent, and which has absorption at 300 nm or longer.

As the onium salt compounds, onium salts such as the selenonium salts described in J. V. Crivello et al., Macromolecules, 10(6), 1307 (1977), and J. V. Crivello et al., J. Polymer Sci., Polymer Chem. Ed., 17, 1047 (1979); and the arsonium salts described in C. S. Wen et al., Teh, Proc. Conf. Rad. Curing ASIA, p.478 Tokyo, Oct. (1988), may also be used.

The acylphosphine-based compounds include Irgacure 819, Darocure 4265 and Darocure TPO, all manufactured by Ciba Specialty Chemicals Inc., and the like.

Examples of the alkylamino compounds include the compounds having a dialkylaminophenyl group or the alkylamine compounds described in JP-A No. 9-281698, paragraph [0047], JP-A Nos. 6-19240 and 6-19249, and the like. Specifically, the compounds having a dialkylaminophenyl group include compounds such as ethyl p-dimethylaminobenzoate, or dialkylaminophenylcarbaldehydes such as p-diethylaminobenzcarbaldehyde and 9-durolidylcarbaldehyde, and the alkylamine compounds include triethanolamine, diethanolamine, triethylamine and the like.

As for the (C) photopolymerization initiator used in the invention, from the viewpoint of exposure sensitivity, a compound selected from the group consisting of triazine-based compounds, alkylamino compounds, benzyldimethylketal compounds, α-hydroxyketone compounds, α-aminoketone compounds, acylphosphine-based compounds, phosphine oxide-based compounds, metallocene compounds, oxime-based compounds, biimidazole-based compounds, onium-based compounds, benzothiazol-based e compounds, benzophenone-based compounds, acetophenone-based compounds and derivatives thereof, cyclopentadiene-benzene-iron complex and salts thereof, halomethyloxadiazole compounds, and 3-aryl-substituted coumarin compounds, is preferred.

More preferably, triazine-based compounds, alkylamino compounds, α-aminoketone compounds, acylphosphine-based compounds, phosphine oxide-based compounds, oxime-based compounds, biimidazole-based compounds, onium-based compounds, benzophenone-based compounds and acetophenone-based compounds may be mentioned, and at least one compound selected from the group consisting of triazine-based compounds, alkylamino compounds, oxime-based compounds and biimidazole-based compounds is more preferred.

The content of the (C) photopolymerization initiator in the colored photocurable composition is preferably from 0.1 to 50% by mass, more preferably from 0.5 to 30% by mass, and particularly preferably from 1 to 20% by mass, based on the total solid content of the composition. In particular, when the colored photocurable composition of the invention is used for the formation of colored patterns of color filters, the content of the (C) photopolymerization initiator is preferably from 1 to 40% by mass, more preferably from 2 to 30% by mass, and even more preferably from 3 to 20% by mass, based on the total solid contained in the colored photocurable composition, from the viewpoints of photosensitivity, contact characteristics with a substrate and the degree of curing.

(D) Polyfunctional Photopolymerizable Compound

The colored photocurable composition of the invention contains, as an essential component, at least one (D) polyfunctional photopolymerizable compound having an acidic functional group and/or an alkyleneoxy chain.

According to the invention, the polyfunctional photopolymerizable compound means a photocurable compound having two or more photocurable functional groups. Hereinafter, the "(D) polyfunctional photopolymerizable compound having an acidic functional group and/or an alkyleneoxy chain" according to the invention may also be referred to as a "specific photocurable compound."

As for the type of the specific photocurable compound, there are three types, including (D-1) a polyfunctional photopolymerizable compound having one or more acidic functional groups and not having any alkyleneoxy chain (hereinafter, may also be referred to as "AO chain"), (D-2) a polyfunctional photopolymerizable compound having one or more AO chains and not having any acidic functional group, and (D-3) a polyfunctional photopolymerizable compound having one or more acidic functional groups and one or more AO chains.

In the case where the colored photocurable composition of the invention contains two or more of the specific photocurable compounds, when two or more compounds are to be selected from the three types of (D-1) to (D-3), the two or more compounds may be selected from the group consisting of compounds of one type, or the two or more compounds may be selected from the group obtained by combining compounds of different types.

As the specific photocurable compound according to the invention, it is preferable to use a compound having a relatively small molecular size. In particular, it is preferable to use a compound having a weight average molecular weight, on the basis of polystyrene, of less than 3,000.

If a specific photocurable compound having an acidic functional group is incorporated into the colored photocurable composition, the photocurable functional group of the compound enhances the cross-linking density, and the acidic functional group of the compound enhances the solubility in alkali. Therefore, even if a component which does not have curing reactivity and also is not alkali-soluble, such as a colorant or a photopolymerization initiator, is added to the colored photocurable composition in an increased amount, the cross-linking density and the solubility in alkali are increased by adding a specific photocurable compound having an acidic functional group, and thus excellent curability and alkali developability are obtained.

The acidic functional group of the specific photocurable compound may be a group which can be treated by alkali development, and there may be mentioned, for example, a carboxyl group, a sulfonic acid group, a phosphoric acid group or the like. However, from the viewpoints of alkali developability and handing of the resin composition, a carboxyl group is preferred.

Also, if a specific photocurable compound having an alkyleneoxy chain is incorporated into the colored photocurable composition, the photocurable functional group of the compound enhances the cross-linking density, and the alkyleneoxy chain of the compound enhances hydrophilicity, thereby the solubility in an aqueous alkali developing solution also being enhanced. Therefore, even if a component which does not have curing reactivity and also is not alkali-soluble, such as a colorant or a photopolymerization initiator, is added to the colored photocurable composition in an increased amount, the cross-linking density and the solubility in alkali are increased by adding a specific photocurable compound having an alkyleneoxy chain, and thus excellent curability and alkali developability are obtained.

The type of reaction of the photocurable functional group of the specific photocurable compound is not limited, and any of a photo-radical reaction, a photo-cationic reaction and a photo-anionic reaction may be used. The photocurable functional is preferably a group reactive in a photo-radical reaction such as photo-radical polymerization or photo-radical dimerization, and is particularly preferably a group containing an ethylenic unsaturated bond, such as a (meth)acryloyl group. An acryloyl group and a methacryloyl group are preferred, and an acryloyl group is more preferred.

In order to increase the cross-linking density, it is favorable to increase the number of the photocurable functional group in the specific photocurable compound. Also, from the viewpoint of the cross-linking density as described above, the number of the photocurable functional group in the specific photocurable compound having an AO chain is preferably 3 or greater, more preferably 3 to 30, and particularly preferably 3 to 15.

Also, from the viewpoint of the cross-linking density as described above, the number of the photocurable functional group in the specific photocurable compound having an acidic functional group is preferably 3 or greater.

Among the specific photocurable compounds, a pentaerythritol derivative and/or a dipentaerythritol derivative is preferred from the viewpoint of obtaining the effects of the invention more effectively.

As the specific photocurable compound having an acidic functional group, (1) a compound having a carboxyl group introduced thereto by modifying a monomer or oligomer having a hydroxyl group as well as three or more photocurable functional groups, with a dibasic acid anhydride, or (2) a compound having a sulfonic acid group introduced thereto by modifying an aromatic compound having three or more photocurable functional groups, with concentrated sulfuric acid or fuming sulfuric acid, can be used. Furthermore, an oligomer including a monomer which is a specific photocurable compound itself as the repeating unit, may also be used as the specific photocurable compound.

The specific photocurable compound according to the invention is preferably at least one selected from the group consisting of compounds represented by the following formula (1) or formula (2). In addition, in the formula (1) or formula (2), if T or G is an alkyleneoxy chain, the terminal on the carbon atom side is bound to R, X and W.

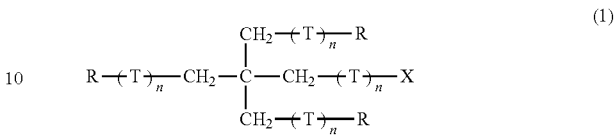

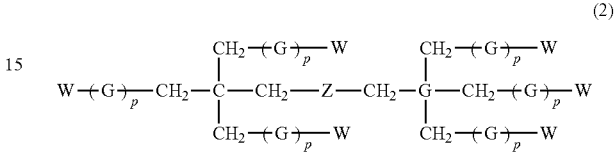

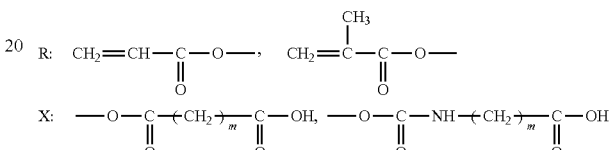

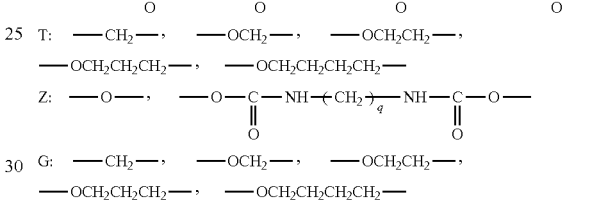

In the formula (1), n is from 0 to 14, and m is from 1 to 8. In the formula (2), W is the same R or X as in the formula (1), and among the six W's, three or more W's are R. p is from 0 to 14, and q is from 1 to 8. R, X, T and G which plurally exist within one molecule may be respectively identical or different.

Among the compounds represented by the formula (1) and (2), a pentaerythritol derivative and/or dipentaerythritol derivative is more preferred.

Specifically, compounds represented by the following structural formulas (3) to (14) (hereinafter, may also be referred to as "exemplary compounds (3) to (14)") may be mentioned, and among them, the exemplary compounds (3), (4), (5), (7) and (9) are preferred.

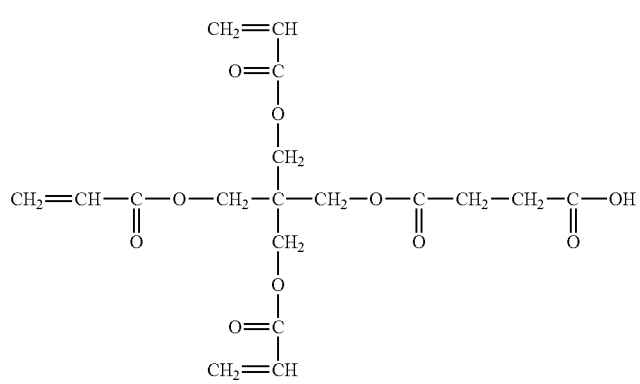

(4)
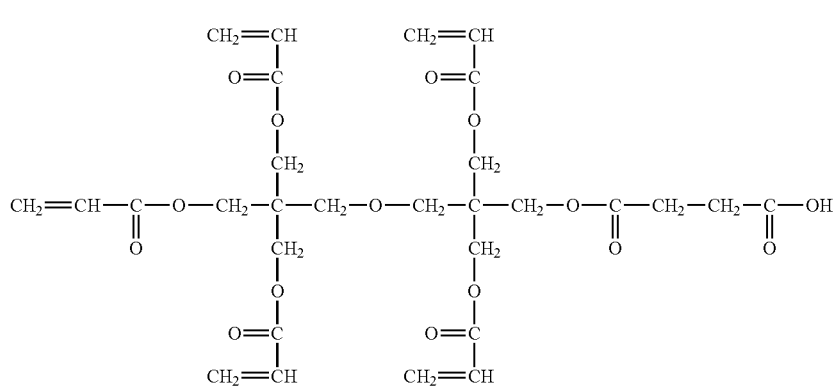
(5)
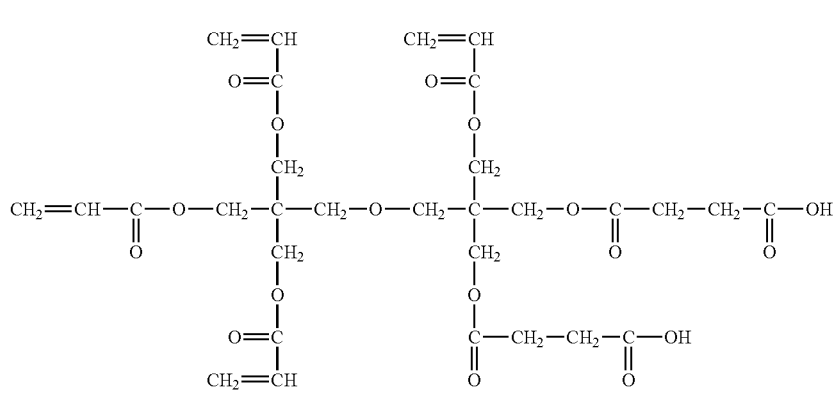
(6)
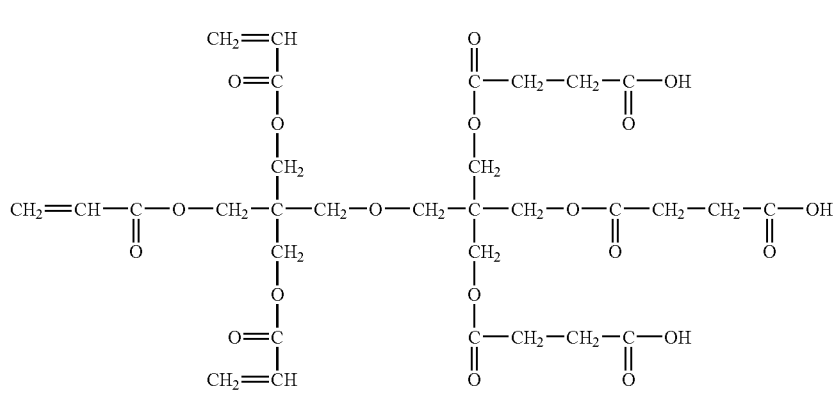
(7)
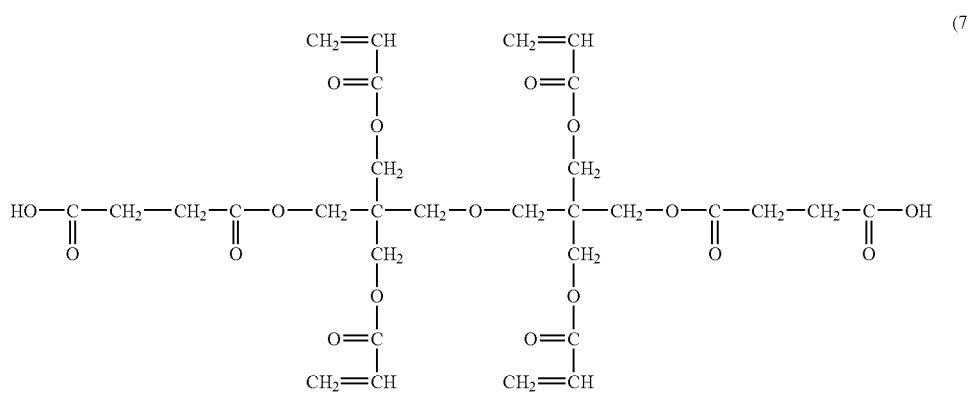

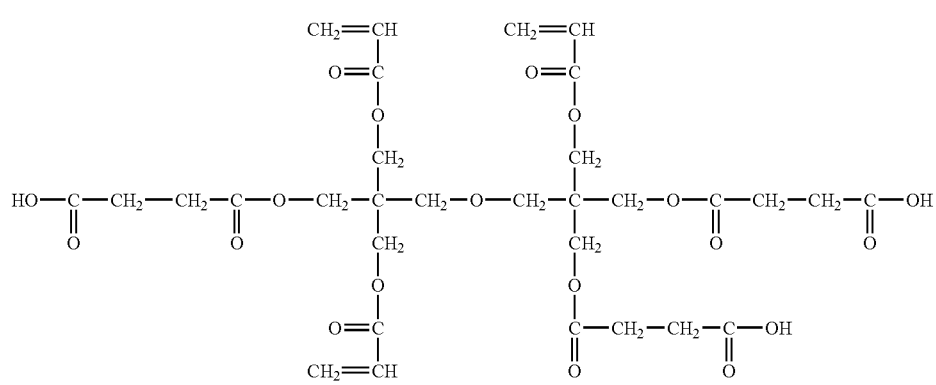
(8)
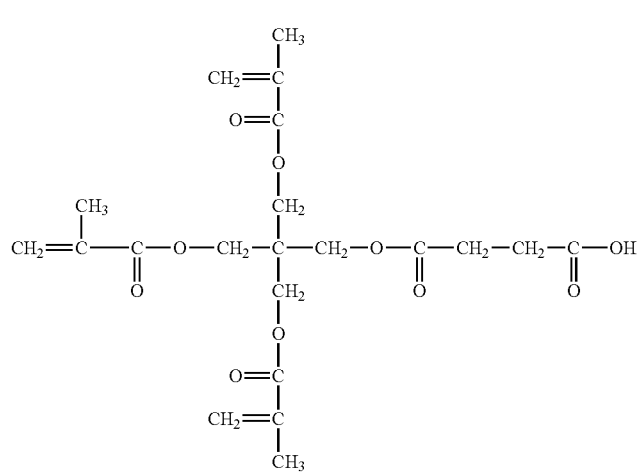
(9)
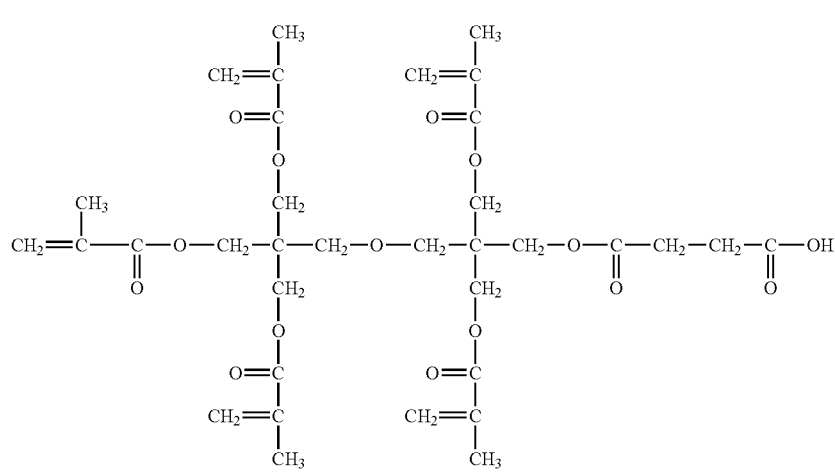
(10)

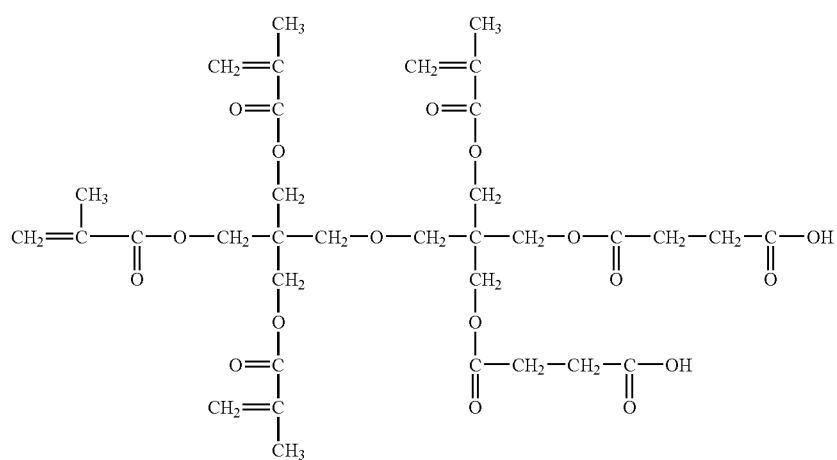
(11)
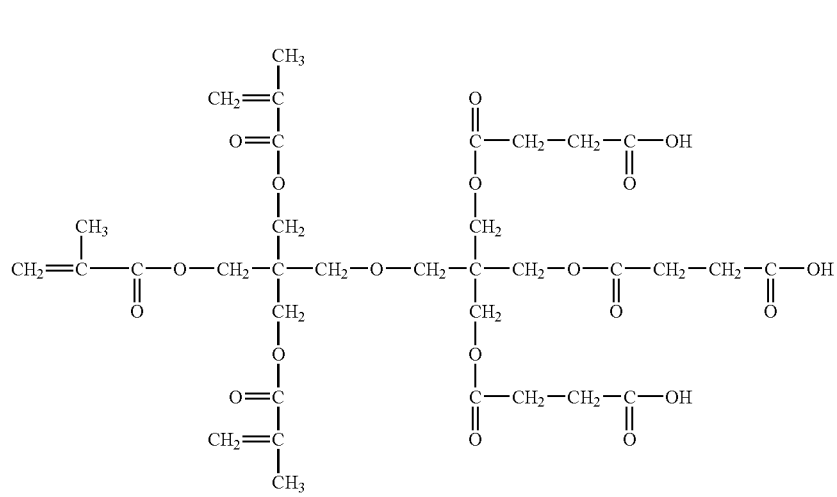
(12)
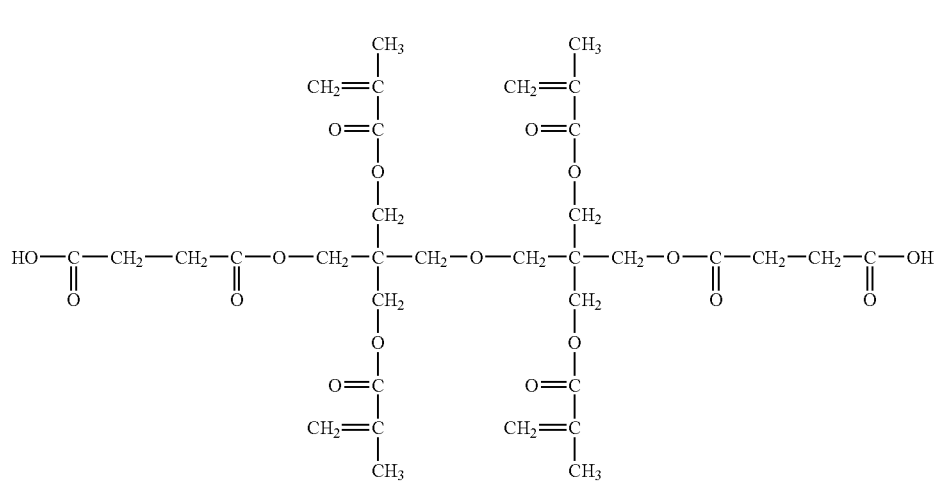
(13)

(14)

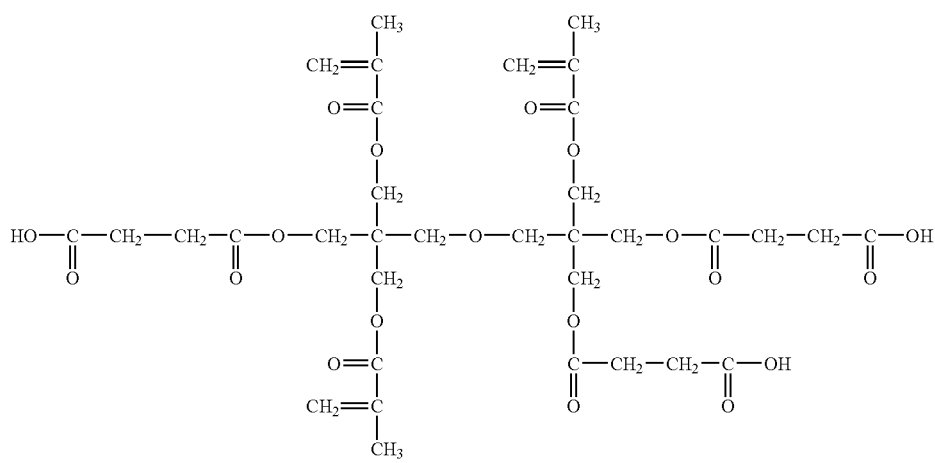

Examples of commercially available products of the specific photocurable compounds represented by formula (1) and (2) include a carboxyl group-containing trifunctional acrylate compound, TO-756, and a carboxyl group-containing pentafunctional acrylate compound, TO-1382, manufactured by Toagosei Co., Ltd.

It is also preferable that the specific photocurable compound according to the invention is at least one selected from the group consisting of compounds represented by the following formulas (i) and (ii).

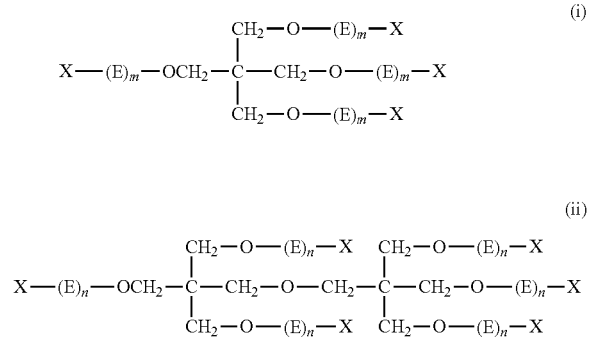

In the formulas (i) and (ii), E each independently represents $-((CH_2)_yCH_2O)-$ or $-((CH_2)_yCH(CH_3)O)-$; y each independently represents an integer from 0 to 10; and X each independently represents an acryloyl group, a methacryloyl group, a hydrogen atom or a carboxyl group.

In the formula (i), the total number of acryloyl groups and methacryloyl groups is 3 or 4, and m each independently represents an integer from 0 to 10, while the sum of all the values of m is an integer from 0 to 40. However, if the sum of all the values of m is 0, any one of X is a carboxyl group.

In the formula (ii), the total number of acryloyl groups and methacryloyl groups is 5 or 6, and n each independently represents an integer from 0 to 10, while the sum of all the values of n is an integer from 0 to 60. However, if the sum of all the values of n is 0, any one of X is a carboxyl group.

In the formula (i), m is preferably an integer from 0 to 6, and more preferably an integer from 0 to 4. Furthermore, the sum of all the values of m is preferably an integer from 2 to 40, more preferably an integer from 2 to 16, and particularly preferably an integer from 4 to 8.

In the formula (ii), n is preferably an integer from 0 to 6, and more preferably an integer from 0 to 4. Furthermore, the sum of all the values of n is preferably an integer from 3 to 60, more preferably an integer from 3 to 24, and particularly preferably an integer from 6 to 12.

In addition, $-((CH_2)_yCH_2O)-$ or $-((CH_2)_yCH(CH_3)O)-$ in the formula (1) or formula (ii) is preferably in the configuration that the terminal on the oxygen atom side is bound to X.

The compounds represented by the formula (1) or (ii) may be used individually, or in combination of two or more species. In particular, in the formula (ii), a configuration in which all of the six X's are acryloyl groups.

The total content of the compound represented by formula (1) or (ii) in the specific photocurable compound is preferably 20% by mass or greater, and more preferably 50% by mass or greater.

The compound represented by the formula (i) or (ii) can be synthesized by a conventionally known process, which includes a process of binding an open ring skeleton of ethylene oxide or propylene oxide to pentaerythritol or dipentaerythritol by a ring-opening addition reaction, and a process of introducing a (meth)acryloyl group by reacting the terminal hydroxyl group of the open ring skeleton with, for example, (meth)acryloyl chloride. The respective processes are well known, and a person having ordinary skill in the art can easily synthesize the compound represented by formula (i) or (ii).

Among the compounds represented by the formulas (i) and (ii), a pentaerythritol derivative and/or a dipentaerythritol derivative is preferred.

Specifically, compounds represented by the following formulas (a) to (f) (hereinafter, may also be referred to as "exemplary compounds (a) to (f)") may be mentioned, and among them, the exemplary compounds (a), (b), (e) and (f) are preferred.

(a)

(Sum of all the values of n is 6)

(b)

(Sum of all the values of n is 12)

(c)

(Sum of all the values of n is 12)

(d)

(Sum of all the values of n is 6)

(e)

(Sum of all the values of m is 4)

(f)

(Sum of all the values of m is 12)

Examples of commercially available products of the specific photocurable compounds represented by formulas (i) and (ii) include a tetrafunctional acrylate compound having four ethyleneoxy chains, SR-494, manufactured by Sartomer Company, Inc., a hexafunctional acrylate compound having six pentyleneoxy chains, DPCA-60, manufactured by Nippon Kayaku Co., Ltd., a trifunctional acrylate having three isobutyleneoxy chains, TPA-330, and the like.

The colored photocurable composition of the invention may also contain another photopolymerizable compound having two or more photopolymerizable functional groups, in addition to the acidic polyfunctional photopolymerizable compound and/or the AO chain-containing polyfunctional photopolymerizable compound. While the acidic polyfunctional photopolymerizable compound and/or the AO chain-containing polyfunctional photopolymerizable compound enhance both the cross-linking density and the solubility in alkali, the "another photopolymerizable compound having two or more photopolymerizable functional groups" enhances the cross-linking density only. Thus, combining these makes it possible to adjust the cross-linking density and the solubility in alkali.

Examples of the "another photocurable compound having two or more photopolymerizable functional groups" include monofunctional acrylates or methacrylates such as polyethylene glycol mono(meth)acrylate, polypropylene glycol mono(meth)acrylate and phenoxyethyl (meth)acrylate; and polyfunctional acrylates or methacrylates such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol hexa(meth)acrylate, hexanediol (meth)acrylate, trimethylolpropane tri(acryloyloxypropyl)ether, tri(acryloyloxyethyl) isocyanurate, products obtained by adding ethylene oxide or propylene oxide to a polyfunctional alcohol such as glycerin or trimethylolethane, and then converting the resultant to a (meth)acrylate compound, urethane acrylates such as those described in Japanese Patent Application Publication (JP-B) Nos. 48-41708 and 50-6034, JP-A No. 51-37193 and the like, polyester acrylates described in JP-A No. 48-64183, JP-B Nos. 49-43191 and 52-30490, and the like, and epoxy acrylates which are reaction products of epoxy resins and (meth)acrylic acid.

Furthermore, those introduced in Journal of the Adhesion Society of Japan, Vol. 20, No. 7 (p. 300-308) as photocurable monomers and oligomers, can also be used.

The content of the (D) polyfunctional photopolymerizable compound in the colored photocurable composition of the invention is preferably 2 to 50% by mass, more preferably 2 to 30% by mass, and even more preferably 2 to 15% by mass, based on the total solid content of the composition. When the content is within the above-mentioned range, the content of the pigment can be further increased without impairing the effects of the invention, and thus further thin and fine pattern can be obtained.

The content ratio of the (A) dispersion resin having an unsaturation equivalent of less than 600 (dispersion resin according to the invention) and the (D) polyfunctional photopolymerizable compound [A/D; mass ratio] is preferably 100/5 to 100/200, and more preferably 100/5 to 100/80, from the viewpoints of sensitivity and storage stability.

(E) Solvent

The colored photocurable composition of the invention can be composed using at least one solvent. When a solvent is used together with the (A) dispersion resin having an unsaturation equivalent of less than 600 and the (B) pigment, a colored photocurable composition having the pigment well dispersed can be prepared.

While the solvent is not particularly restricted so long as the solvent satisfies solubility of each component of the composition and application property of the colored photocurable composition, it is preferably selected by taking safety into consideration.

Specific examples of the preferable solvent include esters such as ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, 3-oxypropionic acid alkyl esters such as methyl 3-oxypropionate and ethyl 3-oxypropionate (for example, methyl 3-methoxypropionate, ethyl 3-mehtoxypropionate, methyl 3-ethoxypropionate and ethyl 3-ethoxypropionate), 2-oxypropionic acid alkyl esters such as methyl 2-oxypropionate, ethyl 2-oxypropionate, propyl 2-oxypropionate (for example, methyl 2-methoxypropionate, ethyl 2-methoxypropinate, propyl 2-methoxypropionate, methyl 2-ethoxypropionate, ethyl 2-ethoxypropionate, methyl 2-oxy-2-methyl propionate, ethyl 2-oxy-2-methylpropionate, methyl 2-methoxy-2-methylpropionate and ethyl 2-ethoxy-2-methylpropionate), methyl pyruvate, ethyl pyruvate, propyl pyruvate; methyl acetoacetate; ethyl acetoacetate, methyl 2-oxobutanate and ethyl 2-oxobutanate;

ethers such as diethyleneglycol dimethylether, tetrahydrofuran, ethyleneglycol monomethylether, ethyleneglycol monoethylether, methylcellosolve acetate, ethylcellosolve acetate, diethyleneglycol monomethylether, diethyleneglycol monoethylether, diethyleneglycol monobutylether, propyleneglycol methylether, propyleneglycol methylether acetate, propyleneglycol ethylether acetate, and propyleneglycol propylether acetate;

ketones such as methylethyl ketone, cyclohexanone, 2-heptanone and 3-heptanone;

and aromatic hydrocarbons such as toluene and xylene.

Among them, more preferable examples include methyl 3-ethoxypropionate, ethyl 3-ethoxypropionate, ethylcellosolve acetate, ethyl lactate, diethyleneglycol dimethylether, butyl acetate, methyl 3-methoxypropionate, 2-heptanone, cyclohexanone, ethylcarbitol acetate, butylcarbitol acetate, propyleneglycol methylether and propyleneglycol monomethylether acetate (PGMEA).

The proportion occupied by the solvent in the colored photocurable composition is preferably 20 to 95% by mass, and more preferably 25 to 90% by mass. When the amount of the solvent is within the above-described range, dispersion of the pigment may be uniformly performed, and it is also advantageous in terms of dispersion stability after dispersion.

Next, further components that may be also used in the colored photocurable composition of the invention (hereinafter referred to as a "curable composition" or a "colored photocurable composition" in some cases) will be illustrated.

(F) Sensitizing Agent

The colored photocurable composition of the invention may also include a (F) sensitizing agent, for the purpose of improving the efficiency of radical generation by the (C) photopolymerization initiator, and shifting the exposure wavelength to a longer wavelength. As for the sensitizing agent that may be used for the invention, a sensitizing agent which sensitizes the (C) photopolymerization initiator by means of an electron transfer mechanism or an energy transfer mechanism, is preferable.

The sensitizing agent that may be used for the invention may be a sensitizing agent which belongs to the compound families listed below and has an absorption wavelength in the wavelength region of 300 nm to 450 nm.

Preferred examples of the sensitizing agent include those belonging to the following compound families and having an absorption wavelength in the region of 330 nm to 450 nm.

Examples include polynuclear aromatic compounds (e.g. phenanthrene, anthracene, pyrene, perylene, triphenylene, 9,10-dialkoxyanthracene), xanthenes (e.g. fluorescein, eosine, erythrosine, rhodamine B, rosebengal), thioxanthones (isopropylthioxanthone, diethylthioxanthone, chlorothioxanthone), cyanines (e.g. thiacarbocyanine, oxacarbocyanine), merocyanines (e.g. merocyanine, carbo merocyanine), phthalocyanines, thiazines (e.g. thionine, methylene blue, toluidine blue), acridines (e.g. acridine orange, chloroflavin, acriflavine), anthraquinones (e.g. anthraquinone), squaliums (e.g. squalium), acridine orange, coumarins (e.g. 7-diethylamino-4-methylcoumarin), ketocoumarin, phenothiazines, phenazines, styrylbenzenes, azo compound, diphenylmethane, triphenylmethane, distyrylbenzenes, carbazoles, porphyrin, spiro compound, quinacridone, indigo, styryl, pyrylium compound, pyromethene compound, pyrazolotriazole compound, benzothiazole compound, barbituric acid derivative, thiobarbituric acid derivative, acetophenone, benzophenone, thioxanthone, aromatic ketone compound such as Michler's ketone, and heterocycle compound such as N-aryloxazolidinone, and further examples include compounds described in EP No. 568,993, U.S. Pat. Nos. 4,508,811, 5,227,227, JP-A No. 2001-125255, and JP-A No. 11-271969.

Examples of a more preferable sensitizer include compounds represented by the following formulae (i) to (iv).

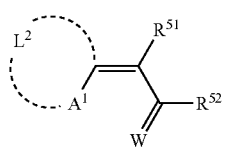
(i)

In the formula (1), $A^1$ represents a sulfur atom or $NR^{50}$, $R^{50}$ represents an alkyl group or an aryl group, $L^2$ represents a non-metal atomic group forming a basic nucleus of a dye together with adjacent $A^1$ and carbon atom, $R^{51}$ and $R^{52}$ each independently represent a hydrogen atom or a monovalent non-metal atomic group, $R^{51}$ and $R^{52}$ may be bonded to each other to form an acidic nucleus of a dye, and W represents an oxygen atom or a sulfur atom.

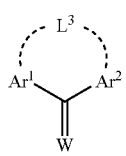
(ii)

In the formula (ii), $Ar^1$ and $Ar^2$ each independently represent an aryl group, and are connected via a bond by $-L^3-$, wherein $L^3$ represents $-O-$ or $-S-$. W is as defined in the formula (1).

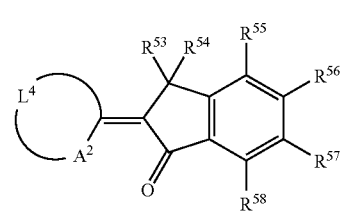
(iii)

In the formula (iii), $A^2$ represents a sulfur atom or $NR^{59}$, $L^4$ represents a non-metal atomic group forming a basic nucleus of a dye together with adjacent $A^2$ and carbon atom, $R^{53}$, $R^{54}$, $R^{55}$, $R^{56}$, $R^{57}$ and $R^{58}$ each independently represent a monovalent non-metal atomic group, and $R^{59}$ represents an alkyl group or an aryl group.

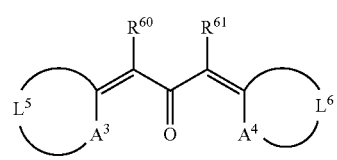
(iv)

In the formula (iv), $A^3$ and $A^4$ each independently represent $-S-$ or $-NR^{62}-$ or $-NR^{63}-$, $R^{62}$ and $R^{63}$ each independently represent a substituted or unsubstituted alkyl group, or a substituted or unsubstituted aryl group, $L^5$ and $L^6$ each independently represent a non-metal atomic group forming a basic nucleus of a dye together with adjacent $A^3$ or $A^4$ and an adjacent carbon atom, and $R^{60}$ and $R^{61}$ each independently are a monovalent non-metal atomic group, or may be bonded to each other to form an aliphatic or aromatic ring.

In addition, examples of a preferable sensitizing agent, which can be contained in the colored photocurable composition of the invention, include at least one selected from compounds represented by the following formulae (IV) to (VI), in addition to the above-described components.

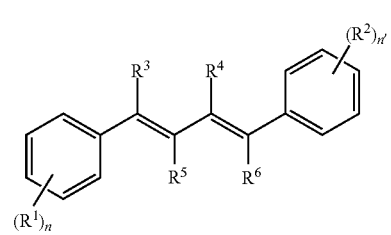
(IV)

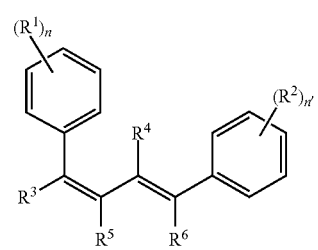
(V)

In the formula (IV) or the formula (V), $R^1$ and $R^2$ each independently represent a monovalent substituent, $R^3$, $R^4$, $R^5$ and $R^6$ each independently represent a hydrogen atom or a monovalent substituent, n denotes an integer of 0 to 5, and n' denotes an integer of 0 to 5, provided that n and n' do not represent 0 at the same time. When n is 2 or more, plural R's may be the same or different. When n' is 2 or more, plural $R^2$s may be the same or different.

The compound represented by the formula (IV) is preferably the compound represented by the following formula (IV-1) from a viewpoint of a sensitivity, and the coloring property when a pigment is contained.

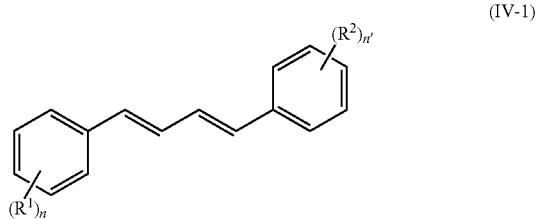

(IV-1)

In the formula (IV-1), $R^1$ and $R^2$ each independently represent a monovalent substituent, n denotes an integer of 0 to 5, and n' denotes an integer of 1 to 5. When n is 2 or more, plural R's may be the same or different and, when n' is 2 or more, plural $R^2$s may be the same or different.

In the formula (IV-1), the monovalent substituents represented by $R^1$ and $R^2$ have the same meaning as the monovalent substituents represented by $R^1$ and $R^2$ in the formula (IV), and a preferable range is similar.

The compound represented by the formula (IV) or the formula (V) has a molar extinction coefficient ε at a wavelength 365 nm of preferably 500 $mol^{-1} \cdot L \cdot cm^{-1}$ or more, ε at a wavelength 365 nm of more preferably 3000 $mol^{-1} \cdot L \cdot cm^{-1}$ or more, or ε at a wavelength 365 nm of most preferably 20000 $mol^{-1} \cdot L \cdot cm^{-1}$ or more. When a value of a molar extinction coefficient ε at each wavelength is in the above range, the effect of improving a sensitivity is high, being preferable from a viewpoint of the light absorption efficiency.

Herein, a molar extinction coefficient ε is obtained by using, as a sample, a dye solution prepared to a concentration of 0.01 g/l in a 1-methoxy-2-propanol solution, measuring a transmission spectrum of the sample at 365 nm, and obtaining an absorbance from a UV-visible absorption spectrum of the sample. As the measurement apparatus, UV-Vis-MR Spectrophotometer Cary5G-type spectrophotometer manufactured by Varian was used.

Preferable examples of the compound represented by the formula (IV) or the formula (V) are shown below, but not restricted to them.

In the present specification, a chemical formula is described by a simplified structural formula in some cases and, particularly, a solid line not expressly showing an element or a substituent represents a hydrocarbon group. In the following examples, Me represents a methyl group, Et represents an ethyl group, Bu represents a butyl group, n-Bu represents a n-butyl group, and Ph represents a phenyl group.

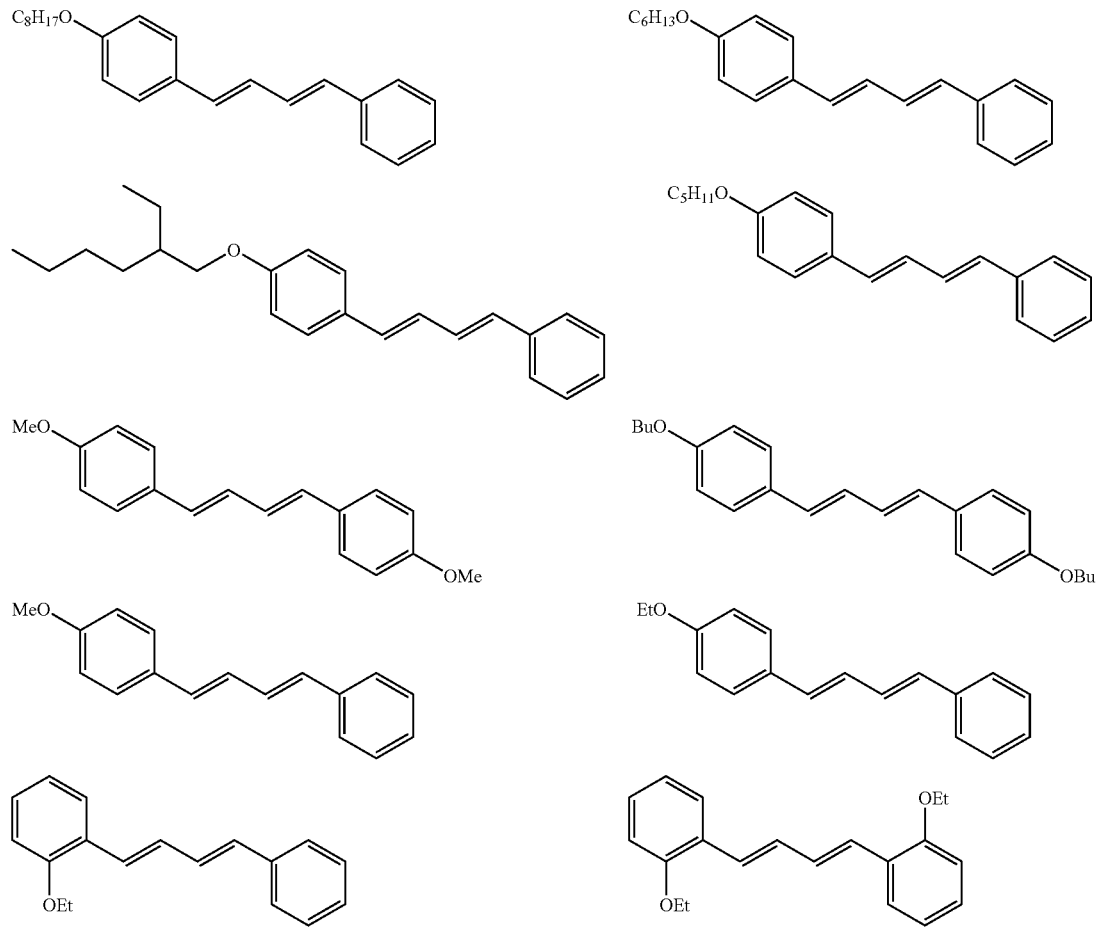

49
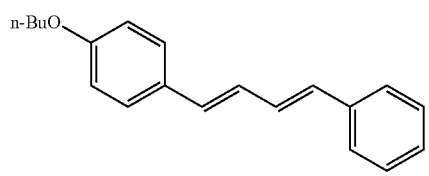
50
-continued
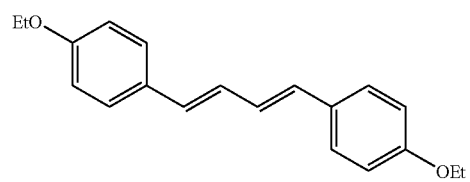
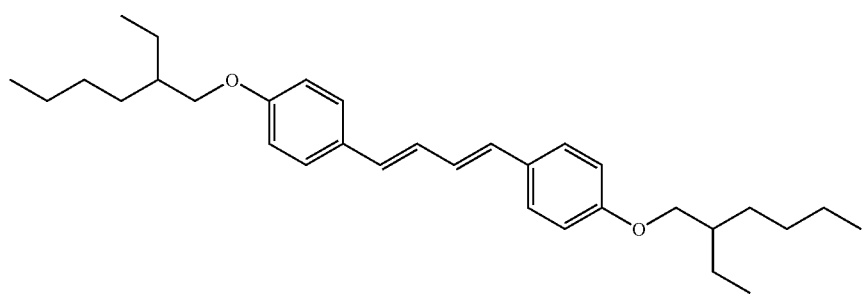
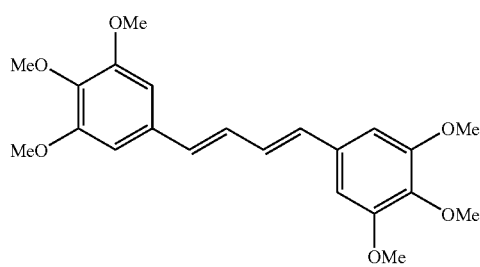
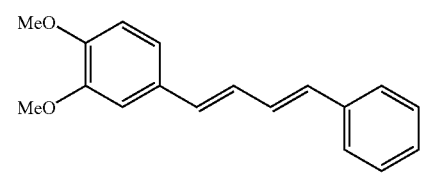
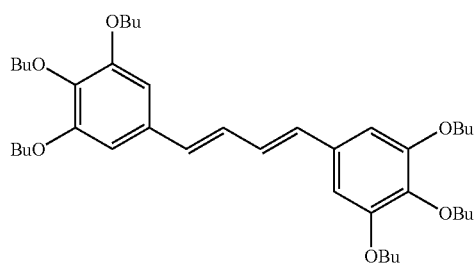
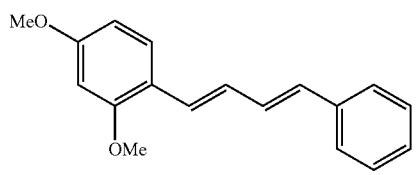
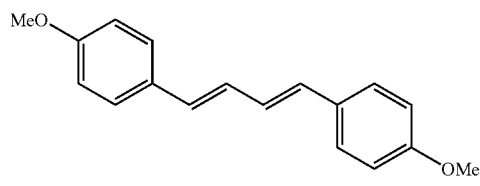
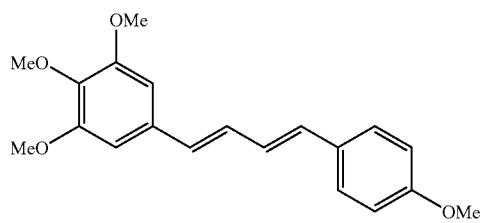
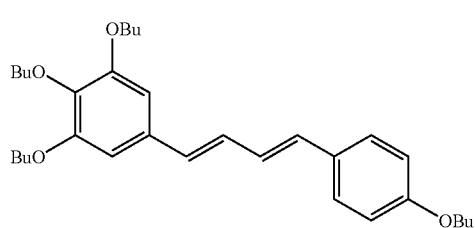
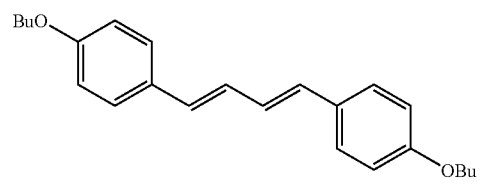
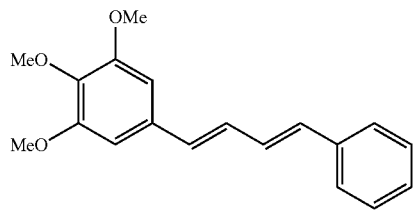
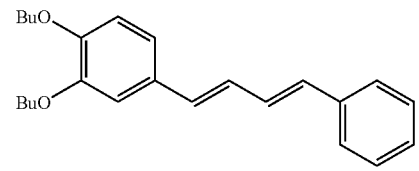

-continued
51
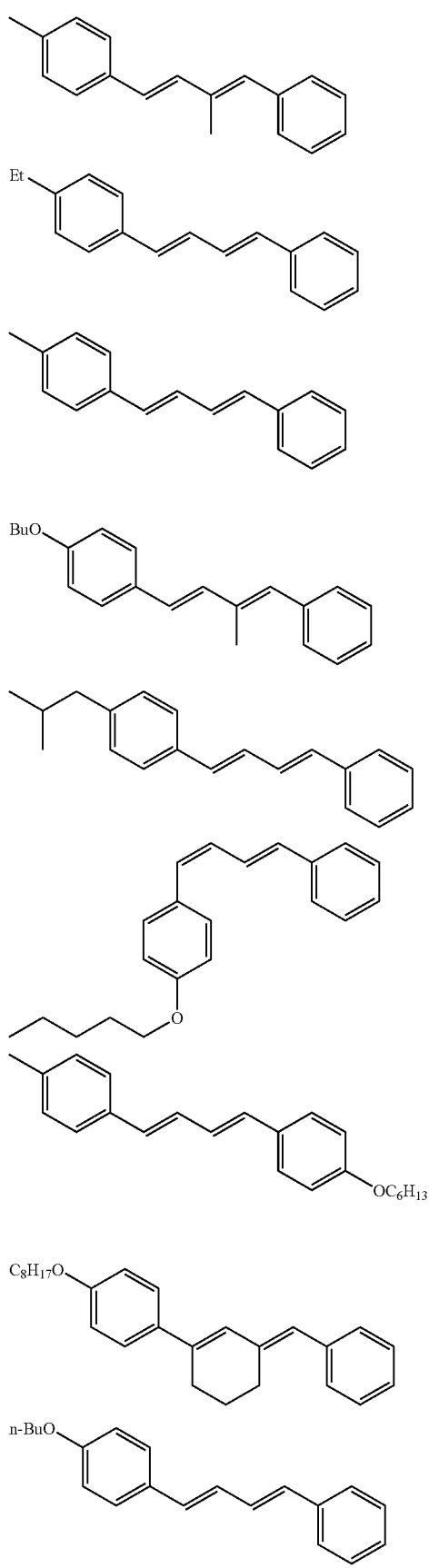
52
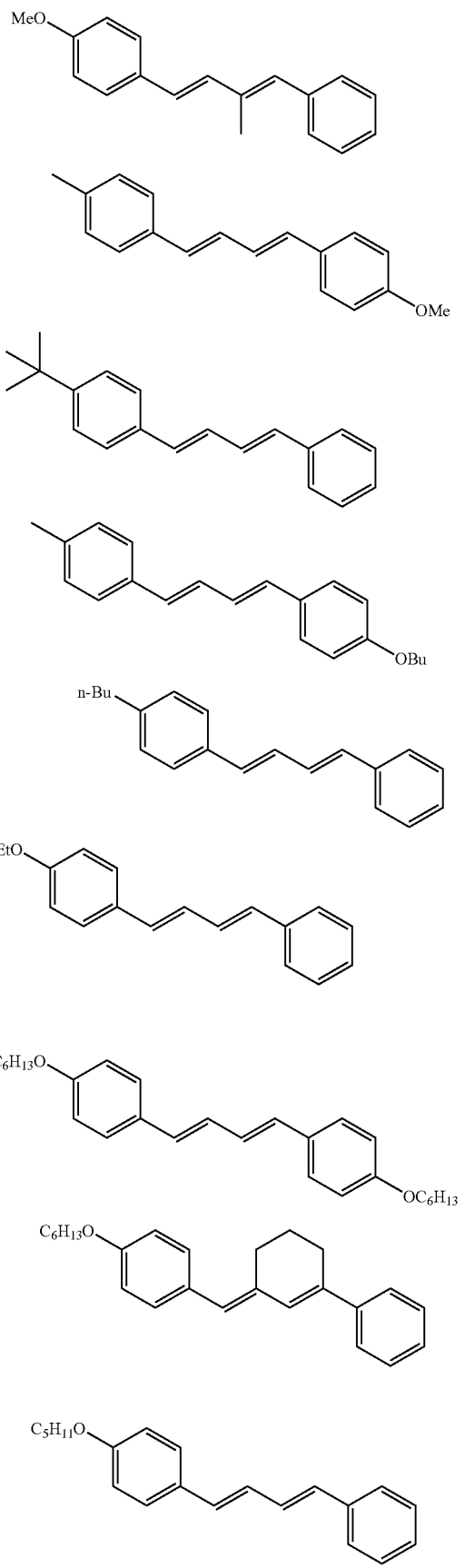

53 54
-continued
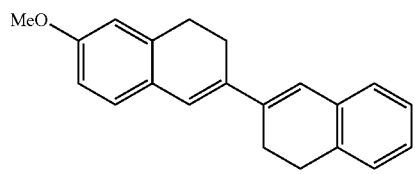
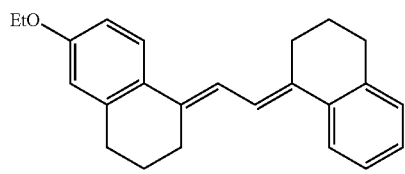
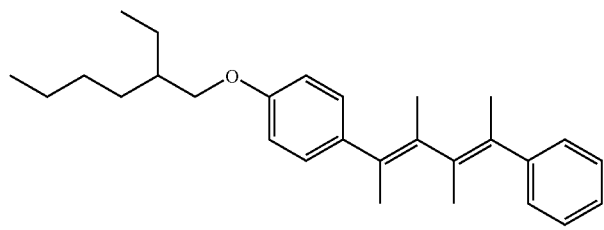
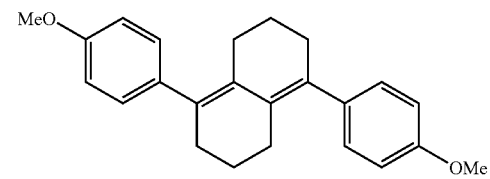
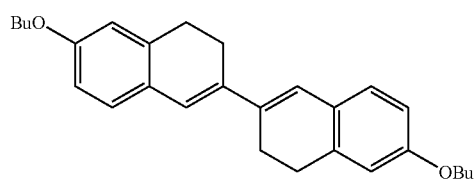
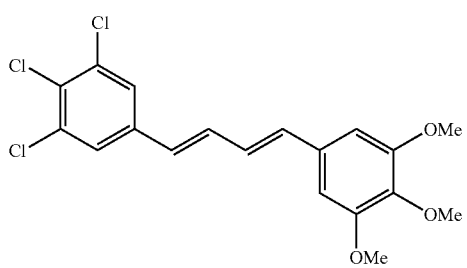
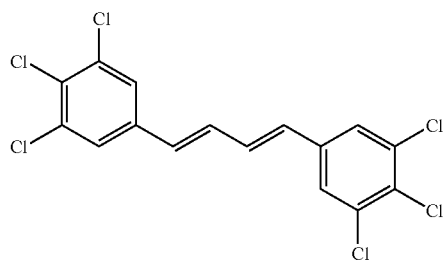
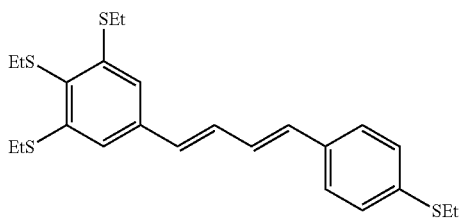
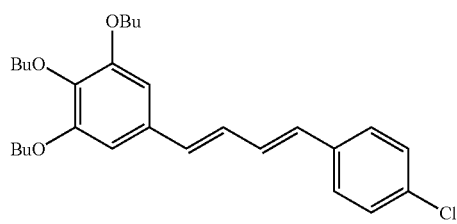
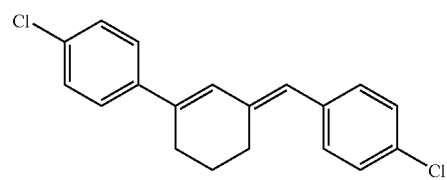
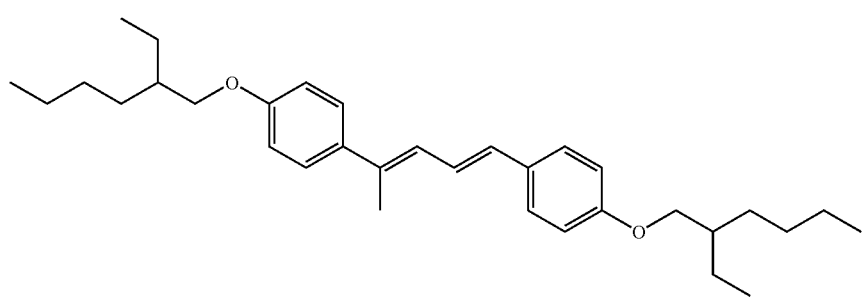
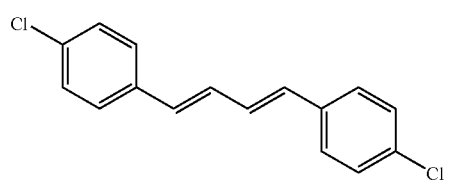

-continued
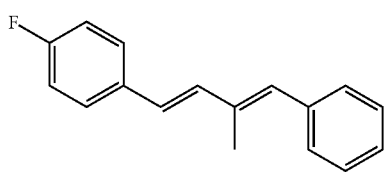
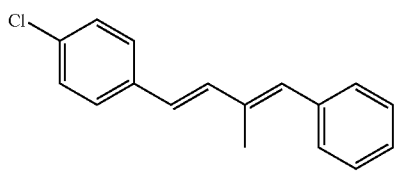
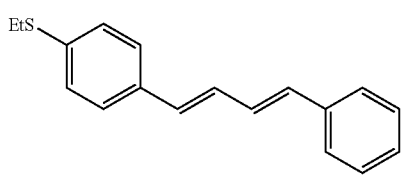
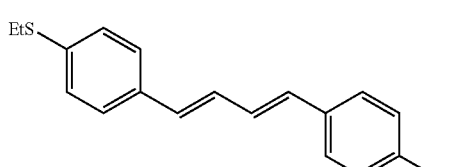
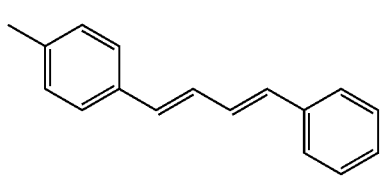
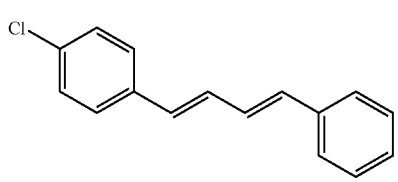
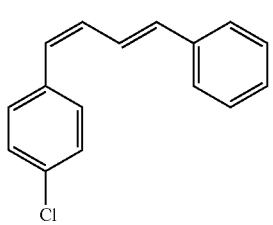
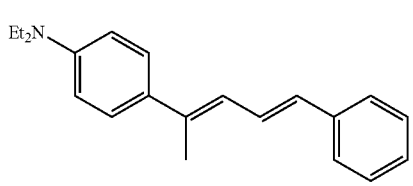
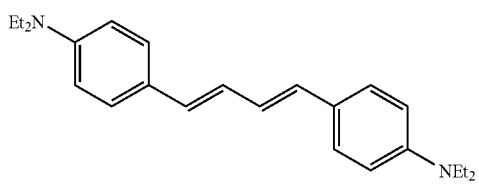
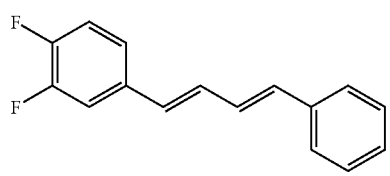
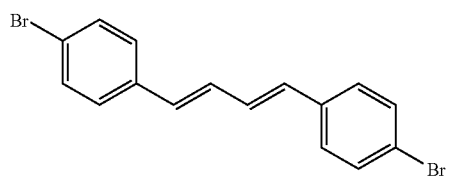
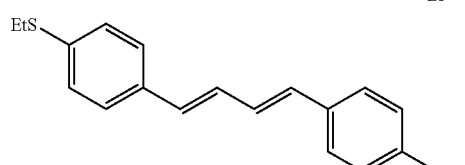
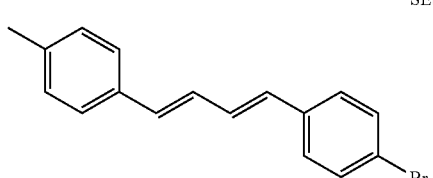
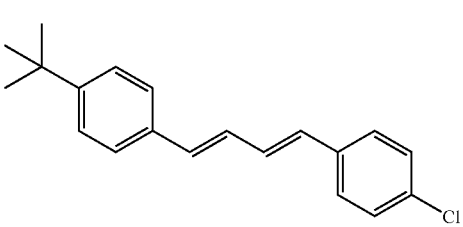
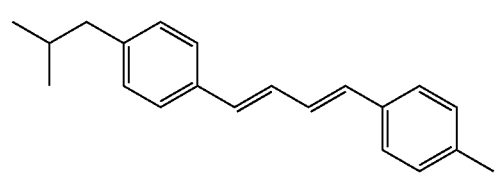
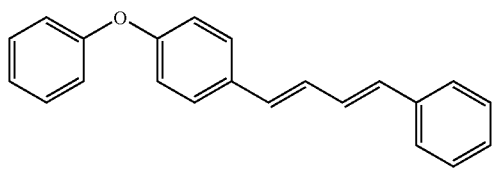
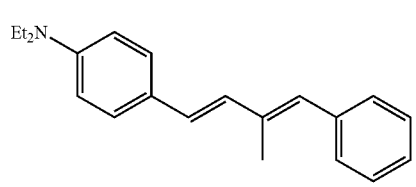
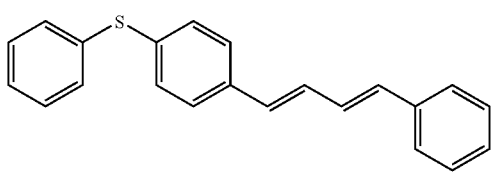

| 57 | 58 |
|---|---|
| 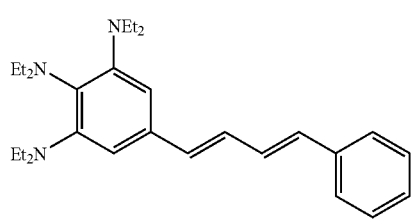 | 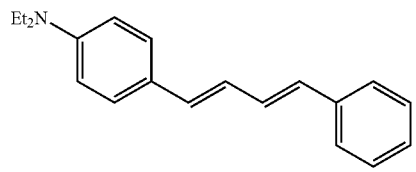 |
| 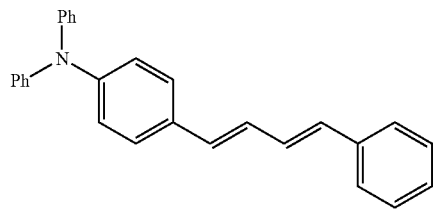 | 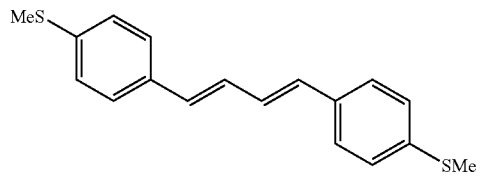 |
| |  |
| 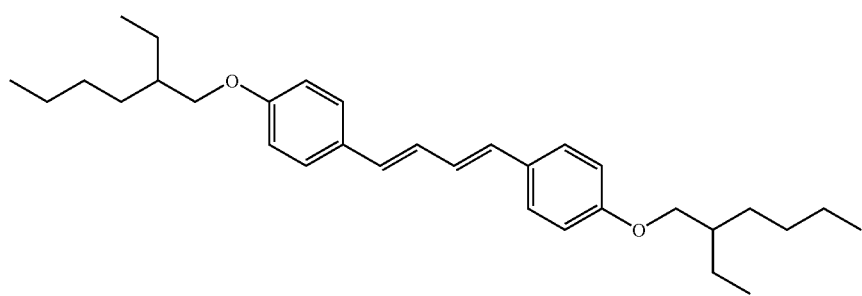 | |
| 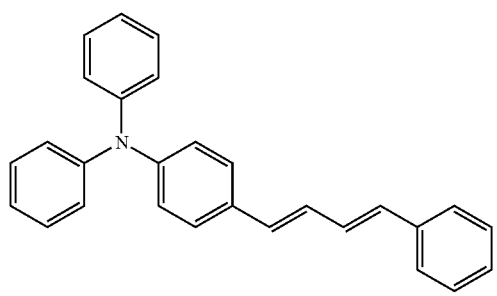 | 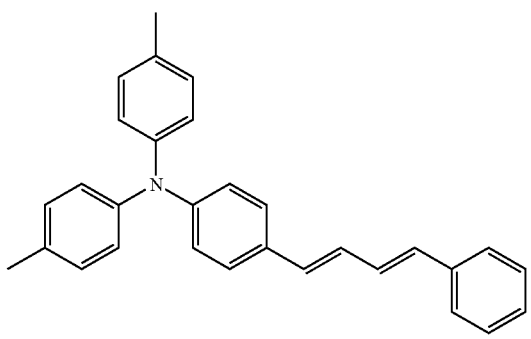 |
| 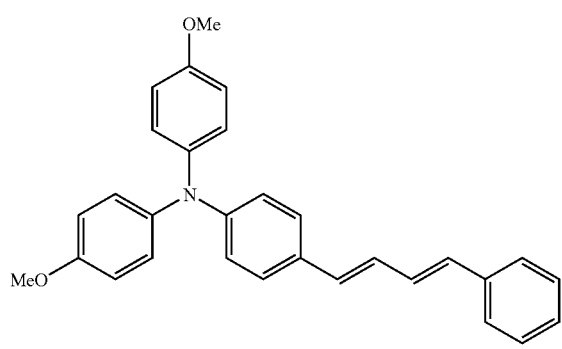 | 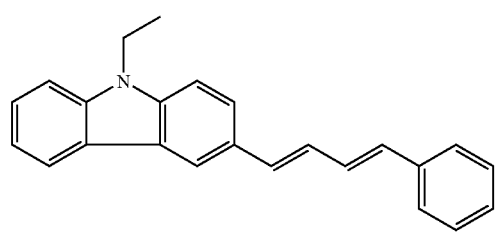 |

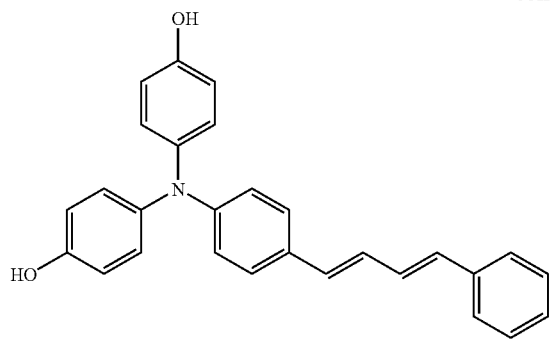
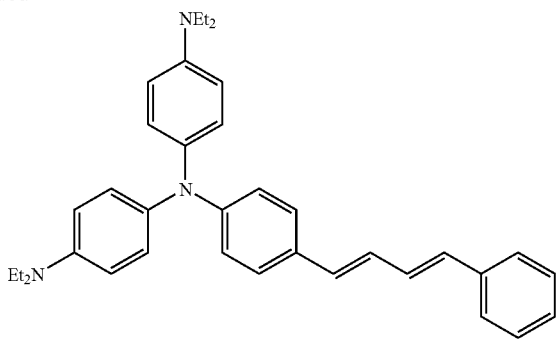
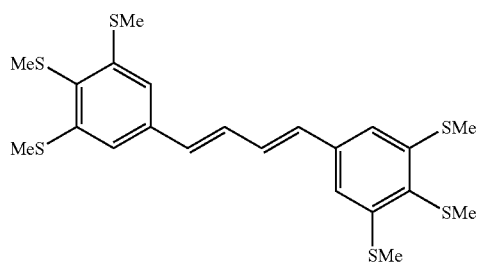
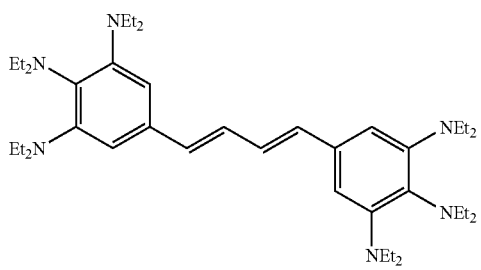
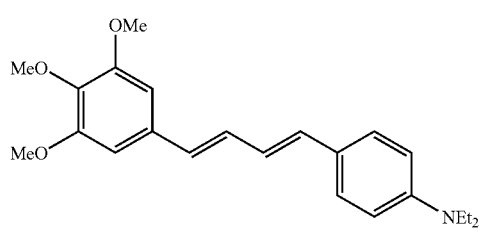
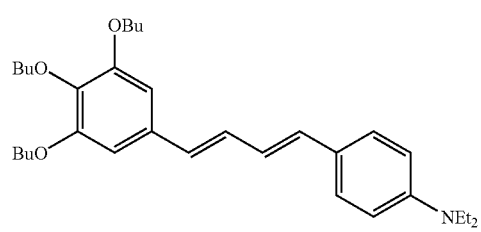
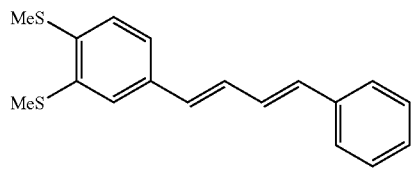
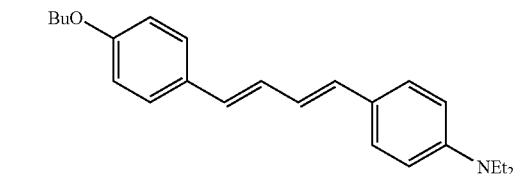
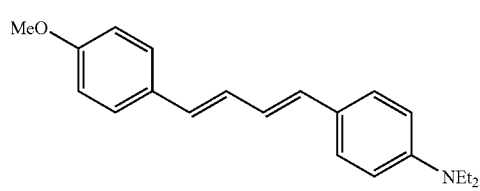
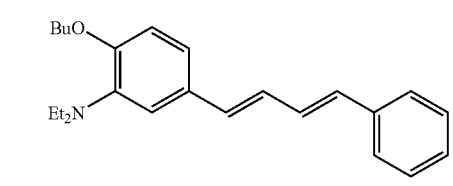
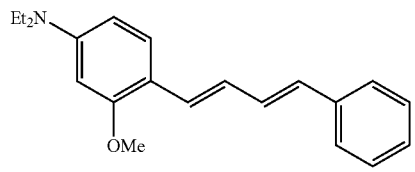
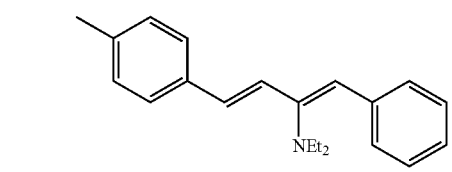
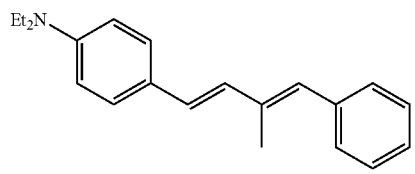
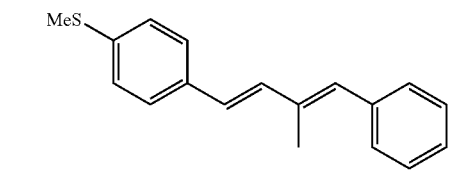
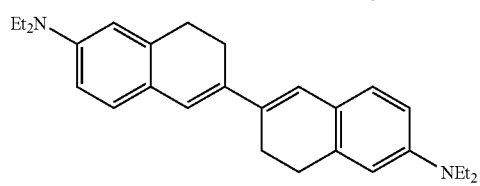
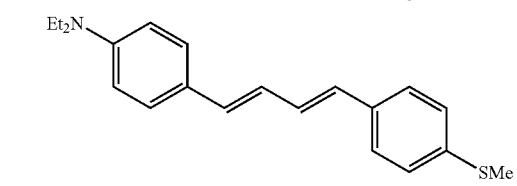

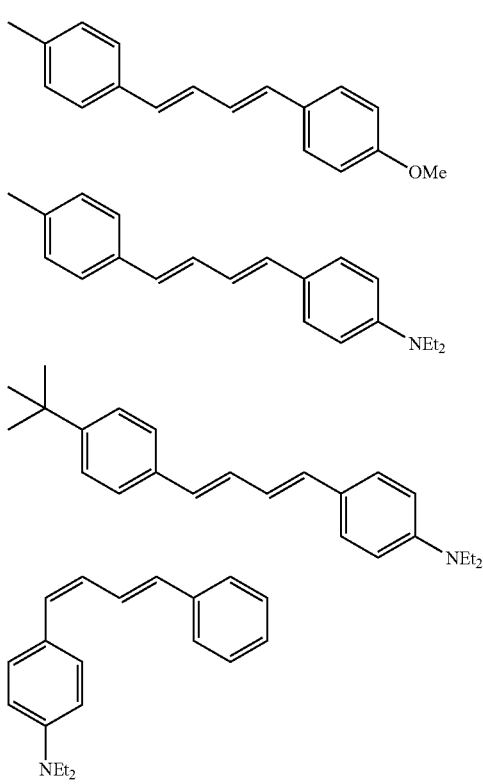
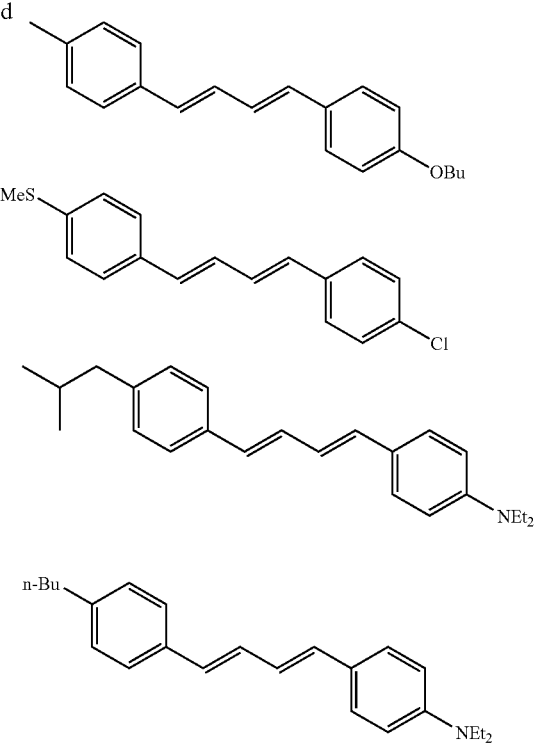
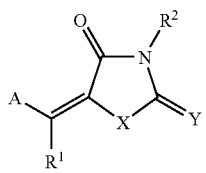

In the formula (VI), A represents an aromatic ring or heterocycle optionally having a substituent, X represents an oxygen atom, a sulfur atom, or —N(R$^3$)—, and Y represents an oxygen atom, a sulfur atom, or —N(R$^3$)—. R$^1$, R$^2$, and R$^3$ each independently represent a hydrogen atom or a monovalent non-metal atomic group, and A, R$^1$, R$^2$ and R$^3$ may be bonded to each other to form an aliphatic or aromatic ring.

In the formula (VI), R$^1$, R$^2$ and R$^3$ each independently represent a hydrogen atom, or a monovalent non-metal atom group. When R$^1$, R$^2$ and R$^3$ each represent a monovalent non-metal atom group, they are each preferably a substituted or unsubstituted alkyl group, a substituted or unsubstituted aryl group, a substituted or unsubstituted alkenyl group, a substituted or unsubstituted aromatic heterocyclic residue, a substituted or unsubstituted alkoxy group, a substituted or unsubstituted alkylthio group, a hydroxyl group, or a halogen atom.

In the compound represented by formula (VI), Y is preferably an oxygen atom or —N(R$^3$)—, from the viewpoint of improving the decomposition efficiency of the photopolymerization initiator. R$^3$ represents a hydrogen atom, or a monovalent non-metal atom group. Furthermore, Y is most preferably —N(R$^3$)—.

Hereinafter, preferred specific examples (VI1) to (VI124) of the compound represented by formula (VI) will be presented below, but the invention is not intended to be limited thereto. With respect to an isomer resulted from a double bond binding an acidic nucleus and a basic nucleus, the invention is not intended to be limited to any one of the isomers.

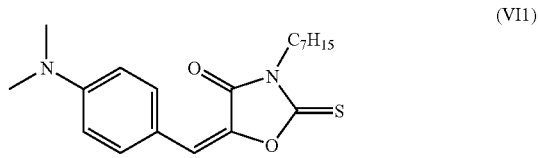

(VI1)

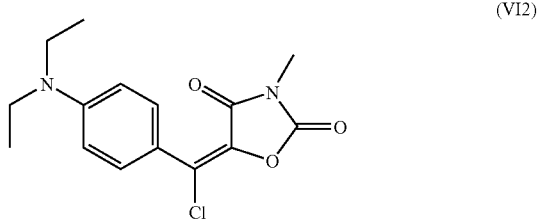

(VI2)

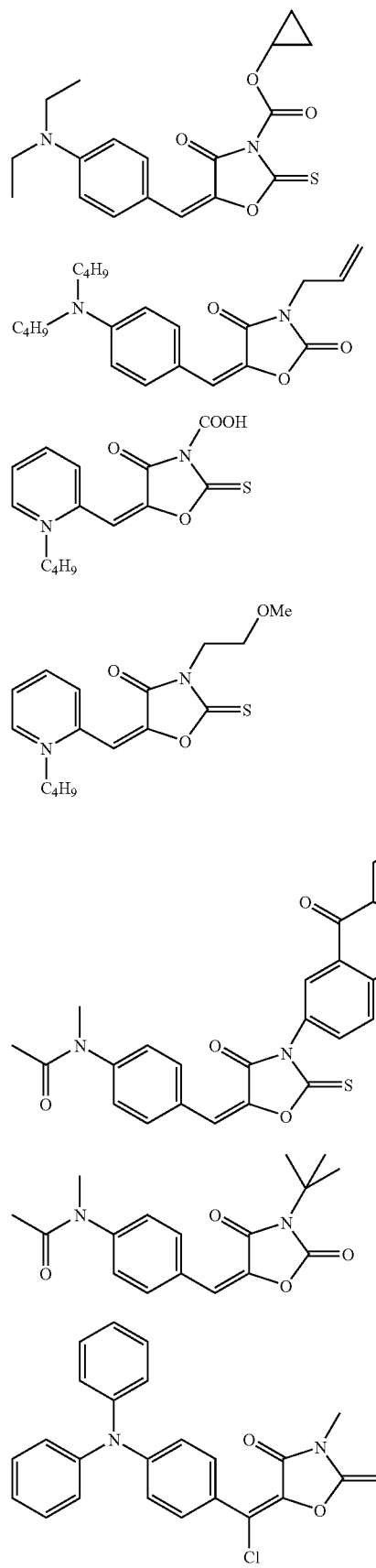
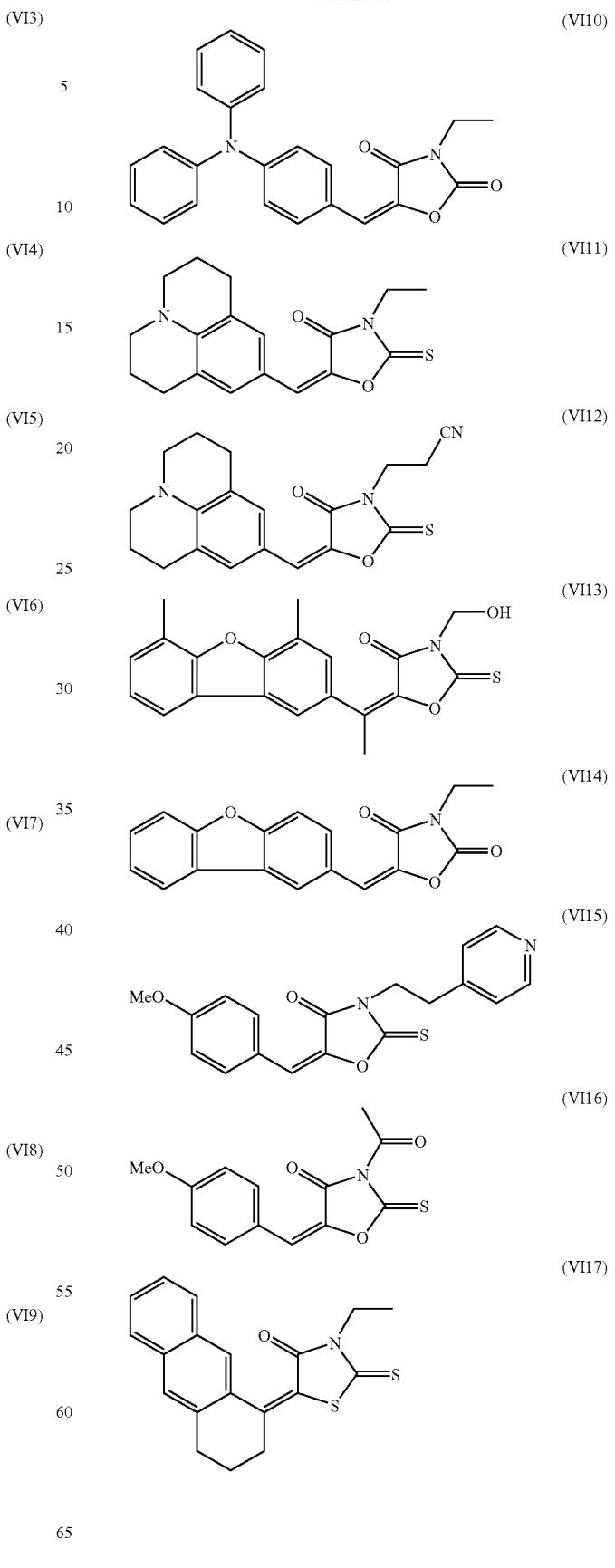

-continued
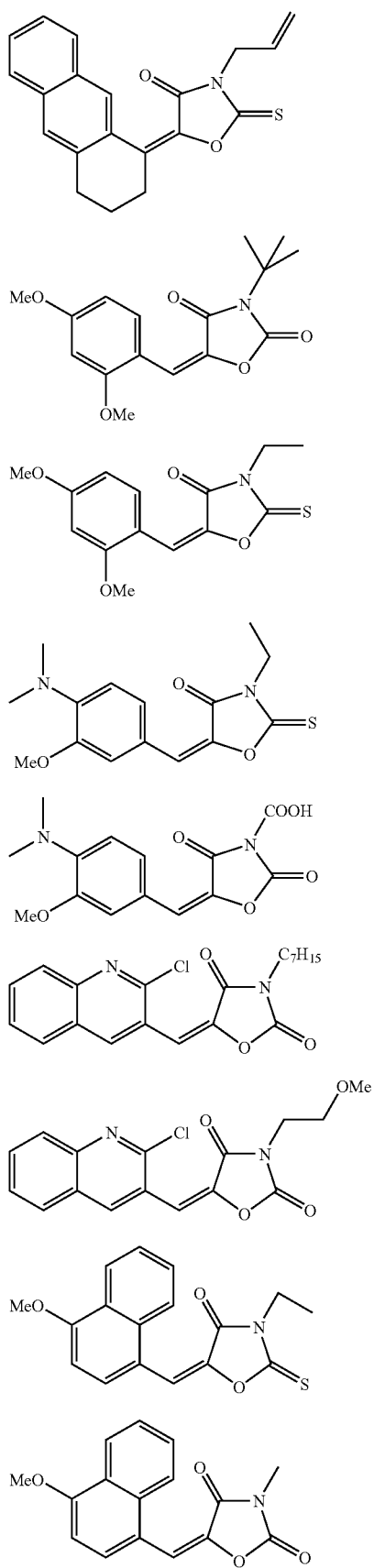
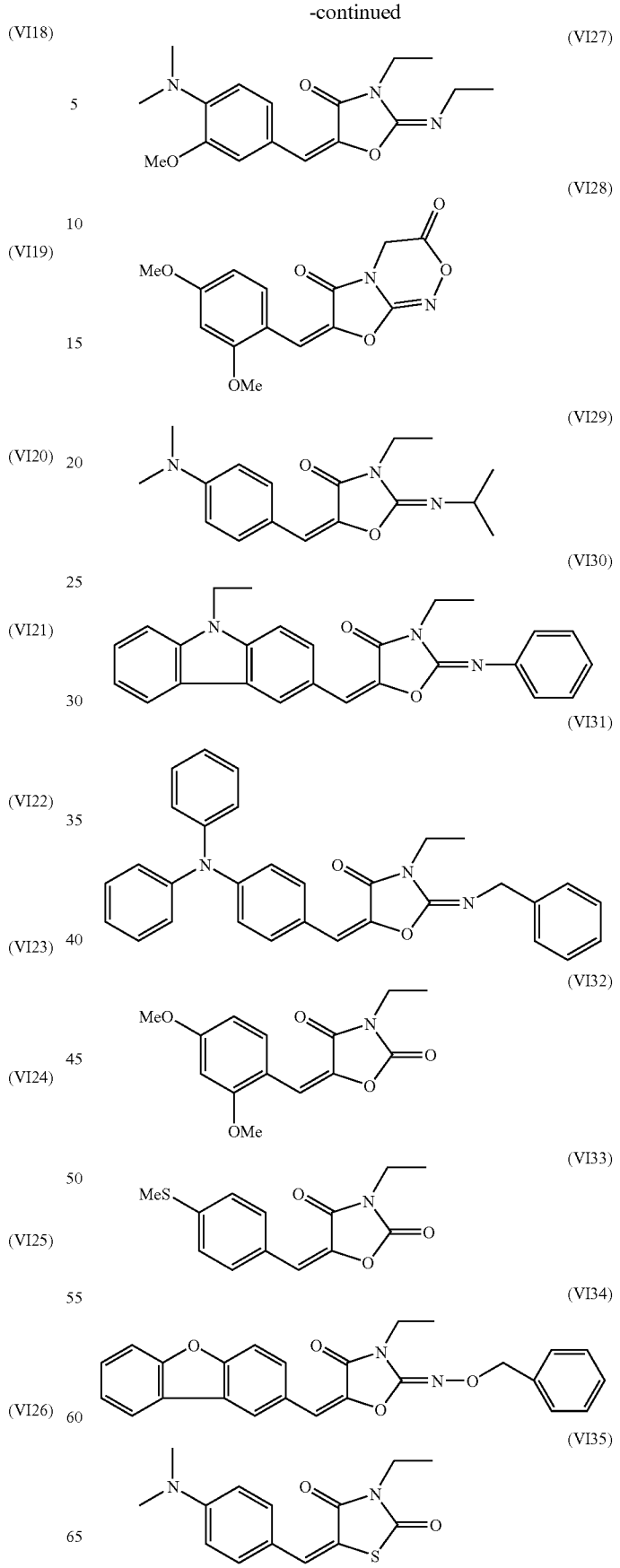

-continued (VI36)
(VI37)
(VI38)
(VI39)
(VI40)
(VI41)
(VI42)
(VI43)

-continued (VI44)
(VI45)
(VI46)
(VI47)
(VI48)
(VI49)
(VI50)

(VI51) 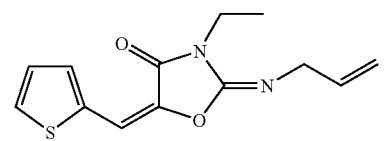
(VI52) 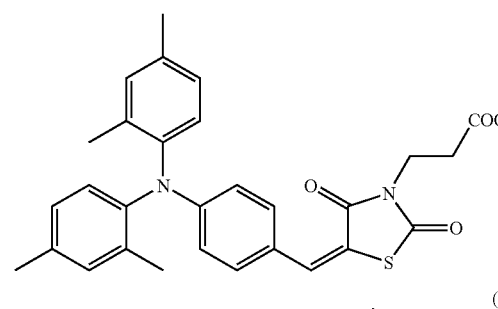
(VI53) 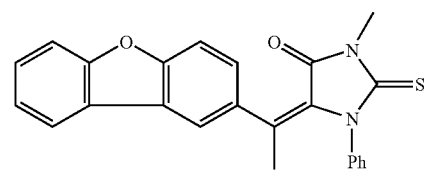
(VI54) 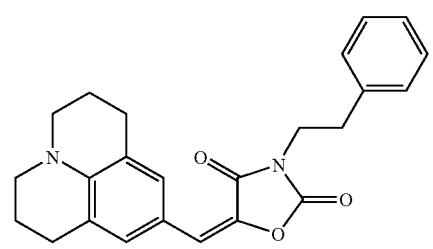
(VI55) 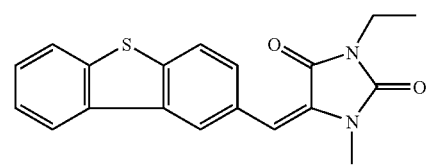
(VI56) 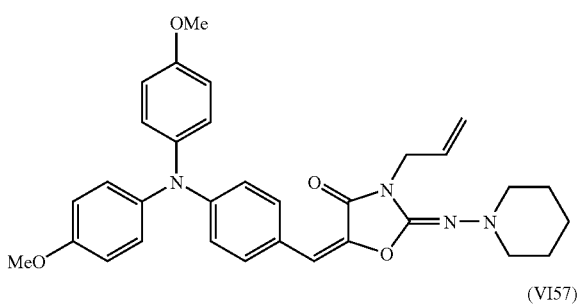
(VI57) 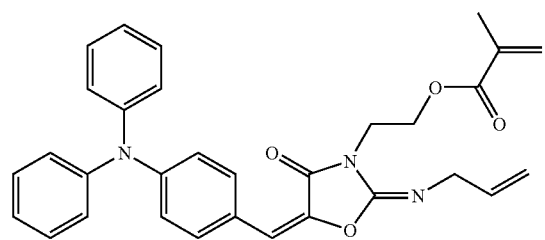
(VI58) 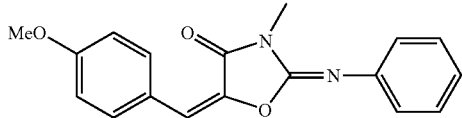
(VI59) 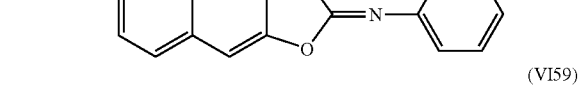
(VI60) 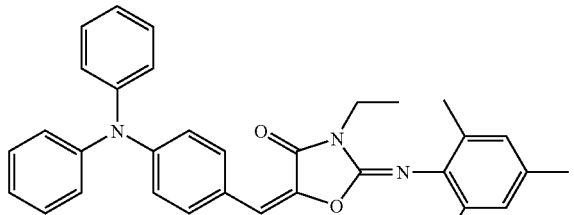
(VI61) 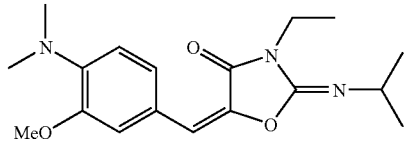
(VI62) 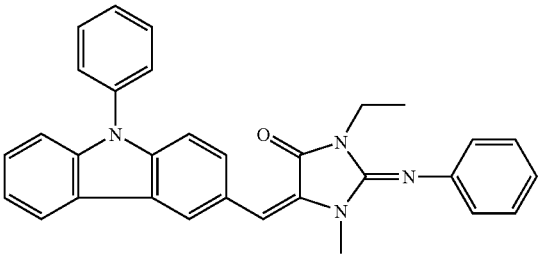
(VI63) 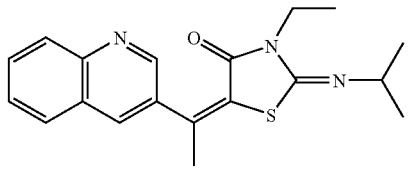
(VI64) 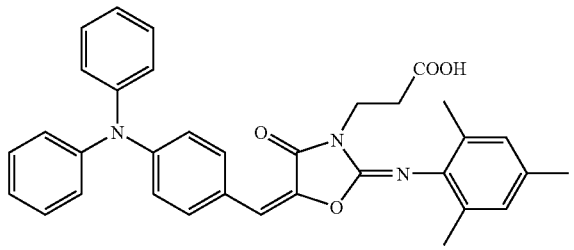
(VI65) 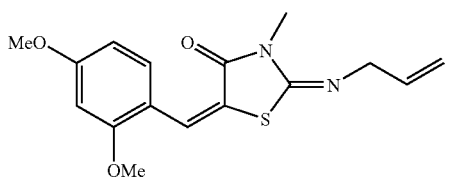
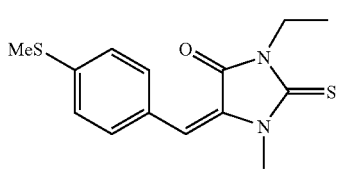

(VI66) 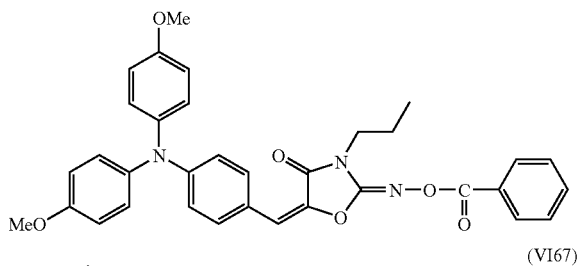
(VI67) 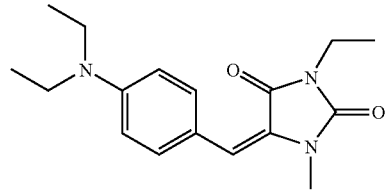
(VI68) 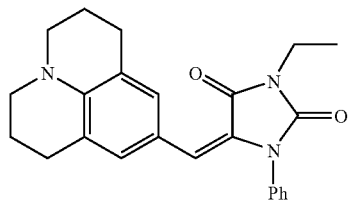
(VI69) 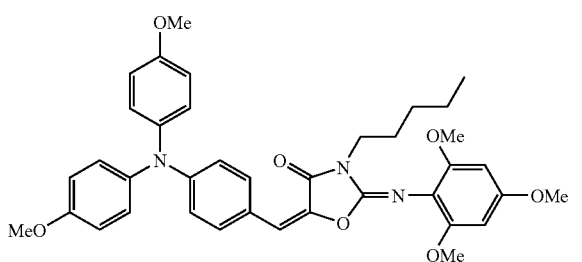
(VI70) 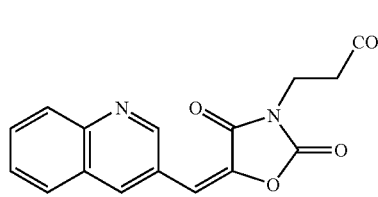
(VI71) 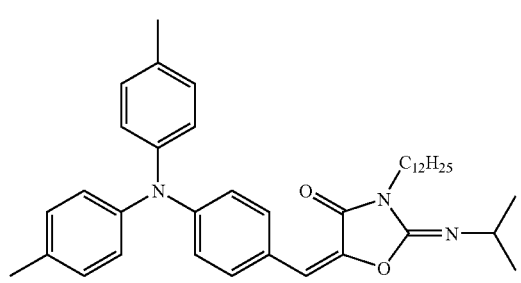
(VI72) 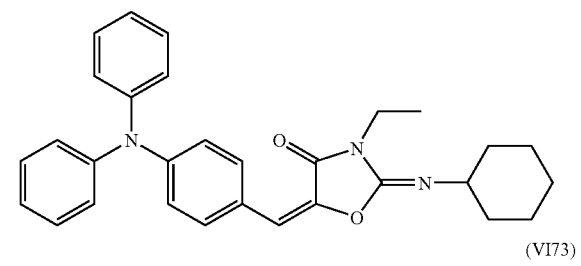
(VI73) 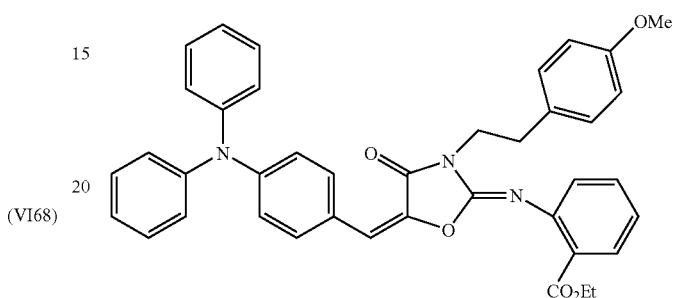
(VI74) 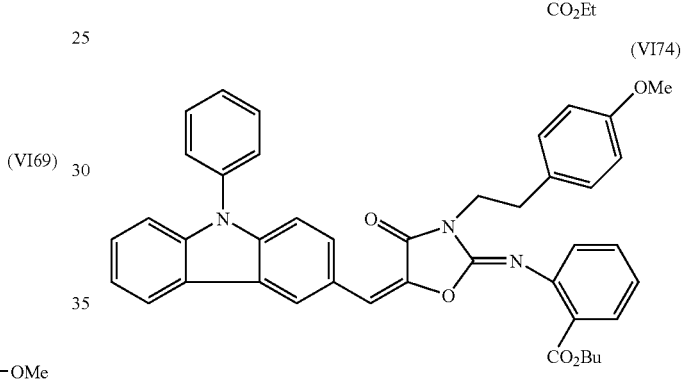
(VI75) 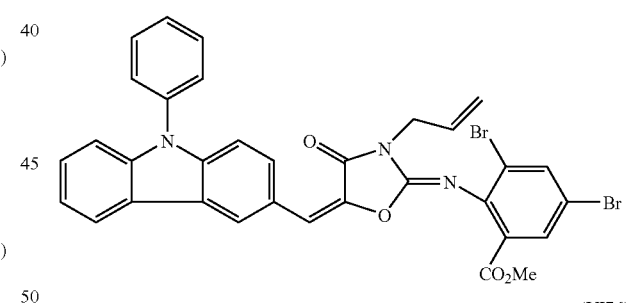
(VI76) 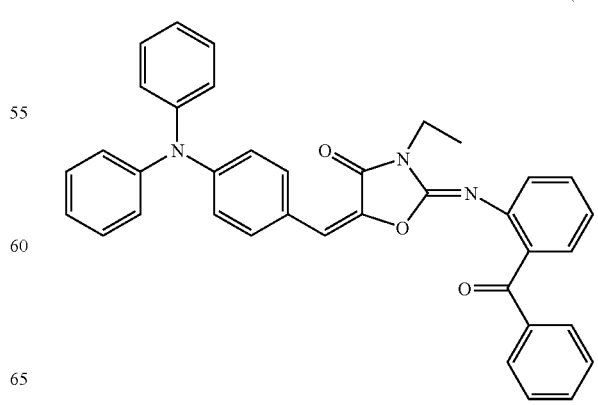

(VI77) 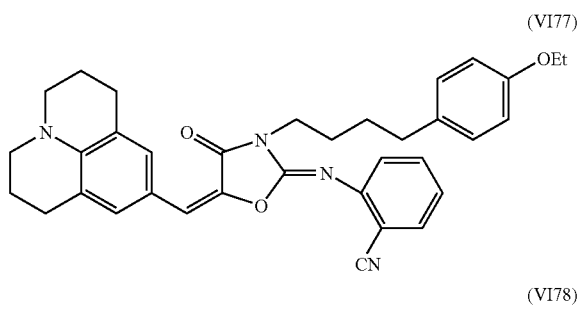
(VI78) 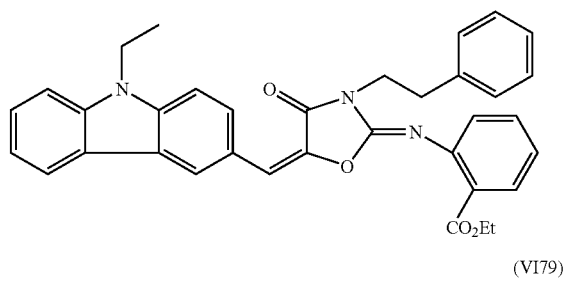
(VI79) 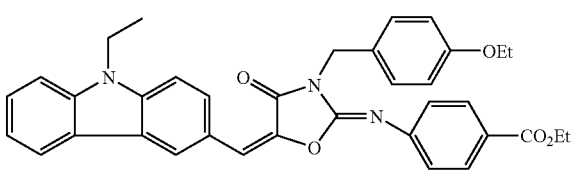
(VI80) 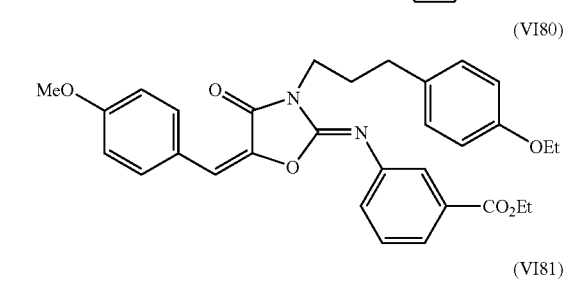
(VI81) 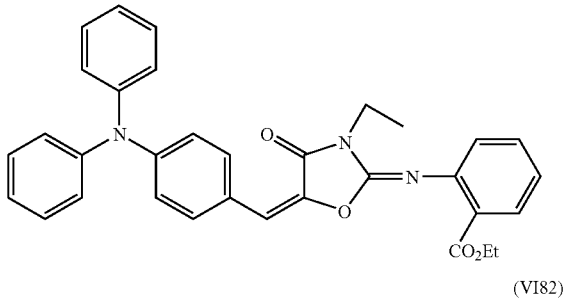
(VI82) 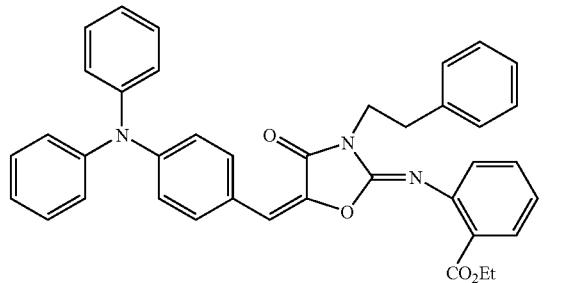
(VI83) 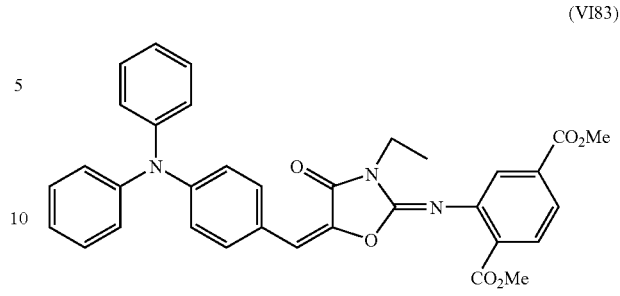
(VI84) 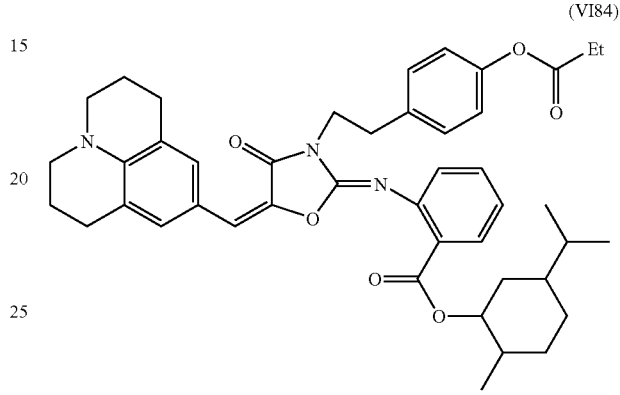
(VI85) 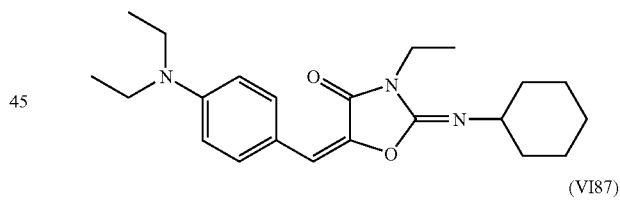
(VI86) 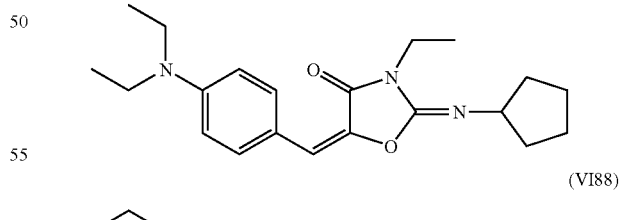
(VI87)
(VI88)

(VI89) 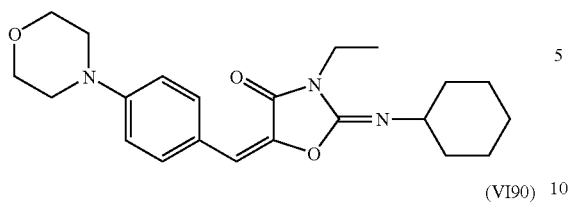
(VI90) 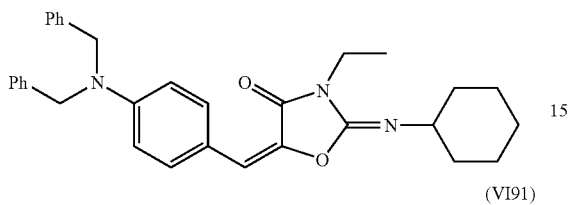
(VI91) 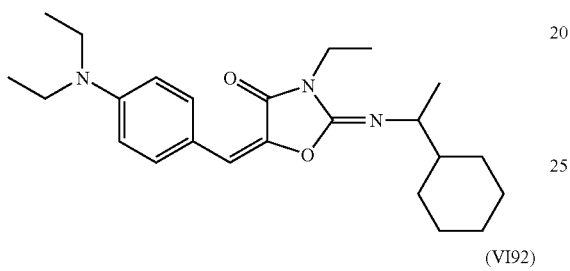
(VI92) 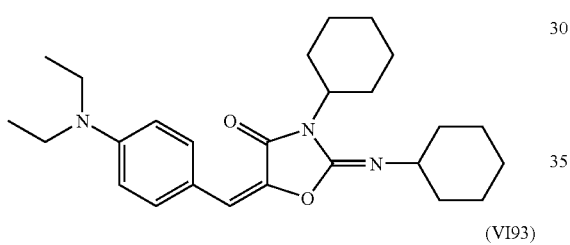
(VI93) 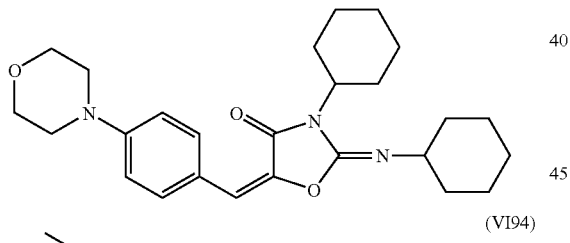
(VI94) 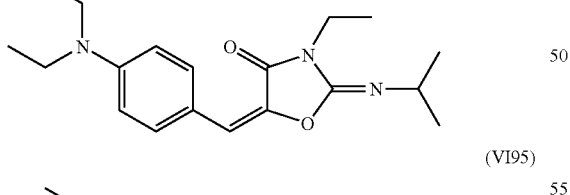
(VI95) 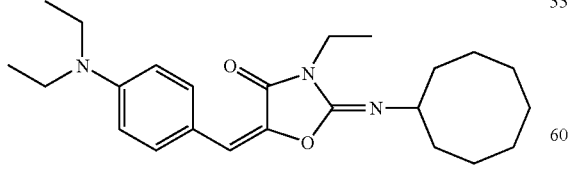
(VI96) 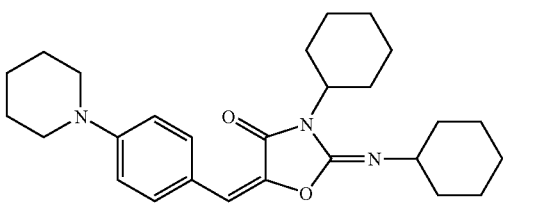
(VI97) 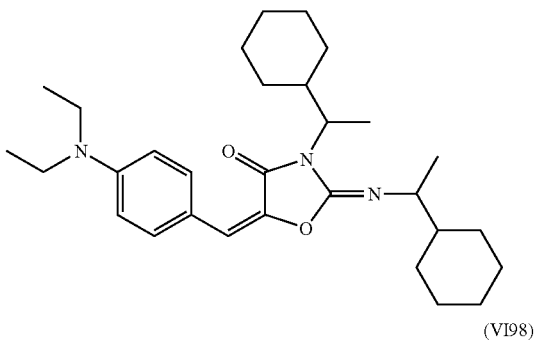
(VI98) 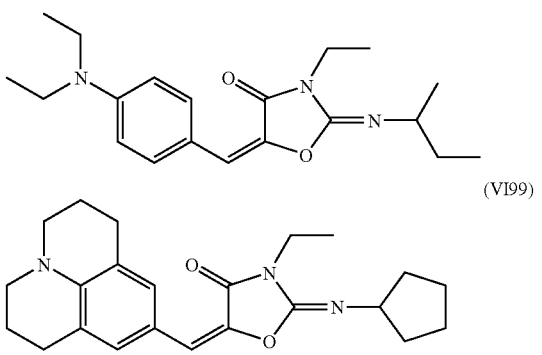
(VI99) 
(VI100) 
(VI101) 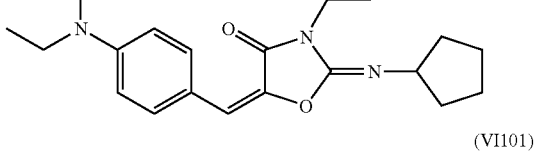
(VI102) 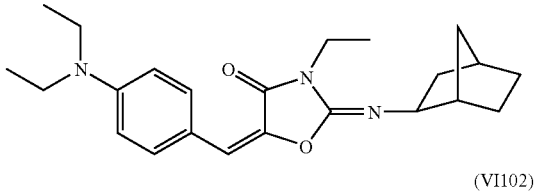

-continued
(VI103)
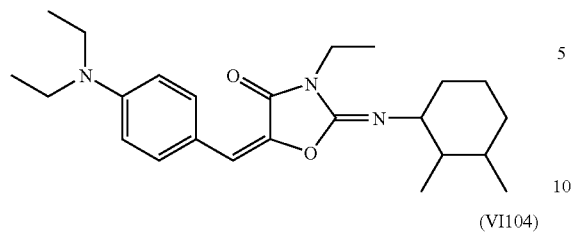
(VI104)
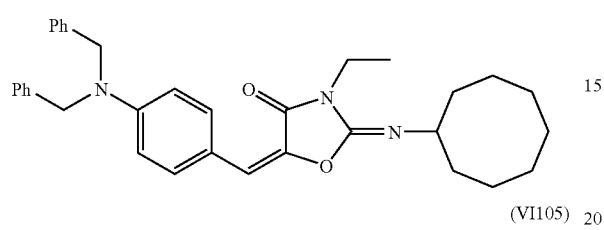
(VI105)
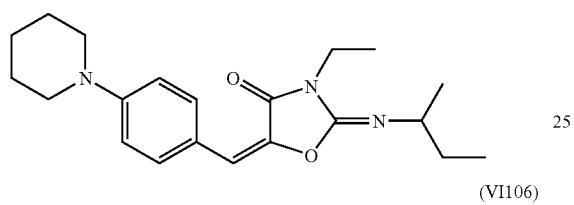
(VI106)
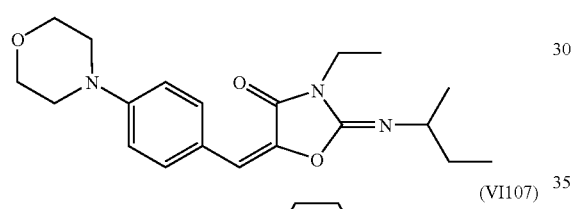
(VI107)
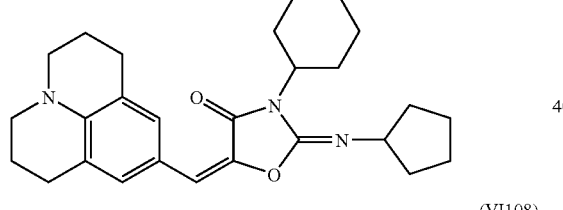
(VI108)
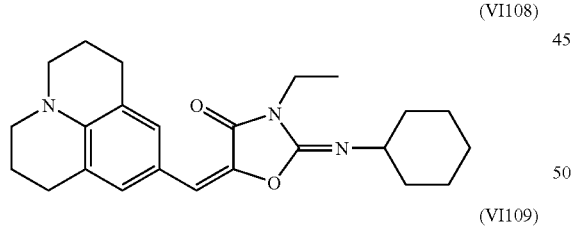
(VI109)
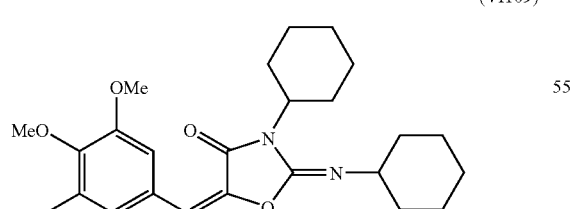
(VI110)
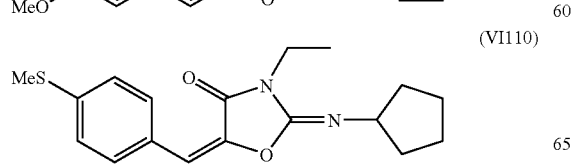
-continued
(VI111)
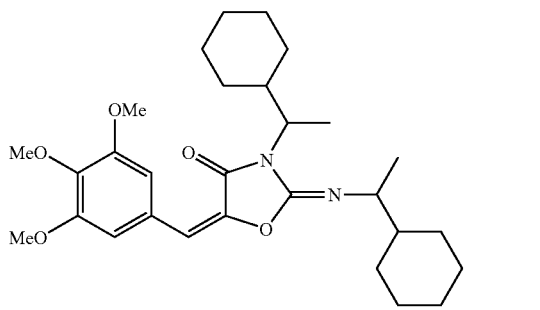
(VI112)
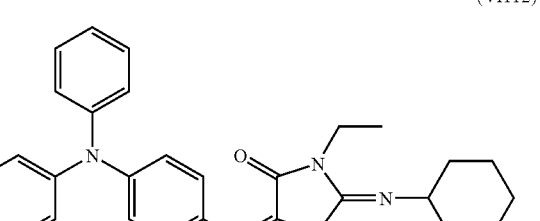
(VI113)
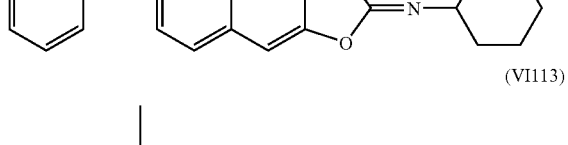
(VI114)
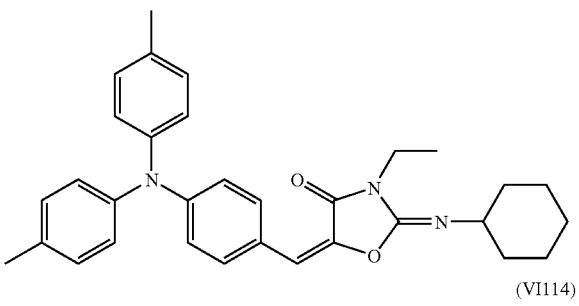
(VI115)
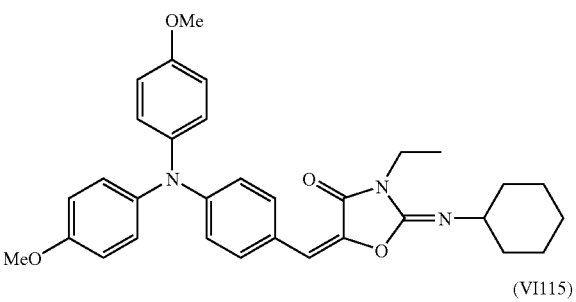
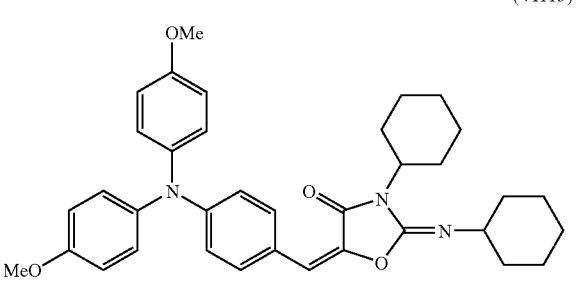

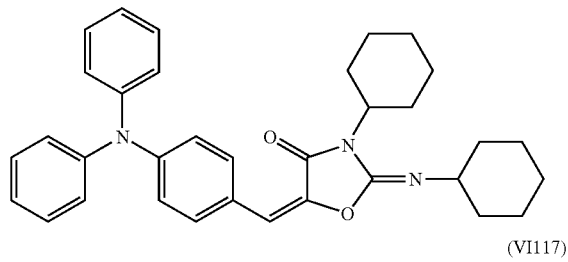
(VI116)

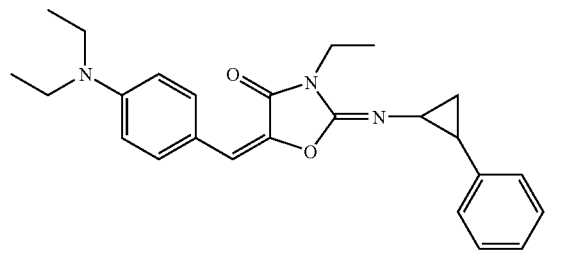
(VI117)

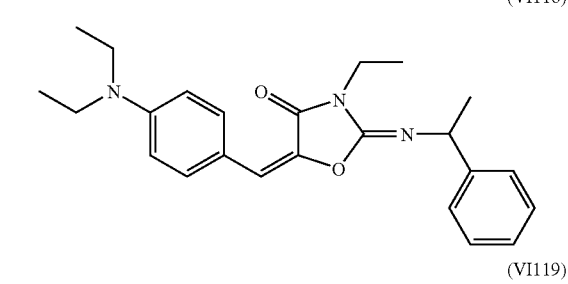
(VI118)

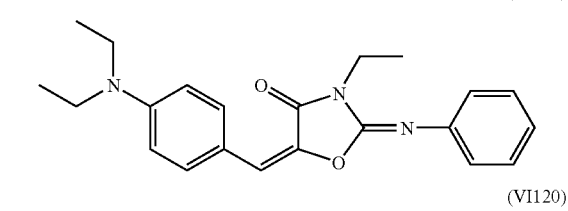
(VI119)

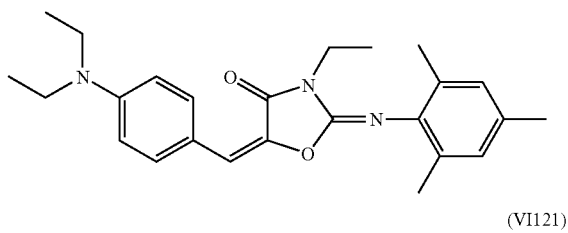
(VI120)

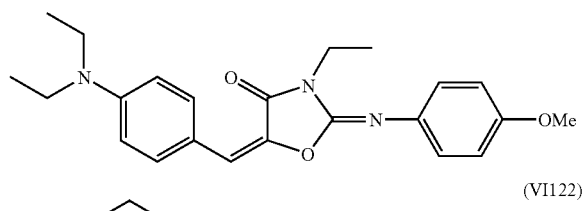
(VI121)

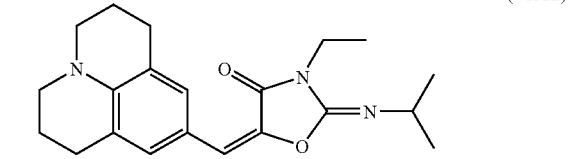
(VI122)

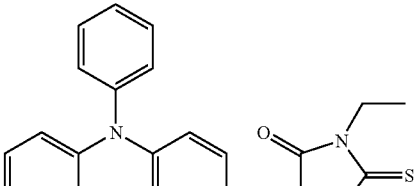
(VI123)

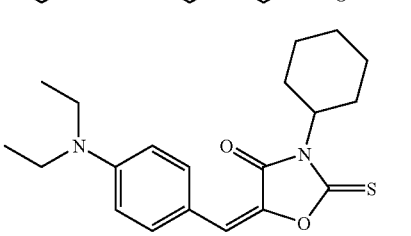
(VI124)

The sensitizing dye according to the invention may also be subjected to various chemical modifications for further ameliorating the properties of the curable composition.

For example, when a sensitizing dye is bonded to an addition polymerizable compound structure (for example, an acryloyl group or a methacryloyl group) by a method such as covalent bonding, ionic bonding or hydrogen bonding, strengthening of the exposed film, or inhibition of unnecessary deposition of the sensitizing dye from the film after exposure may be carried out.

Furthermore, when the sensitizing dye is bonded to a partial structure which is capable of radical generation in the photopolymerization initiator (for example, a reductively decomposable site such as halogenated alkyl, onium, peroxide or biimidazole, or an oxidatively cleavable site such as borate, amine, trimethylsilylmethyl, carboxymethyl, carbonyl or imine), photosensitivity may be significantly increased, particularly in the case where the concentration of the initiator is low.

The compounds represented by the above-described formulae (IV) to (VI) markedly exhibit their effect of the addition in the case where the concentration of pigment is very high in the curable composition, and the light transmittance of the colored pattern (photosensitive layer) to be formed is extremely low, for example, in the case where the colored photocurable composition of the invention is used in the formation of a colored pattern of a color filter, more specifically, in the case where the light transmittance of the photosensitive layer at 365 nm is 10% or less when the layer is formed without addition of the sensitizing dye. Particularly in the formulae (IV) to (VI), the compound represented by the formula (VI) is most preferred, and specifically, the compounds of (VI56) to (VI122) are most preferred.

The sensitizing agent may be used individually as one species, or may be used in combination of two or more species.

The content of the (F) sensitizing agent in the colored photocurable composition of the invention is preferably from 0.1 to 20% by mass, and more preferably from 0.5 to 15% by mass, based on the total solid content of the curable composition, from the viewpoints of the light absorption efficiency at deeper parts and initiation decomposition efficiency, for example, in the case of using the sensitizing agent in the formation of colored patterns of color filters.

(G) Binder Polymer

The colored photocurable composition according to the invention may include (G) a binder polymer other than the (A) dispersion resin having an unsaturation equivalent of less than 600, for the purpose of improving the film properties and the like.

As the binder polymer, it is preferable to use a linear organic polymer. As such a "linear organic polymer", any known polymer may be used. Additionally, for example, in the case of applying the colored photocurable composition of the invention to the use of forming a pattern through pattern exposure and curing of the exposed areas, followed by removal of the unexposed areas by means of water or alkali developer, a linear organic polymer which is soluble or swellable in water or in weak alkali water is preferably selected, in order to enable development with water or development with weak alkali water. The linear organic polymer may be selected and used, not only as a film forming agent, but also in accordance with the type of the developer such as water, weak alkali water or organic solvent. For example, when a water-soluble organic polymer is used, development with water is made possible. Such linear organic polymers may include radical polymers having a carboxylic acid group in the side chain, for example, those described in JP-A No. 59-44615, JP-B Nos. 54-34327, 58-12577 and 54-25957, JP-A Nos. 54-92723, 59-53836 and 59-71048. That is, the linear organic polymers may include a resin obtained by homopolymerizing or copolymerizing a monomer having a carboxyl group; a resin obtained by homopolymerizing or copolymerizing a monomer having an acid anhydride, and subjecting the acid anhydride units to hydrolysis, partial esterification or partial amidation; an epoxy acrylate obtained by modifying an epoxy resin with an unsaturated monocarboxylic acid and an acid anhydride; and the like. The monomers having a carboxyl group include acrylic acid, methacrylic acid, itaconic acid, crotonic acid, maleic acid, fumaric acid, 4-carboxylstyrene and the like, while the monomers having an acid anhydride include maleic anhydride and the like.

Likewise, acidic cellulose derivatives having a carboxylic acid group in the side chain may also be used. In addition to these, a product obtained by adding a cyclic acid anhydride to a polymer having a hydroxyl group, and the like are useful.

As described above, when the radical polymer having a carboxylic acid group in the side chain is a copolymer, monomers other than the previously mentioned monomers may also be used as the compound to be copolymerized. Examples of the monomers include the compounds of the following (1) to (12):

(1) Acrylic acid esters and methacrylic acid esters having an aliphatic hydroxyl group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate and 4-hydroxybutyl methacrylate;

(2) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate and propargyl acrylate;

(3) Alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate and propargyl methacrylate;

(4) Acrylamides or methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, N-ethyl-N-phenyl acrylamide, vinyl acrylamide, vinyl methacrylamide, N,N-diallyl acrylamide, N,N-diallyl methacrylamide, allyl acrylamide and allyl methacrylamide;

(5) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(6) Vinyl esters such as vinyl acetate, vinyl chloroacetate, vinyl butyrate and vinyl benzoate;

(7) Styrenes such as styrene, α-methylstyrene, methylstyrene, chloromethylstyrene and p-acetoxystyrene;

(8) Vinyl ketones such as methyl vinyl ketone, ethyl vinyl ketone, propyl vinyl ketone and phenyl vinyl ketone;

(9) Olefins such as ethylene, propylene, isobutylene, butadiene and isoprene;

(10) N-vinylpyrrolidone, acrylonitrile, methacrylonitrile, etc;

(11) Unsaturated imides such as maleimide, N-acryloyl acrylamide, N-acetyl methacrylamide, N-propionyl methacrylamide and N-(p-chlorobenzoyl)methacrylamide;

(12) Methacrylic acid-based monomers in which a heteroatom is bound at the α-position, for example, the compounds described in Japanese Patent Application Nos. 2001-115595 and 2001-115598, and the like.

Among these, (meth)acrylic resins having an allyl group or a vinyl ester group and a carboxyl group in the side chain, and alkali-soluble resins having a double bond in the side chain as described in JP-A Nos. 2000-187322 and 2002-62698, or alkali-soluble resins having an amide group in the side chain as described in JP-A No. 2001-242612, are excellently balanced in the film strength, sensitivity and development performance, and are thus suitable.

Furthermore, the urethane-based binder polymers containing an acid group as described in JP-B Nos. 7-12004, 7-120041, 7-120042 and 8-12424, JP-A Nos. 63-287944, 63-287947 and 1-271741, Japanese Patent Application No. 10-116232 and the like, or the urethane-based binder polymers having an acid group and a double bond in the side chain as described in JP-A No. 2002-107918, are excellent in the strength, and thus are advantageous in terms of suitability for low exposure.

The acetal-modified polyvinyl alcohol-based binder polymers having an acid group as described in EP No. 993966, EP No. 1204000, JP-A No. 2001-318463 and the like, are excellently balanced in the film strength and development performance, and are thus suitable.

In addition to these, polyvinyl pyrrolidone, polyethylene oxide and the like are also useful as the water-soluble linear organic polymer. In view of increasing the strength of the cured layer, alcohol-soluble nylon, polyether of 2,2-bis-(4-hydroxyphenyl)-propane and epichlorohydrin, and the like are also useful.

The weight-average molecular weight of the (G) binder polymer is preferably 5,000 or more, and more preferably in the range of 10,000 to 300,000, while the number-average molecular weight is preferably 1,000 or more, and more preferably in the range of 2,000 to 250,000. The polydispersity (weight-average molecular weight/number-average molecular weight) is preferably 1 or more, and more preferably in the range of 1.1 to 10.

These resins may be any of random polymers, block polymers, graft polymers and the like.

The (G) binder polymer may be synthesized according to conventionally known methods. Examples of the solvent used in the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethyl formamide, N,N-dimethylacetamide, toluene, ethyl acetate, methyl lactate, ethyl lactate, dimethylsulfoxide, 1-methyl-2-pyrrolidone, water and the like. These solvents are used individually or as a mixture of two or more species.

The radical polymerization initiator used in synthesizing the binder polymer that may be used for the invention may be a known compound such as azo-based initiators and peroxide initiators.

The content of the (G) binder polymer in the curable composition, in the case where the colored photocurable composition of the invention is used in the formation of colored patterns of color filters, is preferably from 5 to 60% by mass, more preferably from 7 to 50% by mass, and most preferably from 10 to 40% by mass, based on the total solid content in the colored photocurable composition, from the viewpoint of the balance between the pigment dispersion stability with time and the developability.

When the (A) dispersion resin having an unsaturation equivalent of less than 600 (the dispersion resin according to the invention), and the (G) binder polymer other than the (A) dispersion resin according to the invention are used in combination, the content ratio [(A)/(G); mass ratio] is preferably 100/5 to 100/200, and more preferably 100/5 to 100/80, from the viewpoints of stability over time and development performance.

(H) Dispersant

In the colored photocurable composition of the invention, it is preferable to add a dispersant, in addition to the above-described components, from the viewpoint of further enhancing the dispersibility of the (B) pigment.

Examples of the dispersant (pigment dispersant) include polymer dispersants [e.g. polyamidoamine and a salt thereof, polycarboxylic acid and a salt thereof, high-molecular unsaturated acid ester, modified polyurethane, modified polyester, modified poly(meth)acrylate, (meth)acryl-based copolymer, naphthalenesulfonic acid formalin condensate], polyoxyethylene alkyl phosphate ester, polyoxyethylenealkylamine, alkanolamine, and a pigment derivative.

The polymer dispersant can be further classified into a straight polymer, a terminal-modified polymer, a graft polymer, and a block polymer depending on a structure thereof.

The polymer dispersant is adsorbed on a surface of the pigment, and acts so as to prevent re-aggregation. For this reason, examples of a preferable structure include a terminal-modified polymer, a graft polymer and a block polymer, which have an anchoring site to a pigment surface. On the other hand, the pigment derivative has the effect of promoting adsorption of the polymer dispersant by modifying a pigment surface.

Examples of pigment dispersant include "Disperbyk-101 (polyamidoamine phosphate), 107 (carboxylic acid ester), 110 (copolymer containing acid group), 130 (polyamide), 161, 162, 163, 164, 165, 166, 170 (high-molecular copolymer)" and "BYK-P104, P105 (high-molecular unsaturated polycarboxylic acid), BYK2001" manufactured by BYK Chemie, "EFKA4047, 4050, 4010, 4165 (polyurethane-based), EFKA4330, 4340 (block copolymer), 4400, 4402 (modified polyacrylate), 5010 (polyester amide), 5765 (high-molecular-weight polycarboxylic acid salt), 6220 (fatty acid polyester), 6745 (phthalocyanine derivative), 6750 (azo pigment derivative)" manufactured by EFKA, "Ajispur PB821, PB822" manufactured by Ajinomoto Fine Techno Co., Inc., "Flowlen TG-710 (urethane oligomer)" and "Polyflow No. 50E, No. 300 (acryl-based copolymer)", manufactured by Kyoeisha Chemical Co., Ltd., "Disperon KS-860, 873SN, 874, #2150 (aliphatic polyvalent carboxylic acid), #7004 (polyetherester), DA-703-50, DA-705, DA-725" manufactured by Kusumoto Chemicals Ltd., "Demol RN, N (naphthalenesulfonic acid formalin polycondensate), MS, C, SN-B (aromatic sulfonic acid formalin polycondensate)", "Homogenol L-18 (high-molecular polycarboxylic acid)", "Emulgen 920, 930, 935, 985, (polyoxyethylene nonyl phenyl ether)" and "Acetamine 86 (stearylamine acetate)" manufactured by Kao Corporation, "Solsperse 5000 (phthalocyanine derivative), 22000 (azo pigment derivative), 13240 (polyesteramine), 3000, 17000, 27000 (polymer having functional site on terminal part), 24000, 28000, 32000, 38500 (graft polymer)" manufactured by The Lubrizol Corporation, "Nikkol T106 (polyoxyethylene sorbitan monooleate), MYS-IEX (polyoxyethylene monostearate)" manufactured by Nikko Chemicals Co., Ltd.

These dispersants may be used alone, or may be used by combining two or more kinds in the invention, and particularly, it is preferable that the pigment derivative and the polymer dispersant are used by combining them.

A content of the (H) dispersant in the invention is preferably 1% by mass to 100% by mass, more preferably 3% by mass to 100% by mass, further preferably 5% by mass to 80% by mass, based on the pigment.

Specifically, when the polymer dispersant is used, its use amount is preferably in a range of 5% by mass to 100% by mass, more preferably, in a range of 10% by mass to 80% by mass relative to the pigment. In addition, when the pigment derivative is used, its use amount is preferably in a range of 1% by mass to 30% by mass, more preferably in a range of 3% by mass to 20% by mass, particularly preferably in the range of 5% by mass to 15% by mass relative to the pigment.

In the invention, when the pigment and the dispersant are used, from a viewpoint of a curing sensitivity and a color density, a total of contents of the pigment and the dispersant is preferably 35% by mass or more but 90% by mass or less, more preferably 45% by mass or more but 85% by mass or less, further preferably 50% by mass or more but 80% by mass or less relative to a total solid content constituting the curable composition.

(I) Co-Sensitizer

The colored photocurable composition of the invention preferably includes (I) a co-sensitizer. According to the invention, the co-sensitizer has effects such as further enhancing the sensitivity of the (F) sensitizing agent (sensitizing dye) or the (C) photopolymerization initiator to actinic radiation, or suppressing the inhibition of the polymerization of polymerizable compounds by oxygen.

Examples of such co-sensitizers include amines, for example, the compounds described in M. R. Sander et al., "Journal of Polymer Society" Vol. 10, p. 3173 (1972), JP-B No. 44-20189, JP-A Nos. 51-82102, 52-134692, 59-138205, 60-84305, 62-18537 and 64-33104, and Research Disclosure No. 33825. Specific examples thereof include triethanolamine, p-dimethylaminobenzoic acid ethyl ester, p-formyldimethylaniline, p-methylthiodimethylaniline, and the like.

Other examples of the co-sensitizer include thiols and sulfides, for example, the thiol compounds described in JP-A No. 53-702, JP-B No. 55-500806, and JP-A No. 5-142772, the disulfide compounds described in JP-A No. 56-75643, and the like. Specific examples thereof include 2-mercaptobenzothiazole, 2-mercaptobenzooxazole, 2-mercaptobenzoimidazole, 2-mercapto-4(3H)-quinazoline, β-mercaptonaphthalene, and the like.

Further examples of the co-sensitizer include amino acid compounds (for example, N-phenylglycine, etc.), the organometallic compounds described in JP-B No. 48-42965 (for example, tributyltin acetate, etc.), the hydrogen donors described in JP-B No. 55-34414, the sulfur compounds described in JP-A No. 6-308727 (for example, trithiane, etc.), and the like.

The content of the co-sensitizer (I) is preferably in the range of 0.1 to 30% by mass, more preferably in the range of 0.5 to 25% by mass, and even more preferably in the range of 1.0 to 20% by mass, based on the total mass of solid in the curable composition, from the viewpoint of enhancing the curing rate by the balance between the polymer growth rate and the chain transfer.

(J) Polymerization Inhibitor

According to the invention, it is preferable to add during the production or storage of the curable composition, a small amount of a thermal polymerization preventing agent as (J) a polymerization inhibitor, so as to inhibit unnecessary thermal polymerization of compounds having an ethylenic unsaturated double bond in the molecule, such as the (A) dispersion resin having an unsaturation equivalent of less than 600 or the (D) polyfunctional photopolymerizable compound.

Examples of the thermal polymerization preventing agent include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxyamine cerium(III) salt, and the like.

The amount of addition of the (J) polymerization inhibitor is preferably from about 0.01 to about 5% by mass based on the mass of the curable composition.

Furthermore, if necessary, a higher fatty acid derivative such as behenic acid or behenic acid amide may be added to prevent the inhibition of polymerization by oxygen, and may be localized at the surface during the course until the drying of the colored photocurable composition of the invention. The amount of addition of the higher fatty acid derivative is preferably from about 0.5 to about 10% by mass based on the mass of the curable composition.

[Other Components]

In addition, the colored photocurable composition of the invention may include fillers, plasticizers, polymer compounds other than the above-described components, surfactants, antioxidants, ultraviolet absorbers, antiflocculants, and the like for improving the properties of a cured layer.

More specifically, there may be mentioned fillers such as glass and alumina; plasticizers such as dioctyl phthalate, didodecyl phthalate, triethylene glycol dicaprylate, dimethyl glycol phthalate, tricresyl phosphate, dioctyl adipate, dibutyl sebacate and triacetyl glycerin; polymer compounds such as polyvinyl alcohol, polyacrylic acid, polyethylene glycol monoalkyl ether and polyfluoroalkyl acrylate; nonionic, cationic and anionic surfactants; antioxidants such as 2,2-thiobis (4-methyl-6-t-butylphenol) and 2,6-di-t-butylphenol; ultraviolet absorbers such as 2-(3-t-butyl-5-methyl-2-hydroxyphenyl)-5-chlorobenzotriazole and alkoxybenzophenone; and antiflocculants such as sodium polyacrylate.

In the case of applying the colored photocurable composition of the invention onto the surface of a hard material such as a support, an additive to enhance the contact characteristics with the hard material surface (hereinafter, may be referred to as a "support adherence agent") may be added.

As the support adherence agent, known materials may be used. Particularly, it is preferable to use silane-based coupling agents, titanate-based coupling agents or aluminum-based coupling agents.

Examples of the silane-based coupling agents include γ-(2-aminoethyl)aminopropyltrimethoxysilane, γ-(2-aminoethyl)aminopropyldimethoxysilane, β-(3,4-epoxycyclohexyl)ethyltrimethoxysilane, γ-aminopropyltrimethoxysilane, γ-aminopropyltriethoxysilane, γ-methacryloxypropyltrimethoxysilane, γ-methacryloxypropyltriethoxysilane, γ-acryloxypropyltrimethoxysilane, γ-acryloxypropyltriethoxysilane, γ-isocyanatopropyltrimethoxysilane, γ-isocyanatopropyltriethoxysilane, N-β-(N-vinylbenzylaminoethyl)-γ-aminopropyltrimethoxysilane hydrochloride, γ-glycidoxypropyltrimethoxysilane, γ-glycidoxypropyltriethoxysilane, aminosilane, γ-mercaptopropyltrimethoxysilane, γ-mercaptopropyltriethoxysilane, methyltrimethoxysilane, methyltriethoxysilane, vinyltriacetoxysilane, γ-chloropropyltrimethoxysilane, hexamethyldisilazane, γ-anilinopropyltrimethoxysilane, vinyltrimethoxysilane, vinyltriethoxysilane, vinyltris(β-methoxyethoxy)silane, octadecyldimethyl[3-(trimethoxysilyl)propyl]ammonium chloride, γ-chloropropylmethyldimethoxysilane, γ-mercaptopropylmethyldimethoxysilane, methyltrichlorosilane, dimethyldichlorosilane, trimethylchlorosilane, 2-(3,4-epoxycyclohexyl)ethyltrimethoxysilane, bisallyltrimethoxysilane, tetraethoxysilane, bis(trimethoxysilyl)hexane, phenyltrimethoxysilane, N-(3-acryloxy-2-hydroxypropyl)-3-aminopropyltriethoxysilane, N-(3-methacryloxy-2-hydroxypropyl)-3-aminopropyltriethoxysilane, (methacryloxymethyl) methyldiethoxysilane, (acryloxymethyl) methyldimethoxysilane, and the like.

Among them, γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, and phenyltrimethoxysilane are preferred, and γ-methacryloxypropyltrimethoxysilane is most preferred.

Examples of the titanate-based coupling agents include isopropyltriisostearoyl titanate, isopropyltridecylbenzenesulfonyl titanate, isopropyltris(dioctylpyrophosphate) titanate, tetraisopropylbis(dioctylphosphite) titanate, tetraoctylbis(ditridecylphosphite) titanate, tetra(2,2-diallyloxymethyl) bis(ditridecyl)phosphite titanate, bis(dioctylpyrophosphate) oxyacetate titanate, bis(dioctylpyrophosphate)ethylene titanate, isopropyltrioctanoyl titanate, isopropyldimethacrylisostearoyl titanate, isopropylisostearoyldiacryl titanate, triisopropyltri(dioctylphosphate) titanate, isopropyltricumylphenyl titanate, isopropyltri(N-amidoethyl-aminoethyl) titanate, dicumylphenyloxyacetate titanate, diisostearoylethylene titanate, and the like.

Examples of the aluminum-based coupling agents include acetoalkoxyaluminum diisopropylate and the like.

The content of the support adherence agent is preferably from 0.1 to 30% by mass, more preferably from 0.5 to 20% by mass, and particularly preferably from 1 to 10% by mass, based on the total solid content in the colored photocurable composition of the invention, in view of preventing any scum of the curable composition from remaining in uncured regions.

Furthermore, in the case of applying the colored photocurable composition of the invention to an application of forming a pattern, after pattern exposing and curing the exposed areas, by removing the unexposed areas through development with water or an alkali, an organic carboxylic acid, preferably a low molecular weight organic carboxylic acid having a molecular weight of 1000 or less, may be added to the curable composition so as to promote the alkali-solubility and further improve the development performance.

Specific examples thereof include aliphatic monocarboxylic acids such as formic acid, acetic acid, propionic acid, butyric acid, valeric acid, pivalic acid, caproic acid, diethylacetic acid, enanthic acid and caprylic acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid and citraconic acid; aliphatic tricarboxylic acids such as tricarballylic acid, aconitic acid and camphoronic acid; aromatic monocarboxylic acids such as benzoic acid, toluic acid, cumic acid, hemellitic acid and mesitylenic acid; aromatic polycarboxylic acids such as phthalic acid, isophthalic acid, terephthalic acid, trimellitic acid, trimesic acid, mellophanic acid and pyromellitic acid; and other carboxylic acids such as phenylacetic acid, hydratropic acid, hydrocinnamic acid, mandelic acid, phenylsuccinic acid, atropic acid, cinnamic acid, methyl cinnamate, benzyl cinnamate, cinnamylideneacetic acid, coumaric acid and umbellic acid.

As described above, in the case of preparing the colored photocurable composition of the invention which contains at least (A) a dispersion resin having an unsaturation equivalent of less than 600, (B) a pigment, (C) a photopolymerization initiator and (D) a polyfunctional photopolymerizable compound, it is preferable to prepare the composition through a mixing and dispersing process in which the (A) dispersion resin having an unsaturation equivalent of less than 600, the (B) pigment, and other components such as (H) a dispersant according to necessity, are mixed with the (E) solvent, and the mixture is mixed and dispersed using various mixers and dispersing machines. That is, it is preferable to prepare the colored photocurable composition of the invention by performing the mixing and dispersing process in advance to prepare a pigment dispersion liquid, and mixing this pigment dispersion liquid with the remaining components such as the (C) photopolymerization initiator or (D) polyfunctional photopolymerizable compound, and a binder component or the like.

In addition, it is preferable that the mixing and dispersing process involves kneading and dispersion, and a fine dispersion treatment performed subsequently thereto, but it is also possible to omit kneading and dispersion.

<Color filter and method for production thereof>

Next, the color filter of the invention and the method for production thereof will be described.

The color filter of the invention is characterized by having a colored pattern which is formed on a support using the colored photocurable composition for a solid state image pick-up device of the invention.

Hereinafter, the color filter of the invention will be described in detail by way of the method for production thereof (method for production of the color filter of the invention).

The method for production of the color filter of the invention comprises a colored layer forming process of forming a colored layer by applying the colored photocurable composition for a solid state image pick-up device of the invention on a substrate directly or with another layer interposed therebetween (and then, drying if necessary); an exposure process of exposing the colored layer through a mask (for example, patternwise exposure); and a developing process of developing the colored layer after exposure to form a pattern. Furthermore, if necessary, the method may also comprise a process of curing the pattern by heating and/or exposure, or a postbake process of applying a postbake treatment to the developed colored layer. A colored pattern can be formed by going through these processes.

The colored photocurable composition of the invention as described in the above is used to form the pattern of a color filter for a solid state image pick-up device such as CCD, and is particularly effective for forming very fine patterns.

Specifically, the composition is effective for forming a pattern having a pattern dimension of 2.5 μm or less, and is particularly effective for forming a pattern having a pattern dimension of 2.0 μm or less. Furthermore, with regard to the film thickness of the pattern, the composition is effective for forming a pattern having a film thickness of 1.5 μm or less, and is particularly effective for forming a pattern having a film thickness of 1.0 μm or less.

Hereinafter, the method for production of the color filter of the invention will be described in detail.

In the colored layer forming process, the colored photocurable composition is applied on a substrate by a coating method such as spin coating, flow casting, roll coating or slit coating, and dried if necessary, to form a colored layer.

Examples of the substrate include a silicon substrate, or a solid state image pick-up device such as CCD or CMOS. These substrates may also have a black matrix formed thereon for separating each of the pixels. Also, the substrate may also be provided with an undercoat layer according to necessity, from the viewpoint of improving the adhesiveness to the layers provided on the substrate, preventing diffusion of materials, or smoothing the substrate surface.

In the exposure process, the colored layer formed in the above-described colored layer forming process is exposed through a mask to form a specific pattern. As for the radiation used during the exposure, ultraviolet radiation such as g-ray, h-ray or i-ray is preferably used. Among them, i-ray is particularly preferred from the viewpoint of forming even finer patterns.

In the developing process, the exposed colored layer is subjected to development with an alkali developer solution or the like.

The alkali developer solution to be used can be of any type as long as the developer solution dissolves the unexposed areas of the colored photocurable composition of the invention and does not dissolve the exposed areas (radiation-irradiated areas). Specifically, various combinations of organic solvents or aqueous alkaline solutions can be used.

As the organic solvents, the solvents described in the above-discussed <Colored photocurable composition> section may be mentioned.

Examples of the aqueous alkaline solutions include the aqueous alkaline solutions prepared by dissolving an alkaline compound such as sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine or 1,8-diazabicyclo[5.4.0]-7-undecene, to a concentration of 0.001 to 10% by mass, and preferably 0.01 to 1% by mass.

Furthermore, in the case of using a developer solution formed from an aqueous alkaline solution, it is generally preferable to perform washing with water after development.

As for the alkali developer solution, it is preferable to use an aqueous alkaline solution in which the alkali concentration has been adjusted to preferably pH 11 to 13, and more preferably to pH 11.5 to 12.5. When the alkali concentration is within the above-mentioned range, the roughning or peeling of the pattern can be more effectively suppressed, and the ratio of residual film can be further improved. Also, a decrease in the development speed and the generation of development residue can be more effectively suppressed.

The developing process is preferably carried out by performing a development treatment using such aqueous alkaline solution. Examples of the method of development include a dipping method, a spraying method, a paddle method and the like, and the temperature is preferably 15 to 40° C.

In the method for production of the color filter of the invention, it is preferable to perform a postbake treatment in a postbake process, in order to sufficiently cure the coating film after development. The heating temperature in the postbake process is preferably 100 to 300° C., and more preferably 150 to 250° C. The heating time is preferably about 2 minutes to 1 hour, and more preferably about 3 minutes to 30 minutes.

The color filter of the invention is one used in the production of solid state image pick-up devices, and is suitable for image sensors such as CCD, particularly for high resolution CCD devices or CMOS devices which may have over one million pixels. The color filter of the invention is suitably used, for example, as a color filter disposed between the light receiving unit of each of the pixels constituting a CCD, and a microlens for concentrating light.

Among others, the color filter of the invention is preferably used as a color filter having a pattern dimension of 2.5 μm or less (more preferably, 2.0 μm or less), and is most preferably used as a color filter having a pattern dimension of 2.5 μm or less (more preferably, 2.0 μm or less) and having a pattern film thickness of 1.5 μm or less (more preferably, 1.0 μm or less).

EXAMPLES

Hereinafter, the present invention will be described more specifically by way of Examples, but the invention is not intended to be limited to the following Examples. In addition, unless stated otherwise, the "part" is on a mass basis.

Example 1

1) Preparation of Undercoat Solution

The components of the following composition were mixed and dissolved to prepare an undercoat solution.
<Composition>

| | |
|---|---:|
| Propylene glycol monomethyl ether acetate (PGMEA) | 19.20 parts |
| Ethyl lactate | 36.67 parts |
| Binder [A 41% solution of benzyl methacrylate/methacrylic acid/2-hydroxyethyl methacrylate copolymer (molar ratio = 60:20:20) in PGMEA] | 30.51 parts |
| Dipentaerythritol hexaacrylate (Photopolymerizable compound) | 12.20 parts |
| Polymerization inhibitor (p-Methoxyphenol) | 0.0061 parts |
| Fluorochemical surfactant (F-475, manufactured by Dainippon Ink and Chemicals, Inc.) | 0.83 parts |
| Photopolymerization initiator (TAZ-107 (trihalomethyltriazine-based photopolymerization initiator), manufactured by Midori Chemicals Co., Ltd.) | 0.586 parts |

2) Production of Silicon Wafer with Undercoat Layer

The undercoat solution obtained in the above section 1) was uniformly applied on a 6-inch silicon wafer by spin coating to form a coating film, and the formed coating film was subjected to a heat treatment on a hot plate at 120° C. for 120 seconds. Furthermore, the rotation speed of the spin coating process was adjusted such that the film thickness of the coating film after the heat treatment reached about 2 μm.

The coating film after the heat treatment was further treated in an oven at 220° C. for 1 hour to cure the coating film, thereby an undercoat layer being obtained.

As such, a silicon wafer with an undercoat layer, having an undercoat layer formed on a 6-inch silicon wafer, was obtained.

3) Preparation of Pigment Dispersion Liquid 95 parts of C.I. Pigment Blue 15:6 (average primary particle diameter 32 nm, (B) pigment), 35.5 parts (about 16 parts as solid) of BYK2001 (Disperbyk (concentration of solids 45.1%), manufactured by BYK-Chemie GmbH, dispersant), 31 parts of a dispersion resin A-1 as indicated in the following Table 1 ((A) dispersion resin having an unsaturation equivalent of less than 600), and 830 parts of propylene glycol monomethyl ether acetate (solvent) were mixed, and the mixture liquid was subjected to mixing and dispersion for 15 hours in a bead mill, to prepare a pigment dispersion liquid (P1).

For the pigment dispersion liquid (P1), the average particle diameter of the pigment was measured by a dynamic light scattering method, and was found to 200 nm.

TABLE 1

| Dispersion resin | Unsaturation equivalent | Acid value (mg KOH/g) | Mass average molecular weight |
|---|---|---|---|
| A-1 | 390 | 80.0 | 15000 |
| A-2 | 480 | 72.0 | 17000 |
| A-3 | 500 | 70.0 | 12000 |
| A-4 | 580 | 90.0 | 30000 |
| A-5 | 630 | 82.0 | 14000 |
| A-6 | 3000 | 150.0 | 30000 |

Each of the dispersion resins A-1 to A-6 listed in Table 1 was prepared by using at least one of the structural units described in the following (a) and by appropriately using some of the structural units described in the following (b) and (c) so as to have an unsaturation equivalent, an acid value, and a mass average molecular weight as shown in Table 1.

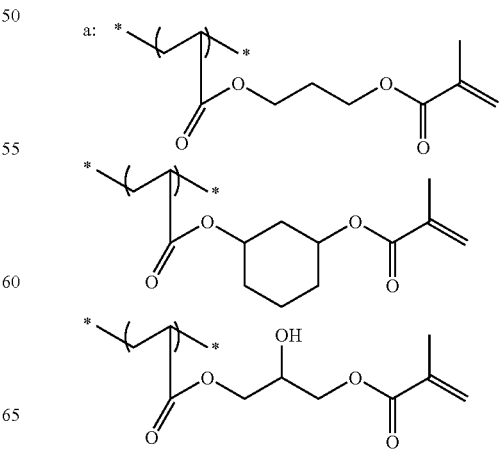

-continued

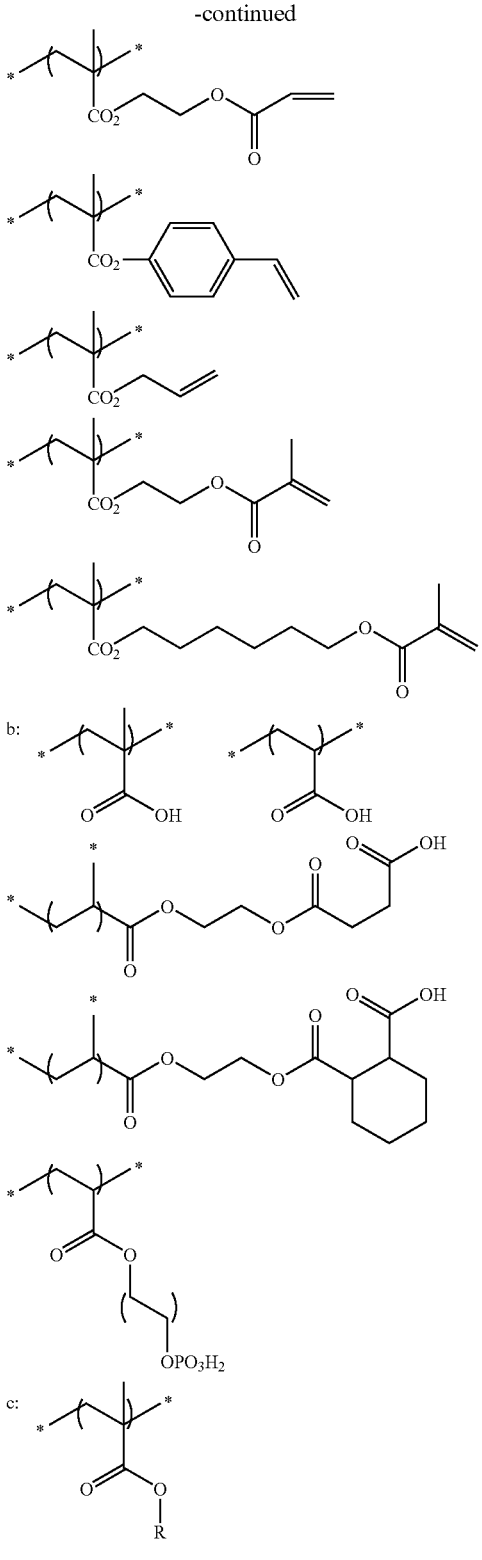

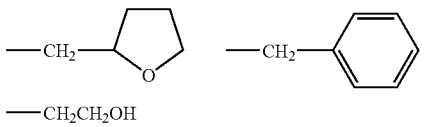

The dispersion resins A-3 and A-5 were each prepared so as to further include 10% by mole of a structural unit having the following structure in addition to the structural units (a), (b) and (c) in the structural units thereof.

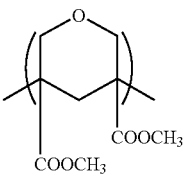

4) Preparation of Curable Composition (Coating Solution)

The obtained pigment dispersion liquid (P1) was used, and mixed while being stirred to obtain the following composition, thus to prepare a curable composition solution.

| | |
|---|---|
| Pigment dispersion liquid (P1) | 600 parts |
| Photopolymerization initiator | 5 parts |
| (Acetophenone-based (C) photopolymerization initiator) | |
| (Irgacure 907, manufactured by Ciba Specialty Chemicals Co., Ltd.) | |
| Polyfunctional photopolymerizable compound d-1 indicated in the following Table 2 | 15 parts |
| ((D) Polyfunctional photopolymerizable compound having an acidic functional group and three or more photopolymerizable functional groups) | |
| Propylene glycol monomethyl ether acetate (PGMEA; solvent) | 280 parts |

TABLE 2

| | Polyfunctional photopolymerizable compound |
|---|---|
| d-1 | Exemplary compound (4) as mentioned above |
| d-2 | Exemplary compound (9) as mentioned above |
| d-3 | Mixture of exemplary compound (9) as mentioned above:exemplary compound (b) as mentioned above = 2:1 |
| d-4 | Exemplary compound (a) as mentioned above |
| d-5 | Exemplary compound (b) as mentioned above |
| d-6 | Exemplary compound (c) as mentioned above |
| d-7 | Exemplary compound (d) as mentioned above |
| d-8 | Exemplary compound (e) as mentioned above |
| d-9 | Exemplary compound (f) as mentioned above |
| d-10 | Mixture of exemplary compound (9) as mentioned above:exemplary compound (b) as mentioned above:dipentaerythritol hexaacrylate = 2:1:3 |
| d-11 | Mixture of exemplary compound (b) as mentioned above:dipentaerythritol hexaacrylate = 1:2 |
| d-12 | Dipentaerythritol hexaacrylate |
| d-13 | Pentaerythritol tetraacrylate |

5) Production and Evaluation of Color Filter Formed from Curable Composition

The curable composition solution prepared as described above was applied on the undercoat layer of the silicon wafer with an undercoat layer obtained in the above section 2), to form a colored layer (coating film). This was subjected to a heat treatment (prebake) for 120 seconds using a hot plate at 100° C., so that the dried film thickness of the coating film reached 0.7 μm.

Subsequently, the resulting product was exposed to a light having a wavelength of 365 nm using an i-ray stepper exposure apparatus FPA-3000i5+(manufactured by Canon, Inc.), through a patterned mask having two kinds of island patterns, one having a side of 3.0 μm in length on all four sides and the other having a side of 1.5 µm in length on all four sides, in various exposure amounts in the range of 50 to 1200 mJ/cm².

Thereafter, the silicon wafer having an irradiated coating film formed thereon, was placed on a horizontal rotary table of a spin-shower developing machine (DW-30 type; manufactured by Chemitronics Co., Ltd.), and was subjected to a paddle development at 23° C. for 60 seconds using a CD-2000 (manufactured by Fuji Film Electronics Materials Co., Ltd.), to form a colored pattern on the silicon wafer.

The silicon wafer on which a colored pattern had been formed was fixed to the aforementioned horizontal rotary table by a vacuum chuck method. While the silicon wafer was rotated by a rotating device at a rotation speed of 50 rpm, a rinsing treatment was conducted by supplying purified water in shower form from above the rotational center of the silicon wafer from an ejection nozzle, and then the silicon wafer was spray-dried.

As such, a color filter was produced.

6) Evaluation

For the colored pattern obtained in the above, the size of the colored pattern was measured using a length measuring SEM "S-9260A" (manufactured by Hitachi High-Technologies Corporation), and an observation of the configuration viewed from above the pattern was conducted. In addition, the following evaluation was performed. The evaluation results are presented in the following Table 3.

<Sensitivity>

The cross-section shape of the colored pattern was observed using a cross-sectional SEM "S-4800" (manufactured by Hitachi High-Technologies Corporation), and the exposure amount yielding a pattern line width of 1.5 µm was evaluated as the exposure sensitivity. The exposure sensitivity indicates that as the value of exposure amount decreases, the sensitivity increases. In addition, the case where pattern peeling was seen over the entire surface of the wafer, was indicated as "X".

<Adhesiveness to Substrate>

At the exposure amount yielding a pattern line width of 1.5 µm, it was observed whether or not defects were generated on the patterns that were 1.5 µm long on all four sides, and an evaluation was performed from the proportion (defect rate) occupied by defected sites in the total number of patterns that were 1.5 µm long on all four sides, on the basis of the following criteria.

—Evaluation Criteria—

A: The defect rate was less than 2%.
B: The defect rate was less than 5%.
C: The defect rate was 5% or larger.

<Developability>

In the above section 5), the presence or absence of residue in the regions not irradiated with light (unexposed areas) between the patterns that were 3.0 µm long on all four sides and between the patterns that were 1.5 µm long on all four sides was observed, and developability was evaluated on the basis of the following criteria. A and B are preferred, but A is more preferred.

—Evaluation Criteria—

A: No residue was recognized at all in the unexposed areas between the patterns that were 3.0 µm long on all four sides and between the patterns that were 1.5 µm long on all four sides.

B: No residue was recognized at all in the unexposed areas between the patterns that were 3.0 µm long on all four sides. A trace amount of residue was recognized in the unexposed areas between the patterns that were 1.5 µm long on all four sides, but was practically acceptable.

C: A trace amount of residue was recognized in the unexposed areas between the patterns that were 3.0 µm long on all four sides, but was practically acceptable. On the other hand, a significant amount of residue was recognized in the unexposed areas between the patterns that were 1.5 µm long on all four sides.

D: A significant amount of residue was recognized in the unexposed areas between the patterns that were 3.0 µm long on all four sides and between the patterns that were 1.5 µm long on all four sides.

E: Pattern peeling was seen over the entire surface of the wafer, and no pattern remained behind.

<Shape of Top Part of Pattern>

For the formed colored pattern, the shape of the top part viewed from above the pattern was observed, and an evaluation was performed on the basis of the following criteria.

—Evaluation Criteria—

A: All of the pattern that was 3.0 µm long on all four sides and the pattern that was 1.5 µm long on all four sides were rectangular in shape, and roundness could not be seen at the corners.

B: The pattern that was 3.0 µm long on all four sides was rectangular in shape. The pattern that was 1.5 µm long on all four sides was slightly round, and unevenness was recognized, but only to a practically acceptable extent.

C: The pattern that was 3.0 µm long on all four sides was slightly round, and unevenness was recognized, but only to a practically acceptable extent. On the other hand, the pattern that was 1.5 µm long on all four sides was recognized to have a significant round shape and unevenness.

D: All of the pattern that was 3.0 µm long on all four sides and the pattern that was 1.5 µm long on all four sides were recognized to have a significant round shape and unevenness.

E: Evaluation could not be performed because pattern peeling was seen over the entire surface of the wafer, and no pattern remained behind.

<Cross-Section Shape of Pattern>

The cross-section of the formed pattern that was 1.5 µm long on all four sides was observed, and the shape was evaluated by a view with naked eyes. A preferred shape is a rectangular shape, and an inversely tapered shape is not desirable. In addition, the case where evaluation could not be performed because pattern peeling was seen over the entire surface of the wafer and no pattern remained behind, was indicated as "X".

<Ratio of Residual Film>

The thickness from the undercoat layer to the top of pattern was measured using a cross-sectional SEM "S-4800" (manufactured by Hitachi High-Technologies Corporation) before and after the formation of the colored pattern, and the ratio of residual film (%; =thickness before pattern formation/thickness after pattern formation ×100) was calculated. More increased ratio of residual film is preferable, and the ratio is more preferably 80% or greater. In addition, the case where the evaluation could not be performed because pattern peeling was seen over the entire surface of the wafer, and no pattern remained behind, was indicated as "X".

<Storage Stability of Curable Composition Over Time>

After storing the curable composition solution (coating solution) prepared as described above for 1 month at room temperature, the viscosity of the solution was measured using an E type viscometer (manufactured by Tokyo Keiki Kogyo Co., Ltd.), and was evaluated on the basis of the following criteria.

—Evaluation Criteria—

A: An increase in the viscosity was not recognized.
B: An increase in the viscosity by 5% or more but less than 10% relative to the viscosity prior to storage was recognized.

C: An increase in the viscosity by 10% or more relative to the viscosity prior to storage was recognized.

Examples 2 to 45 and Comparative Examples 1 to 34

Color filters were produced in the same manner as in Example 1, except that the dispersion resin A-1 and the photopolymerizable compound d-1 for the curable composition prepared in Example 1 were changed as indicated in the following Table 3 to Table 5, and the same evaluation as in Example 1 was performed. The evaluation results are presented in the following Table 3 to table 5.

Examples 46 to 49 and Comparative Examples 35 to 39

Color filters were produced in the same manner as in Example 1, 4, 35 and 38, and Comparative Examples 2, 8, 22, 25 and 34, except that the (C) photopolymerization initiator used in the preparation of the respective curable compositions of Examples 1, 4, 35 and 38, and Comparative Examples 2, 8, 22, 25 and 34, was replaced by CGI-124 (manufactured by Ciba Specialty Chemicals, Inc.; oxime-based photopolymerization initiator), and the same evaluation was performed. The evaluation results are presented in the following Table 6.

Examples 50 to 53 and Comparative Examples 40 to 44

Color filters were produced in the same manner as in Examples, 1, 4, 35 and 38, and Comparative Examples 2, 8, 22, 25 and 34, except that the (C) photopolymerization initiator used in the preparation of the respective curable composition of Examples 1, 4, 35 and 38, and Comparative Example 2, 8, 22, 25 and 34, was replaced by CGI-242 (manufactured by Ciba Specialty Chemicals, Inc.; oxime-based photopolymerization initiator), and the same evaluation was performed. The evaluation results are presented in the following Table 7.

TABLE 3

| | Dispersion resin | Polyfunctional photopolymerizable compound | Storage stability | Sensitivity | Adhesiveness to substrate | Developability | Shape of top part | Shape of cross-section | Ratio of residual film |
|---|---|---|---|---|---|---|---|---|---|
| Example 1 | A-1 | d-1 | A | 150 | A | A | A | Rectangular | 93.5% |
| Example 2 | A-1 | d-2 | A | 200 | A | A | A | Rectangular | 91.5% |
| Example 3 | A-1 | d-3 | A | 100 | A | A | A | Rectangular | 95.6% |
| Example 4 | A-1 | d-4 | A | 100 | A | A | A | Rectangular | 95.5% |
| Example 5 | A-1 | d-5 | A | 150 | A | A | A | Rectangular | 89.1% |
| Example 6 | A-1 | d-6 | A | 200 | A | A | A | Rectangular | 92.3% |
| Example 7 | A-1 | d-7 | A | 200 | A | A | A | Rectangular | 93.7% |
| Example 8 | A-1 | d-8 | A | 300 | A | A | A | Rectangular | 88.6% |
| Example 9 | A-1 | d-9 | A | 300 | A | A | A | Rectangular | 84.9% |
| Example 10 | A-1 | d-10 | A | 200 | A | A | A | Rectangular | 93.7% |
| Example 11 | A-1 | d-11 | A | 400 | A | A | A | Rectangular | 91.8% |
| Comparative example 1 | A-1 | d-12 | A | 400 | A | C | C | Inversely tapered | 92.0% |
| Comparative example 2 | A-1 | d-13 | A | 550 | A | C | C | Inversely tapered | 79.7% |
| Example 13 | A-2 | d-1 | A | 150 | A | B | B | Rectangular | 92.5% |
| Example 14 | A-2 | d-2 | A | 200 | A | B | B | Rectangular | 89.5% |
| Example 15 | A-2 | d-3 | A | 150 | A | A | B | Rectangular | 94.5% |
| Example 16 | A-2 | d-4 | A | 150 | A | B | B | Rectangular | 91.5% |
| Example 17 | A-2 | d-5 | A | 200 | A | B | B | Rectangular | 87.4% |
| Example 18 | A-2 | d-6 | A | 250 | A | B | B | Rectangular | 89.5% |
| Example 19 | A-2 | d-7 | A | 300 | A | B | B | Rectangular | 90.8% |
| Example 20 | A-2 | d-8 | A | 400 | A | B | B | Rectangular | 83.9% |
| Example 21 | A-2 | d-9 | A | 450 | A | B | B | Rectangular | 83.5% |
| Example 22 | A-2 | d-10 | A | 300 | A | B | B | Rectangular | 90.2% |
| Example 23 | A-2 | d-11 | A | 500 | A | B | B | Rectangular | 89.4% |
| Comparative example 3 | A-2 | d-12 | A | 500 | A | C | C | Inversely tapered | 89.1% |
| Comparative example 4 | A-2 | d-13 | A | 800 | A | C | C | Inversely tapered | 73.5% |

TABLE 4

| | Dispersion resin | Polyfunctional photopolymerizable compound | Storage stability | Sensitivity | Adhesiveness to substrate | Developability | Shape of top part | Shape of cross-section | Ratio of residual film |
|---|---|---|---|---|---|---|---|---|---|
| Example 24 | A-3 | d-1 | A | 300 | A | B | A | Rectangular | 88.5% |
| Example 25 | A-3 | d-2 | A | 400 | A | B | A | Rectangular | 83.5% |
| Example 26 | A-3 | d-3 | A | 350 | A | A | A | Rectangular | 86.5% |
| Example 27 | A-3 | d-4 | A | 300 | A | B | A | Rectangular | 88.4% |
| Example 28 | A-3 | d-5 | A | 400 | A | B | A | Rectangular | 82.4% |
| Example 29 | A-3 | d-6 | A | 500 | A | B | A | Rectangular | 85.5% |
| Example 30 | A-3 | d-7 | A | 600 | A | B | A | Rectangular | 86.7% |
| Example 31 | A-3 | d-8 | A | 800 | A | B | A | Rectangular | 82.1% |
| Example 32 | A-3 | d-9 | A | 900 | A | B | A | Rectangular | 78.6% |

TABLE 4-continued

| | Dispersion resin | Polyfunctional photopolymerizable compound | Storage stability | Sensitivity | Adhesiveness to substrate | Developability | Shape of top part | Shape of cross-section | Ratio of residual film |
|---|---|---|---|---|---|---|---|---|---|
| Example 33 | A-3 | d-10 | A | 600 | A | B | A | Rectangular | 86.7% |
| Example 34 | A-3 | d-11 | A | 1000 | A | B | A | Rectangular | 85.0% |
| Comparative example 5 | A-3 | d-12 | A | 1000 | C | D | D | Inversely tapered | 78.0% |
| Comparative example 6 | A-3 | d-13 | A | 1600 | C | D | D | Inversely tapered | 67.7% |
| Example 35 | A-4 | d-1 | A | 300 | A | B | B | Rectangular | 87.5% |
| Example 36 | A-4 | d-2 | A | 400 | A | B | B | Rectangular | 85.5% |
| Example 37 | A-4 | d-3 | A | 350 | A | A | B | Rectangular | 82.5% |
| Example 38 | A-4 | d-4 | A | 300 | A | B | B | Rectangular | 84.4% |
| Example 39 | A-4 | d-5 | A | 400 | A | B | B | Rectangular | 83.4% |
| Example 40 | A-4 | d-6 | A | 500 | A | B | B | Rectangular | 86.5% |
| Example 41 | A-4 | d-7 | A | 600 | A | B | B | Rectangular | 87.7% |
| Example 42 | A-4 | d-8 | A | 800 | A | B | B | Rectangular | 87.1% |
| Example 43 | A-4 | d-9 | A | 900 | A | B | B | Rectangular | 79.6% |
| Example 44 | A-4 | d-10 | A | 600 | A | B | B | Rectangular | 82.7% |
| Example 45 | A-4 | d-11 | A | 1000 | A | B | B | Rectangular | 86.0% |
| Comparative example 7 | A-4 | d-12 | A | 1000 | C | D | D | Inversely tapered | 78.0% |
| Comparative example 8 | A-4 | d-13 | A | 1600 | C | D | D | Inversely tapered | 67.7% |

TABLE 5

| | Dispersion resin | Polyfunctional photopolymerizable compound | Storage stability | Sensitivity | Adhesiveness to substrate | Developability | Shape of top part | Shape of cross-section | Ratio of residual film |
|---|---|---|---|---|---|---|---|---|---|
| Comparative example 9 | A-5 | d-1 | B | 700 | C | C | D | Inversely tapered | 73.5% |
| Comparative example 10 | A-5 | d-2 | B | 850 | C | C | D | Inversely tapered | 69.5% |
| Comparative example 11 | A-5 | d-3 | B | 600 | C | B | C | Inversely tapered | 71.5% |
| Comparative example 12 | A-5 | d-4 | B | 500 | C | C | D | Inversely tapered | 73.5% |
| Comparative example 13 | A-5 | d-5 | B | 650 | C | C | D | Inversely tapered | 68.5% |
| Comparative example 14 | A-5 | d-6 | B | 650 | C | C | D | Inversely tapered | 71.1% |
| Comparative example 15 | A-5 | d-7 | B | 800 | C | C | D | Inversely tapered | 72.1% |
| Comparative example 16 | A-5 | d-8 | B | 1000 | C | C | D | Inversely tapered | 68.2% |
| Comparative example 17 | A-5 | d-9 | B | 1200 | C | C | D | Inversely tapered | 65.4% |
| Comparative example 18 | A-5 | d-10 | B | 800 | C | C | D | Inversely tapered | 72.1% |
| Comparative example 19 | A-5 | d-11 | B | 1400 | C | C | D | Inversely tapered | 70.7% |
| Comparative example 20 | A-5 | d-12 | B | 1300 | C | E | D | Inversely tapered | 72.4% |
| Comparative example 21 | A-5 | d-13 | B | 2000 | C | E | D | Inversely tapered | 61.3% |
| Comparative example 22 | A-6 | d-1 | C | X | C | E | E | X | X |
| Comparative example 23 | A-6 | d-2 | C | X | C | E | E | X | X |
| Comparative example 24 | A-6 | d-3 | C | X | C | E | E | X | X |
| Comparative example 25 | A-6 | d-4 | C | X | C | E | E | X | X |
| Comparative example 26 | A-6 | d-5 | C | X | C | E | E | X | X |
| Comparative example 27 | A-6 | d-6 | C | X | C | E | E | X | X |
| Comparative example 28 | A-6 | d-7 | C | X | C | E | E | X | X |
| Comparative example 29 | A-6 | d-8 | C | X | C | E | E | X | X |
| Comparative example 30 | A-6 | d-9 | C | X | C | E | E | X | X |
| Comparative example 31 | A-6 | d-10 | C | X | C | E | E | X | X |
| Comparative example 32 | A-6 | d-11 | C | X | C | E | E | X | X |
| Comparative example 33 | A-6 | d-12 | C | X | C | E | E | X | X |
| Comparative example 34 | A-6 | d-13 | C | X | C | E | E | X | X |

TABLE 6

| | Dispersion resin | Polyfunctional photopolymerizable compound | Storage stability | Sensitivity | Adhesiveness to substrate | Developability | Shape of top part | Shape of cross-section | Ratio of residual film |
|---|---|---|---|---|---|---|---|---|---|
| Example 46 | A-1 | d-1 | A | 50 | A | A | A | Rectangular | 96.5% |
| Example 47 | A-1 | d-4 | A | 50 | A | A | A | Rectangular | 97.5% |
| Comparative example 35 | A-1 | d-13 | A | 450 | A | C | C | Inversely tapered | 83.7% |
| Example 48 | A-4 | d-1 | A | 200 | A | B | B | Rectangular | 90.5% |
| Example 49 | A-4 | d-4 | A | 200 | A | B | B | Rectangular | 89.4% |
| Comparative example 36 | A-4 | d-13 | A | 1300 | C | D | D | Inversely tapered | 73.7% |
| Comparative example 37 | A-6 | d-1 | C | X | C | E | E | X | X |
| Comparative example 38 | A-6 | d-4 | C | X | C | E | E | X | X |
| Comparative example 39 | A-6 | d-13 | C | X | C | E | E | X | X |

TABLE 7

| | Dispersion resin | Polyfunctional photopolymerizable compound | Storage stability | Sensitivity | Adhesiveness to substrate | Developability | Shape of top part | Shape of cross-section | Ratio of residual film |
|---|---|---|---|---|---|---|---|---|---|
| Example 50 | A-1 | d-1 | A | 50 | A | A | A | Rectangular | 97.5% |
| Example 51 | A-1 | d-4 | A | 50 | A | A | A | Rectangular | 98.8% |
| Comparative example 40 | A-1 | d-13 | A | 350 | A | C | D | Inversely tapered | 88.7% |
| Example 52 | A-4 | d-1 | A | 150 | A | B | B | Rectangular | 92.5% |
| Example 53 | A-4 | d-4 | A | 200 | A | B | B | Rectangular | 91.4% |
| Comparative example 41 | A-4 | d-13 | A | 1200 | C | D | D | Inversely tapered | 77.7% |
| Comparative example 42 | A-6 | d-1 | C | X | C | E | E | X | X |
| Comparative example 43 | A-6 | d-4 | C | X | C | E | E | X | X |
| Comparative example 44 | A-6 | d-13 | C | X | C | E | E | X | X |

As shown in the above Table 3 to Table 5, the curable compositions (pigment-based) of the respective Examples used for the formation of a color filter for a solid state image pick-up device, had excellent storage stability in their solution state. Furthermore, when these curable compositions were used to form colored patterns on substrates, color filters with high sensitivity, excellent developability as well as excellent adhesiveness to a substrate and pattern shape, as compared to the color filters of the Comparative Examples, were obtained.

Also, as shown in the above Table 6 and Table 7, when an oxime-based photopolymerization initiator is used, a curable composition having even higher sensitivity was obtained.

From this, it can be seen that the curable composition of the Examples realized excellent pattern forming properties in the case of producing a color filter for a solid state image pick-up device, particularly for a solid state image pick-up device having a very fine pixel size (for example, the short side being 2.2 µm or less long).

The invention has been achieved based on the following mechanism which is presumed to result from the use of a specific dispersion resin as a dispersant of pigment, and a specific polyfunctional photopolymerizable compound. However, the following mechanism of the invention has not been necessarily clarified, but is presumed as follows.

The specific dispersion resin having an unsaturated bond is added when dispersing a pigment, and since the pigment is efficiently dispersed between this dispersion resin, and the dispersion resin is cured by a cross-linking reaction while containing the pigment, the diffusion of the pigment into the developer solution or the coating solution is suppressed. Also, since this dispersion resin has a small unsaturation equivalent, when a film is formed, the amount of double bonds in the film becomes large, and thus the exposure sensitivity can be enhanced to a large extent. Further, when a film is formed by applying the colored photocurable composition for a solid state image pick-up device of the invention on a substrate, curing is achieved favorably even in the deep parts of the film, such as in the vicinity of the interface between the film and the substrate, thereby resulting in excellent adhesiveness to a support, and the shape of the pattern can be prevented from becoming inversely tapered. In addition, since aggregation of the pigment is suppressed, penetration of the developer solution is rapidly progressed at the uncured unexposed areas, and as a result, the removability of the unexposed areas is improved, sufficient curability is attained at the cured exposed areas, and the influence of the developer solution or the like is suppressed.

Moreover, since the polymerizable compound having one or more acidic functional groups has acidic terminals, and since the polyfunctional photopolymerizable compound having an alkyleneoxy chain improves hydrophilicity, the penetrability with the developer solution which is an aqueous alkaline solution is enhanced, and thus the removability of the unexposed areas is enhanced. Also, due to the polyfunctional photopolymerizable compound, curing at the exposed areas is improved.

As such, in the formation of patterns using the colored photocurable composition for a solid state image pick-up device of the invention, it is believed that the excellent curability in the exposed areas and the excellent removability in the unexposed areas are obtained, and there can be obtained a good pattern in which the pattern profile (of the cross-section obtained by cutting a flat or layered pattern as viewed from the top of the pattern, at a plane perpendicular to the layer surface) is tapered or rectangular in shape.

According to the invention, there can be provided a colored photocurable composition for a solid state image pick-up device, which has high photosensitivity and excellent storage stability, tinctorial strength and adhesiveness to a support when a film is formed on a support, which suppresses film thinning at the cured parts and a decrease in the color density (decoloration), which has good developability and less development residue, and which is capable of forming a colored pattern that is very fine (for example, the short side being 2.2 μm or less long) and has a tapered or rectangular shaped cross-section.

Furthermore, according to the invention, a color filter having excellent adhesiveness to a support and having a colored pattern with tapered or rectangular shaped cross-section, and a method for production of a color filter with excellent productivity for the color filter, can also be provided.

Furthermore, according to the invention, a solid state image pick-up device capable of very fine display with good display properties such as chromatic properties or contrast, can be provided.

The colored photocurable composition for a solid state image pick-up device of the invention, and a color filter and a method for production thereof are suitable for the production of solid state image pick-up devices, and more particularly, solid state image pick-up devices having pixels with a fine pattern where the short side is 2.2 μm or less long.

Exemplary embodiments of the invention are, for example, as follows.

<1> A colored photocurable composition for a solid state image pick-up device, the composition comprising at least (A) a dispersion resin having an unsaturation equivalent of less than 600, (B) a pigment, (C) a photopolymerization initiator, and (D) a polyfunctional photopolymerizable compound having an acidic functional group and/or an alkyleneoxy chain.

<2> The colored photocurable composition for a solid state image pick-up device of <1>, wherein the (D) polyfunctional photopolymerizable compound has the acidic functional group, and at least one of the acidic functional group is a carboxyl group.

<3> The colored photocurable composition for a solid state image pick-up device of <1> or <2>, wherein the (D) polyfunctional photopolymerizable compound has three or more photocurable functional groups.

<4> The colored photocurable composition for a solid state image pick-up device of any one of <1> to <3>, wherein at least one of the polyfunctional photopolymerizable compound is a pentaerythritol derivative and/or a dipentaerythritol derivative.

<5> The colored photocurable composition for a solid state image pick-up device of any one of <1> to <4>, wherein the polyfunctional photopolymerizable compound includes at least one selected from the group consisting of compounds represented by the following formula (i) or (ii):

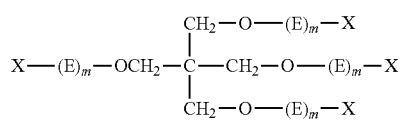

(i)

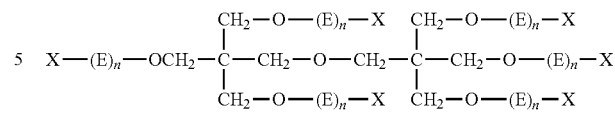

(ii)

wherein E each independently represents —(($CH_2$)$_y$$CH_2O$)— or —(($CH_2$)$_y$$CH(CH_3)O$)—; y each independently represents an integer from 0 to 10; X each independently represents an acryloyl group, a methacryloyl group, a hydrogen atom or a carboxyl group; in the formula (1), the total number of acryloyl groups and methacryloyl groups is 3 or 4, m each independently represents an integer from 0 to 10, the sum of the values of m is 0 to 40, and in the case where the sum of the values of m is 0, any one of X is a carboxyl group; and in the formula (ii), the total number of acryloyl groups and methacryloyl groups is 5 or 6, n each independently represents an integer from 0 to 10, the sum of the values of n is 0 to 60, and in the case where the sum of the values of n is 0, any one of X is a carboxyl group.

<6> A method for production of a color filter, the method comprising applying the colored photocurable composition for a solid state image pick-up device of any one of <1> to <5> on a support to form a colored layer, exposing the formed colored layer through a mask, and developing the colored layer to form a pattern.

<7> A color filter formed using the colored photocurable composition for a solid state image pick-up device of any one of <1> to <5>.

<8> A solid state image pick-up device comprising a color filter produced by the method for production of a color filter of <6>, or the color of <7>.

What is claimed is:

1. A colored photocurable composition for a solid state image pick-up device, the composition comprising at least (A) a dispersion resin having an unsaturation equivalent of less than 600, (B) a pigment, (C) a photopolymerization initiator, and (D) a polyfunctional photopolymerizable compound having an acidic functional group and/or an alkyleneoxy chain, wherein the dispersion resin (A) having an unsaturation equivalent of less than 600 is a polymer compound including at least one structural unit selected from the structural units represented by the following formulae (1) to (3):

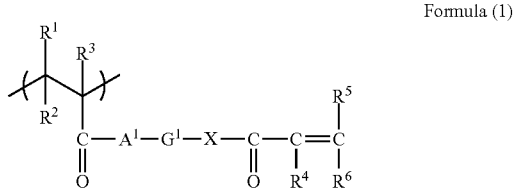

Formula (1)

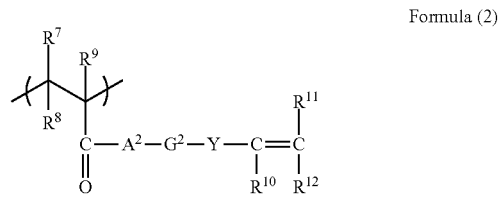

Formula (2)

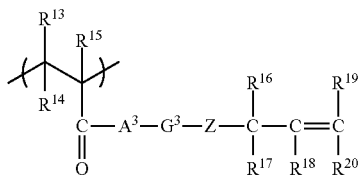

wherein in formulae (1) to (3), $A^1$, $A^2$ and $A^3$ each independently represents an oxygen atom, a sulfur atom or —N($R^{21}$)—, wherein $R^{21}$ represents an alkyl group which may be substituted; $G^1$, $G^2$ and $G^3$ each independently represents a divalent organic group; X and Z each independently represents an oxygen atom, a sulfur atom or —N($R^{22}$)—, wherein $R^{22}$ represents an alkyl group which may be substituted; Y represents an oxygen atom, a sulfur atom, a phenylene group which may be substituted, or —N($R^{23}$)—, wherein $R^{23}$ represents an alkyl group which may be substituted; $R^1$, $R^2$, $R^7$, $R^8$, $R^{13}$ and $R^{14}$ are a hydrogen atom; and $R^3$ to $R^6$, $R^9$ to $R^{12}$ and $R^{15}$ to $R^{20}$ each independently represents a hydrogen atom or a monovalent organic group.

2. The colored photocurable composition for a solid state image pick-up device of claim 1, wherein the polyfunctional photopolymerizable compound (D) has the acidic functional group, and at least one of the acidic functional group is a carboxyl group.

3. The colored photocurable composition for a solid state image pick-up device of claim 1, wherein the polyfunctional photopolymerizable compound (D) has three or more photocurable functional groups.

4. The colored photocurable composition for a solid state image pick-up device of claim 1, wherein at least one of the polyfunctional photopolymerizable compound is a pentaerythritol derivative and/or a dipentaerythritol derivative.

5. The colored photocurable composition for a solid state image pick-up device of claim 1, wherein the polyfunctional photopolymerizable compound includes at least one compound selected from the group consisting of compounds represented by the following formulas (i) and (ii):

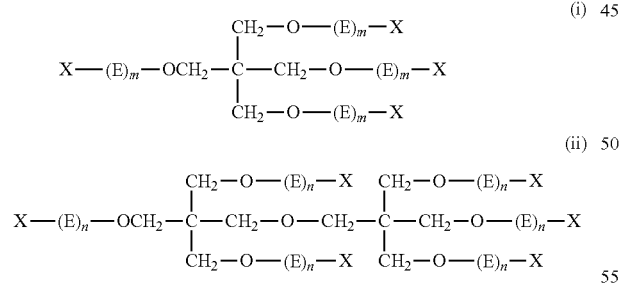

wherein E each independently represents —(($CH_2$)$_y$$CH_2$O)— or —(($CH_2$)yCH($CH_3$)0)—; y each independently represents an integer from 0 to 10; X each independently represents an acryloyl group, a methacryloyl group, a hydrogen atom or a carboxyl group; in the formula (i), the total number of acryloyl groups and methacryloyl groups is 3 or 4, m each independently represents an integer from 0 to 10, the sum of the values of m is 0 to 40, and in the case where the sum of the values of m is 0, any one of X is a carboxyl group; and in the formula (ii), the total number of acryloyl groups and methacryloyl groups is 5 or 6, n each independently represents an integer from 0 to 10, the sum of the values of n is 0 to 60, and in the case where the sum of the values of n is 0, any one of X is a carboxyl group.

6. A method for production of a color filter, the method comprising applying the colored photocurable composition for a solid state image pick-up device of claim 1 on a support to form a colored layer, exposing the formed colored layer through a mask, and developing the colored layer to form a pattern.

7. A solid state image pick-up device comprising a color filter produced by the method for production of a color filter of claim 6.

8. A color filter formed using the colored photocurable composition for a solid state image pick-up device of claim 1.

9. The photocurable composition according to claim 1, wherein the dispersion resin (A) having an unsaturation equivalent of less than 600 has a weight average molecular weight of 1,000 to 25,000.

10. A colored photocurable composition for a solid state image pick-up device, the composition comprising at least (A) a dispersion resin having an unsaturation equivalent of less than 600, (B) a pigment, (C) a photopolymerization initiator, and (D) a polyfunctional photopolyrnerizable compound having an acidic functional group and/or an alkyleneoxy chain, wherein the dispersion resin (A) having an unsaturation equivalent of less than 600 is a polymer compound including at least one structural units represented by following formulae (1) to (3), and at least one structural unit represented by the following formula (6):

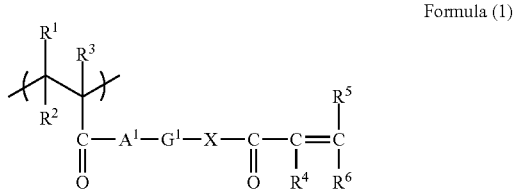

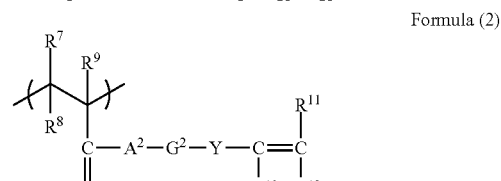

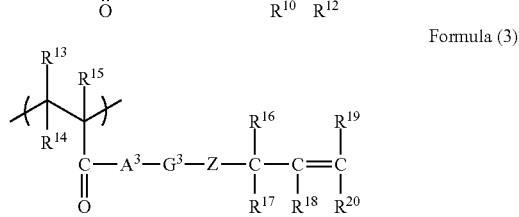

wherein in formulae (1) to (3), $A^1$, $A^2$ and $A^3$ each independently represents an oxygen atom, a sulfur atom or —N($R^{21}$)—, wherein $R^{21}$ represents an alkyl group which may be substituted; $G^1$, $G^2$ and $G^3$ each independently represents a divalent organic group; X and Z each independently represents an oxygen atom, a sulfur atom or —N($R^{22}$)—, wherein $R^{22}$ represents an alkyl group which may be substituted; Y represents an oxygen atom, a sulfur atom, a phenyiene group which may be substituted, or —N($R^{23}$)—, wherein $R^{23}$ represents an alkyl group which may be substituted; $R^1$, $R^2$, $R^7$, $R^8$, $R^{13}$ and $R^{14}$ are a hydrogen atom; and $R^3$ to $R^6$, $R^9$ to $R^{12}$ and $R^{15}$ to $R^{20}$ each independently represents a hydrogen atom or a monovalent organic group;

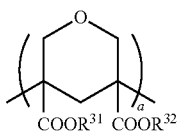

Formula (6)

wherein in formula (6), $R^{31}$ to $R^{32}$ each independently represents a hydrogen atom, or a hydrocarbon group having 1 to 25 carbon atoms which may be substituted or unsubstituted; a represents the number of the structural unit when the total number of the structural units derived from the monomers constituting the dispersion resin is taken to be 100, and represents an integer from 1 to 30.

* * * * *